(12) United States Patent
Ikeda et al.

(10) Patent No.: US 8,097,928 B2
(45) Date of Patent: Jan. 17, 2012

(54) SOLID-STATE IMAGING DEVICE, AND IMAGING APPARATUS

(75) Inventors: Harumi Ikeda, Kanagawa (JP); Susumu Hiyama, Kanagawa (JP); Takashi Ando, Kanagawa (JP); Kiyotaka Tabuchi, Kanagawa (JP); Tetsuji Yamaguchi, Kanagawa (JP); Yuko Ohgishi, Tokyo (JP)

(73) Assignee: Sony Corporation, Tokyo (JP)

( * ) Notice: Subject to any disclaimer, the term of this patent is extended or adjusted under 35 U.S.C. 154(b) by 259 days.

(21) Appl. No.: 12/339,941

(22) Filed: Dec. 19, 2008

(65) Prior Publication Data
US 2009/0189235 A1 Jul. 30, 2009

(30) Foreign Application Priority Data
Dec. 26, 2007 (JP) ................................. 2007-333691

(51) Int. Cl.
H01L 27/14 (2006.01)
(52) U.S. Cl. ................................. 257/431; 257/E33.053
(58) Field of Classification Search .................. 257/432, 257/460, E31.127, E31.053, 431, 433, 292; 250/200, 206, 208.1
See application file for complete search history.

(56) References Cited

U.S. PATENT DOCUMENTS

| 2003/0214595 A1* | 11/2003 | Mabuchi | 348/294 |
| 2007/0034981 A1* | 2/2007 | Saito | 257/462 |

FOREIGN PATENT DOCUMENTS

| JP | 01-256168 | 10/1989 |
| JP | 2005-093897 | 4/2005 |
| JP | 2006-269789 | 10/2006 |
| JP | 2007-088305 | 4/2007 |

OTHER PUBLICATIONS

Japanese Office Action issued on Feb. 8, 2011 in connection with counterpart JP Application No. 2007-333691.

* cited by examiner

Primary Examiner — Thomas L Dickey
Assistant Examiner — Nikolay Yushin
(74) Attorney, Agent, or Firm — SNR Denton US LLP

(57) ABSTRACT

A solid-state imaging device having a light-receiving section that photoelectrically converts incident light includes an insulating film formed on a light-receiving surface of the light-receiving section and a film and having negative fixed charges formed on the insulating film. A hole accumulation layer is formed on a light-receiving surface side of the light-receiving section. A peripheral circuit section in which peripheral circuits are formed is provided on a side of the light-receiving section. The insulating film is formed between a surface of the peripheral circuit section and the film having negative fixed charges such that a distance from the surface of the peripheral circuit section to the film having negative fixed charges is larger than a distance from a surface of the light-receiving section to the film having negative fixed charges.

6 Claims, 53 Drawing Sheets

FIG. 2
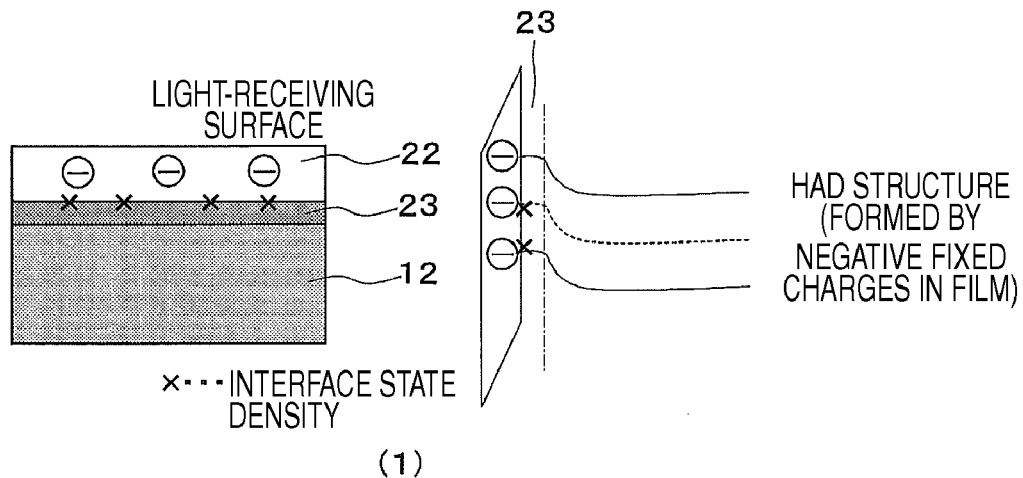
(1)
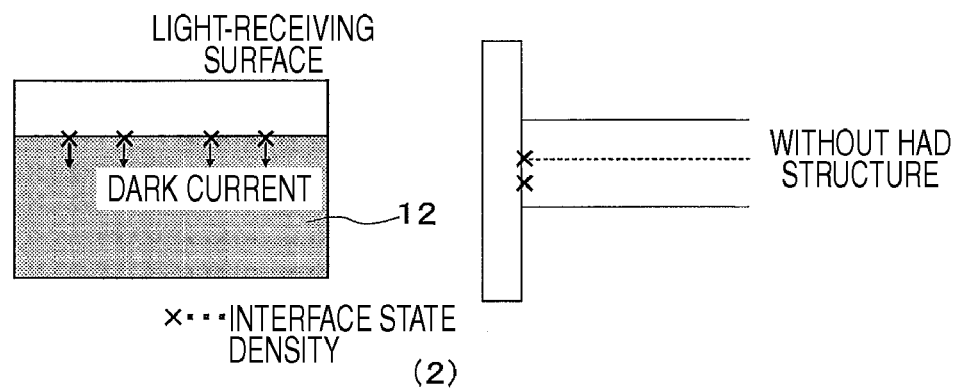
(2)
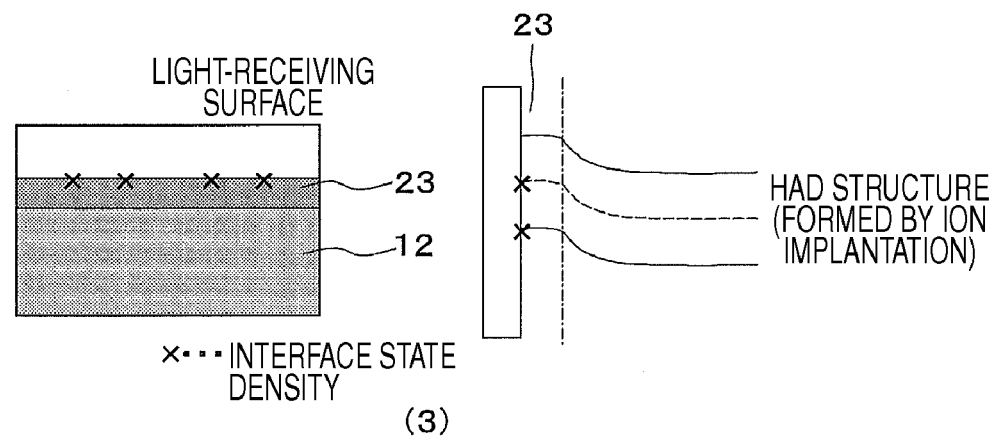
(3)

FIG. 8
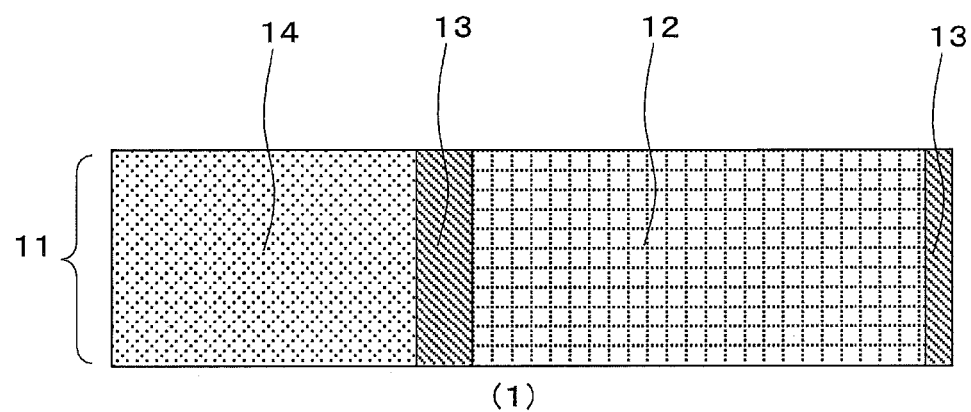
(1)
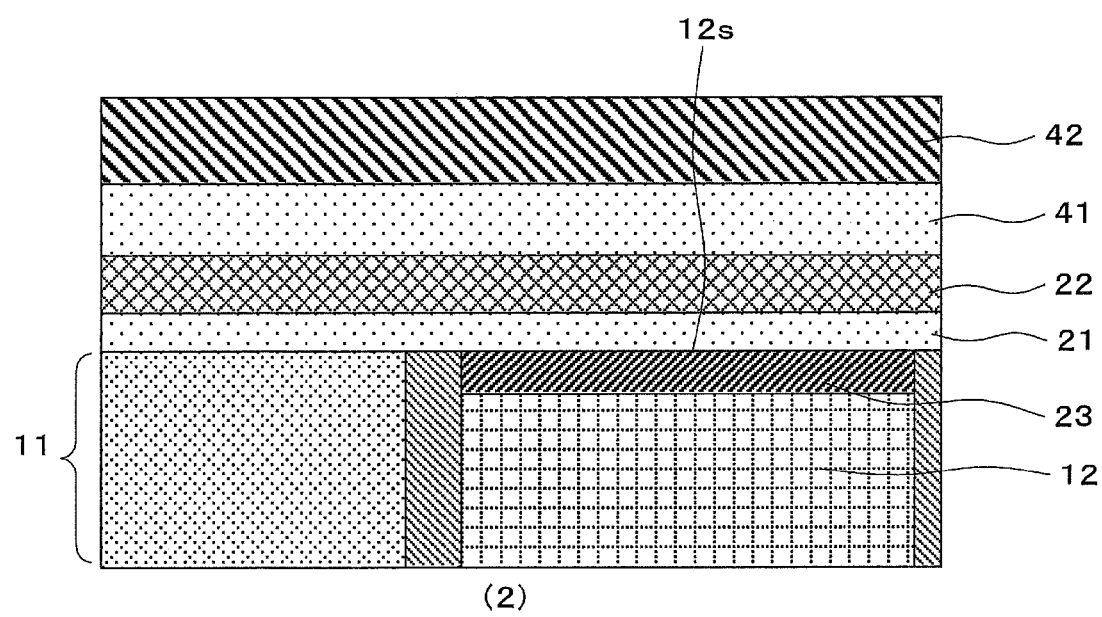
(2)

FIG. 9
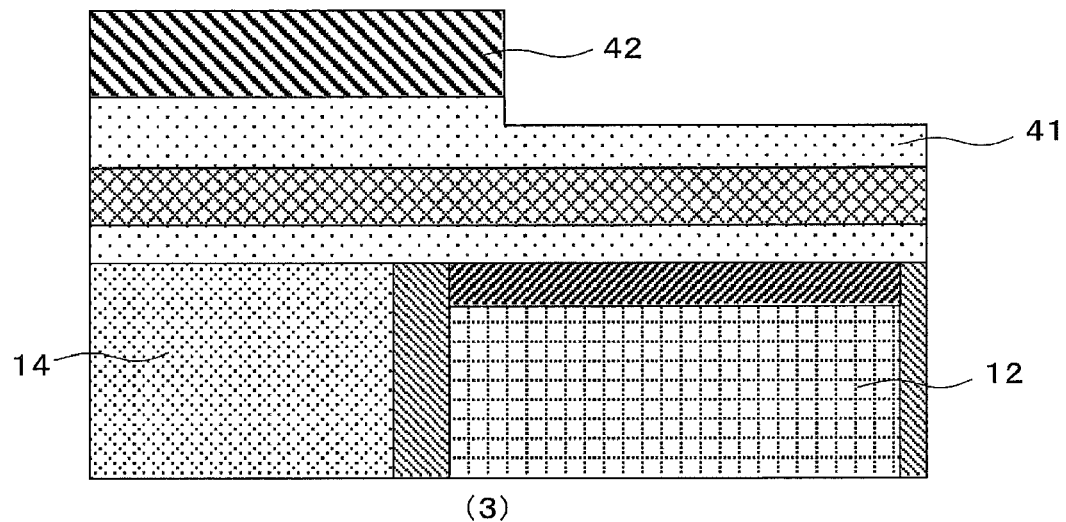
(3)
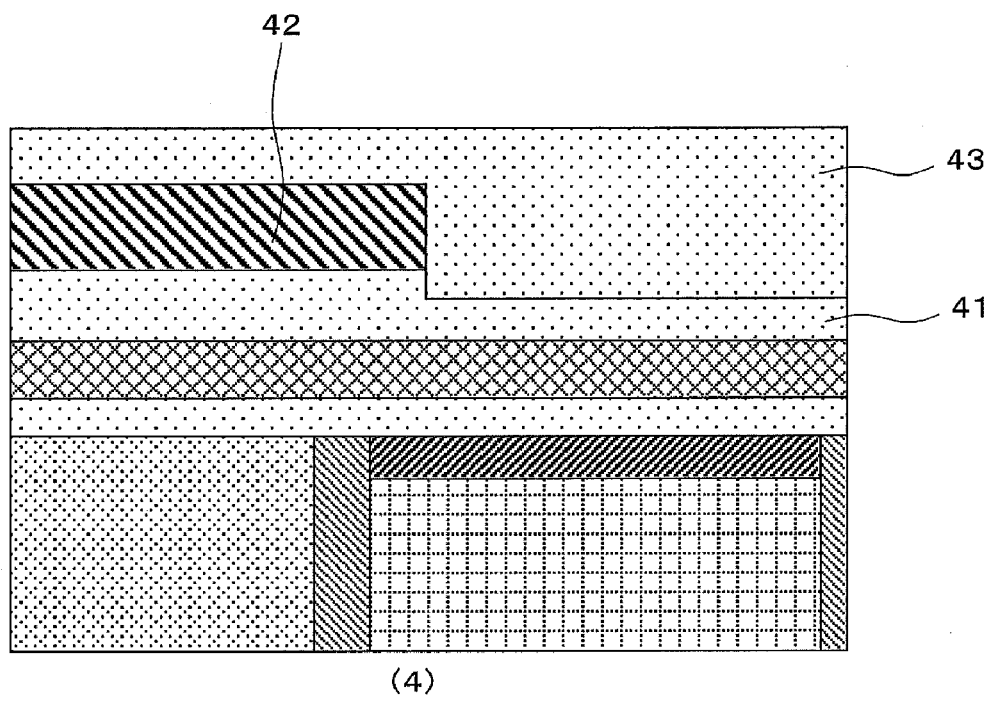
(4)

(5)

FIG. 11
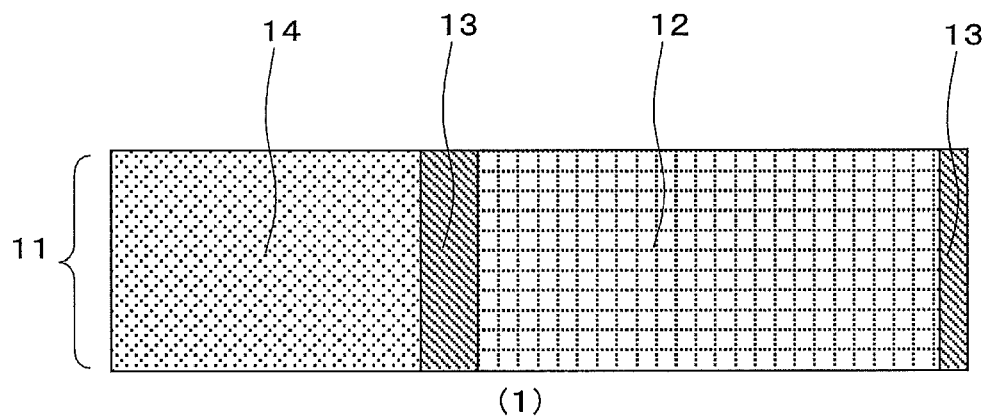
(1)
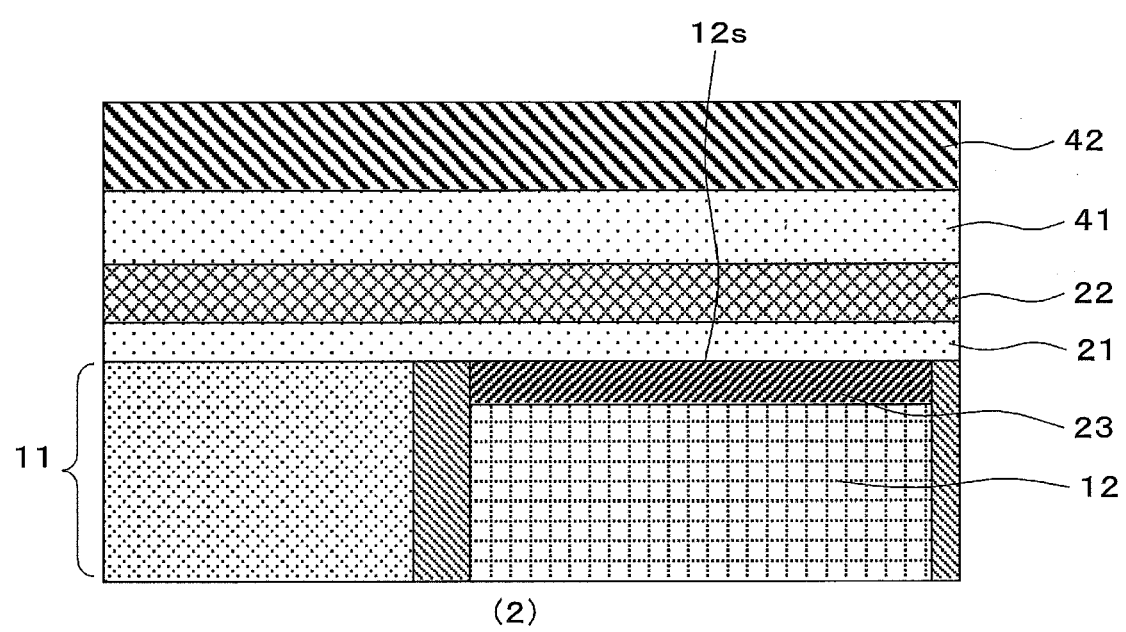
(2)

FIG. 12
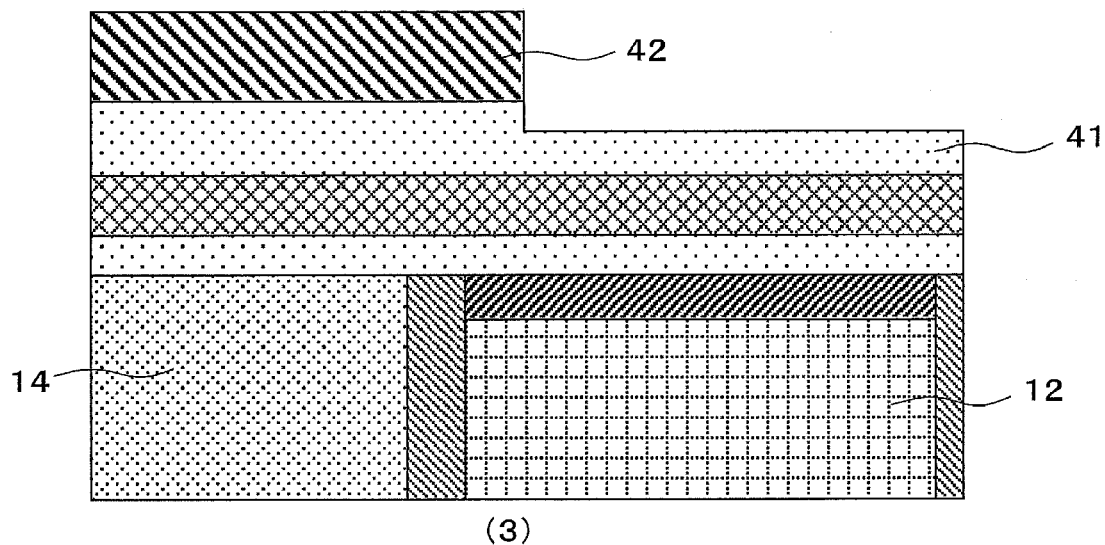
(3)
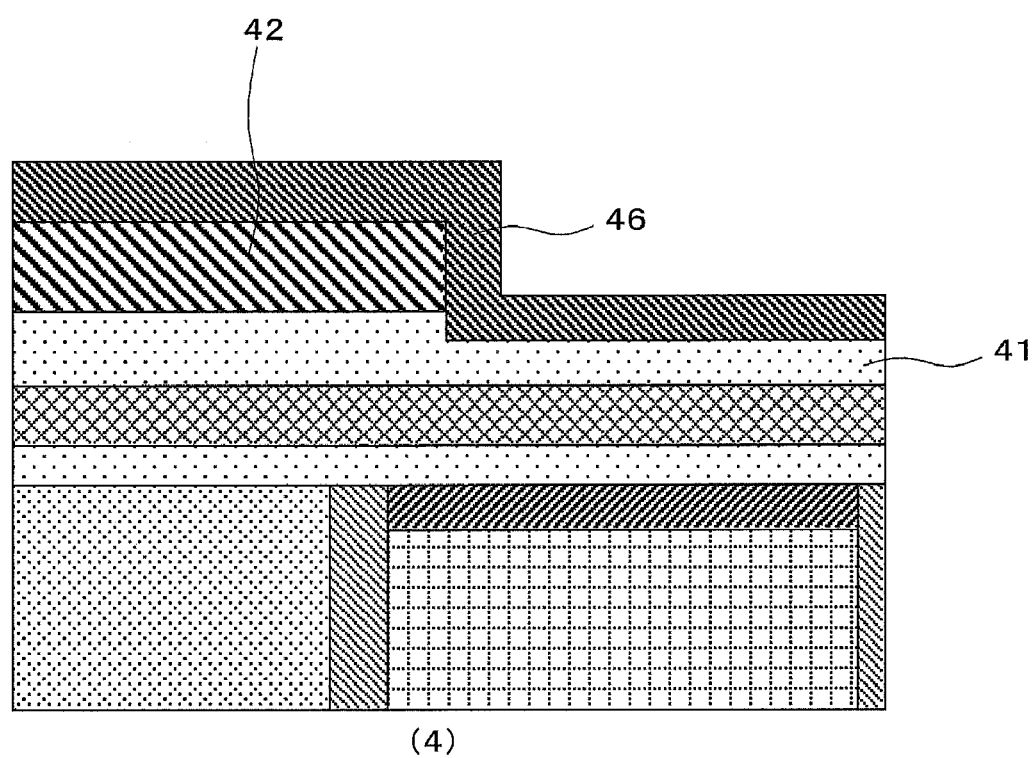
(4)

(5)

FIG. 14
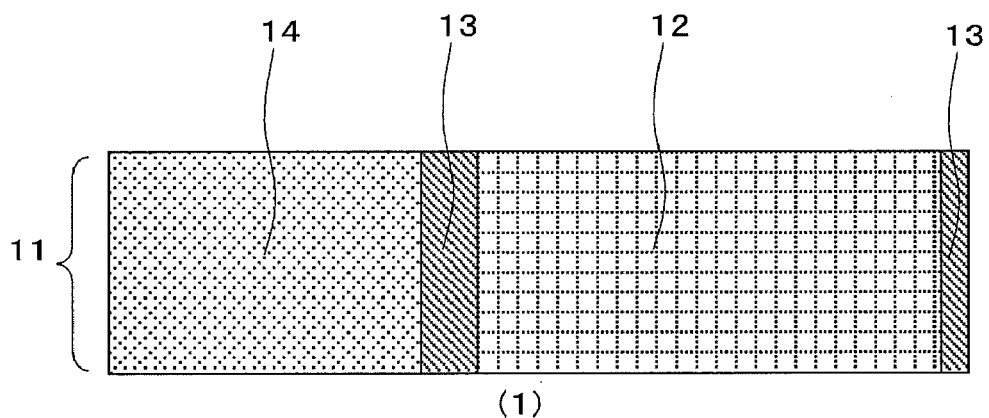
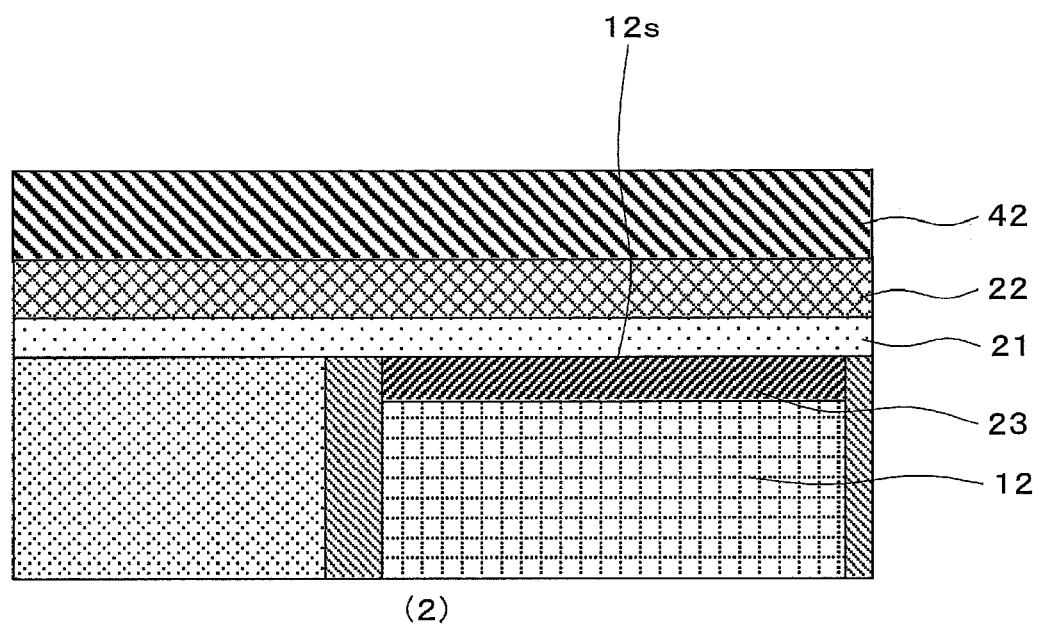

FIG. 15
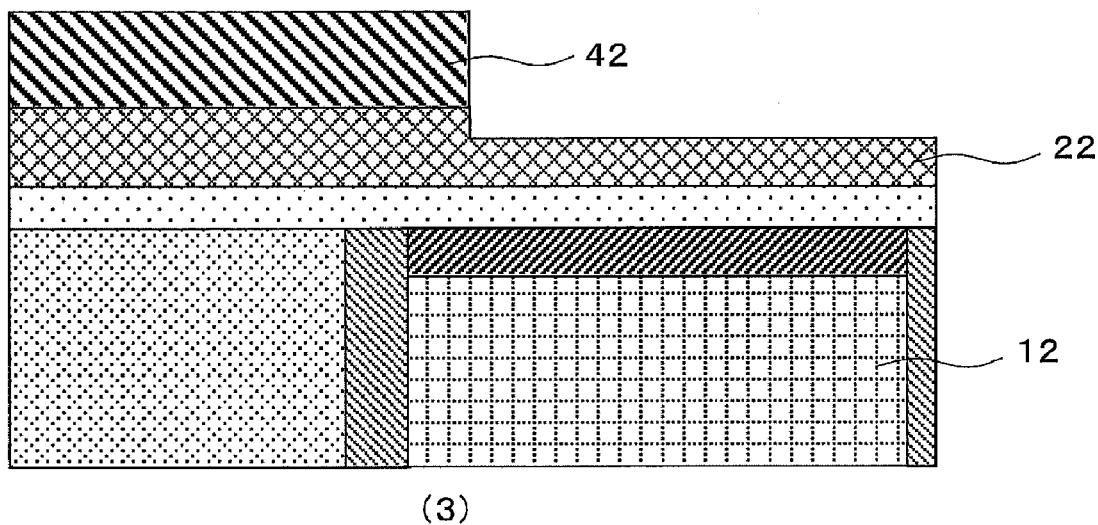
(3)
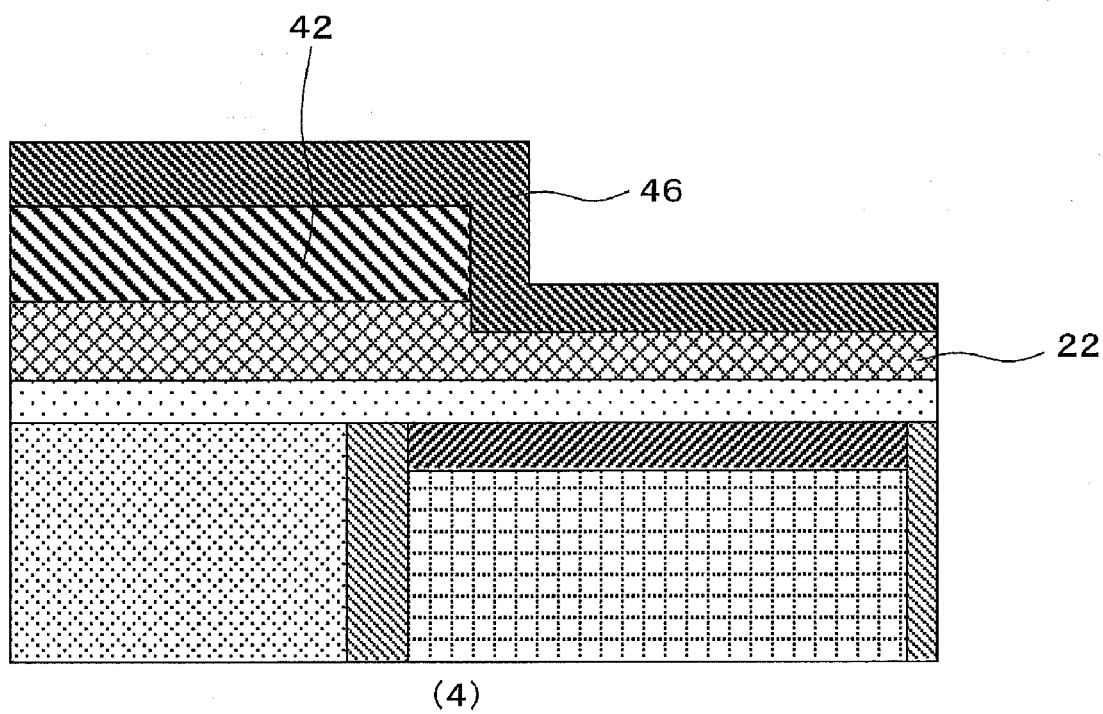
(4)

(5)

FIG. 17
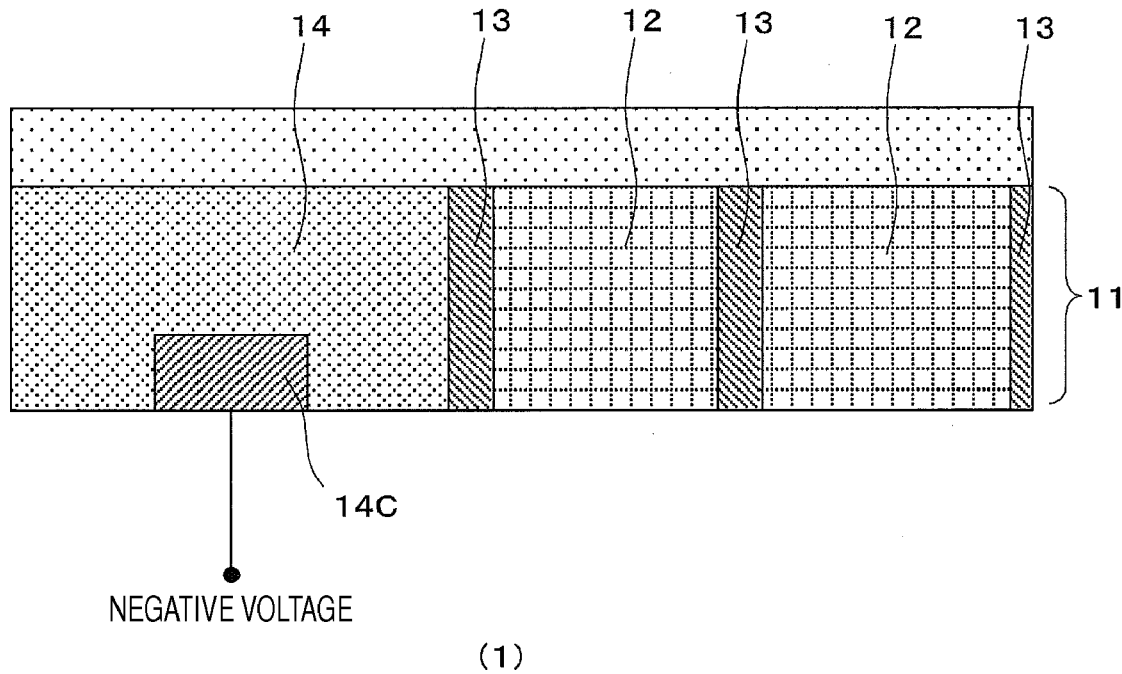
(1)
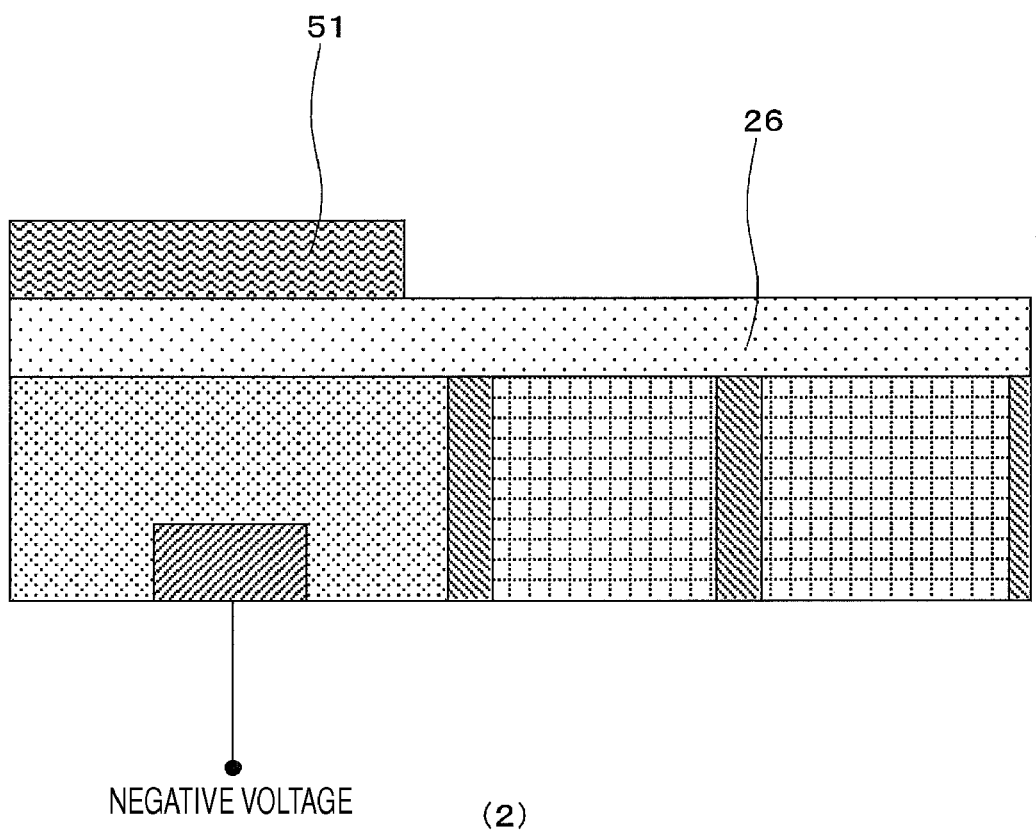
(2)

FIG. 18
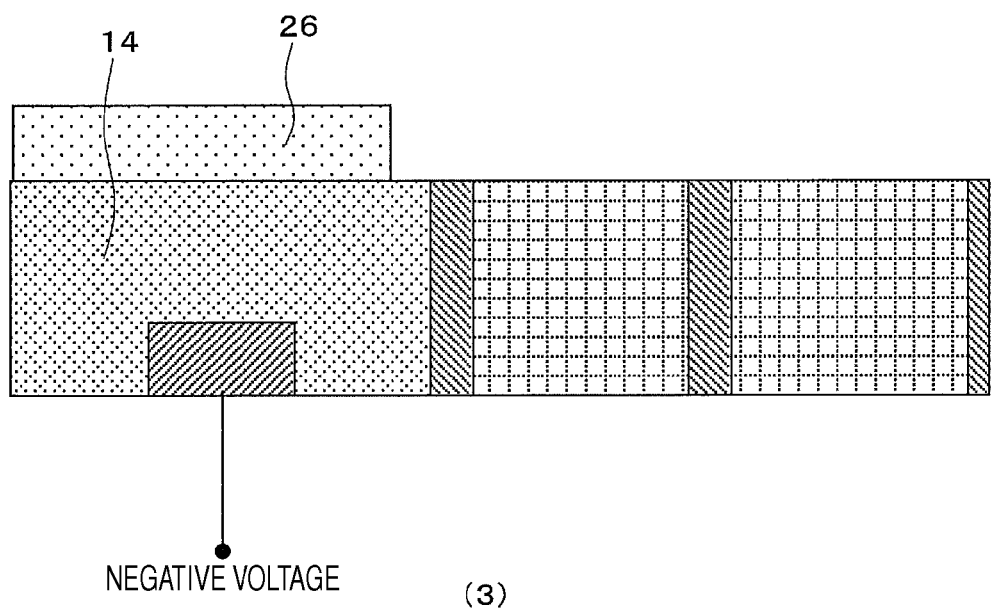
NEGATIVE VOLTAGE
(3)
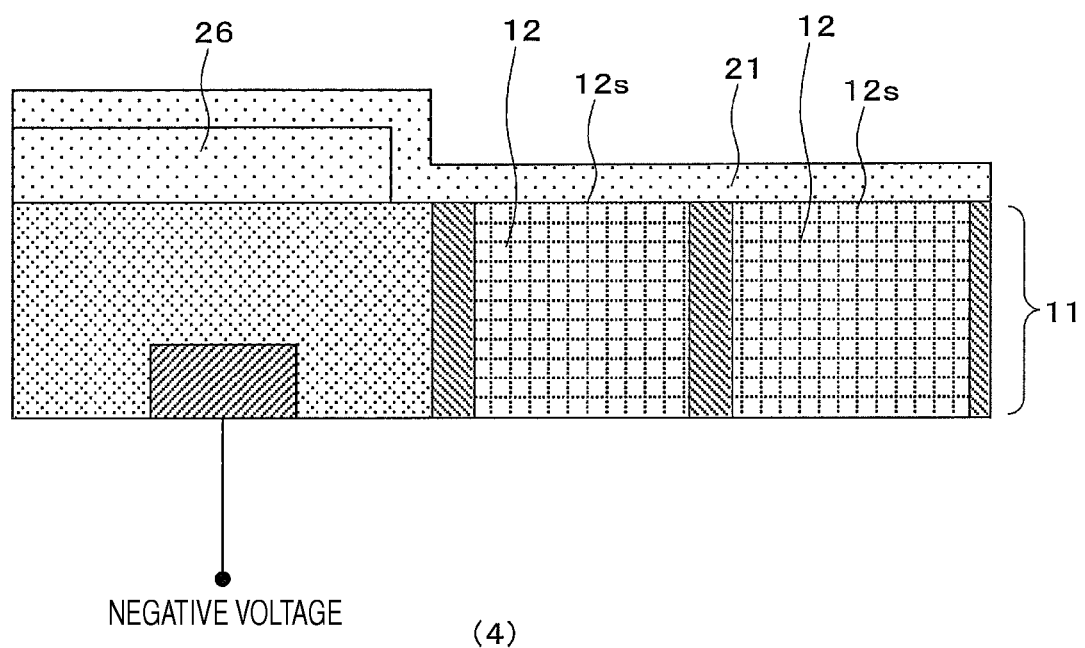
NEGATIVE VOLTAGE
(4)

FIG. 20
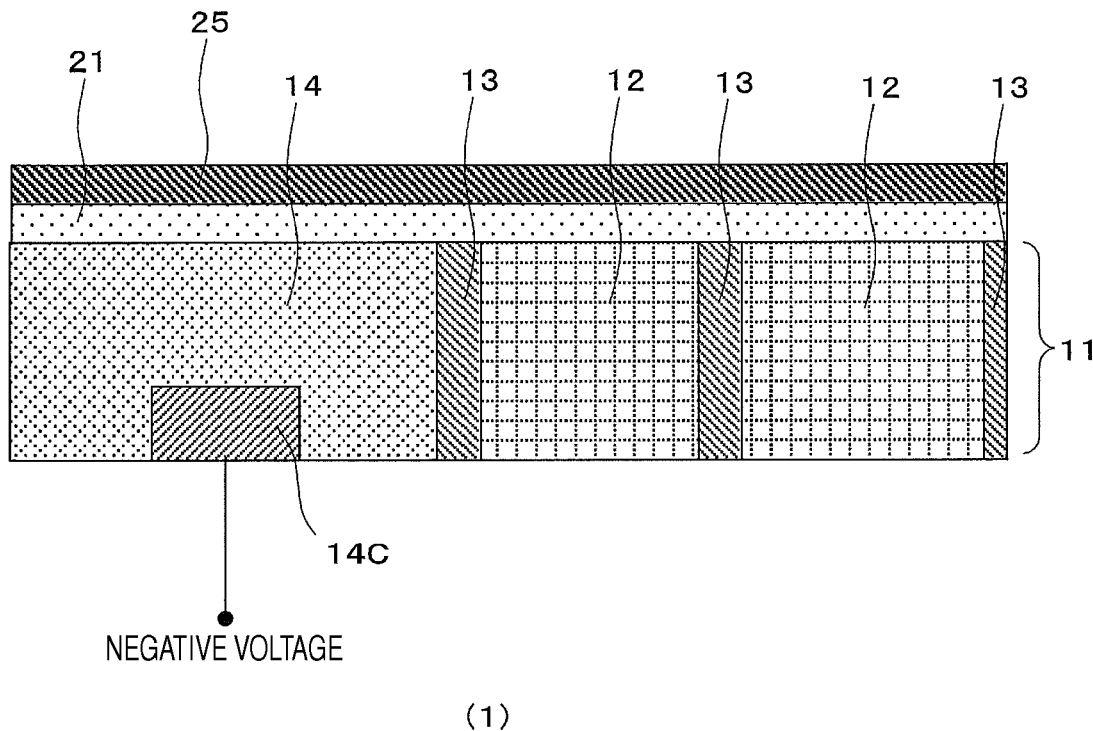
(1)
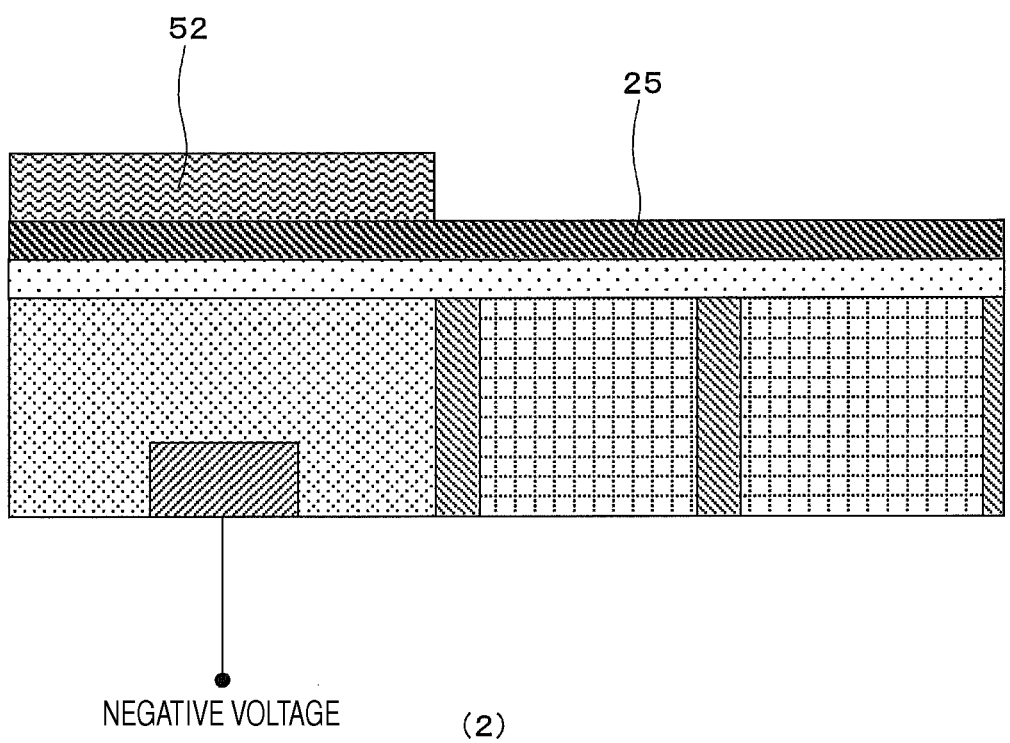
(2)

FIG. 21
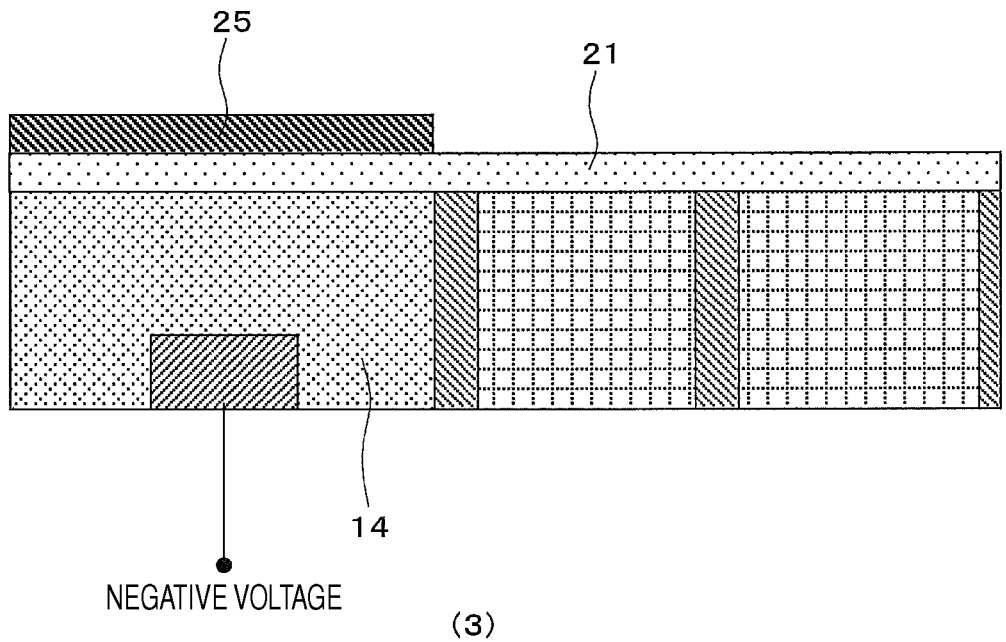
NEGATIVE VOLTAGE
(3)
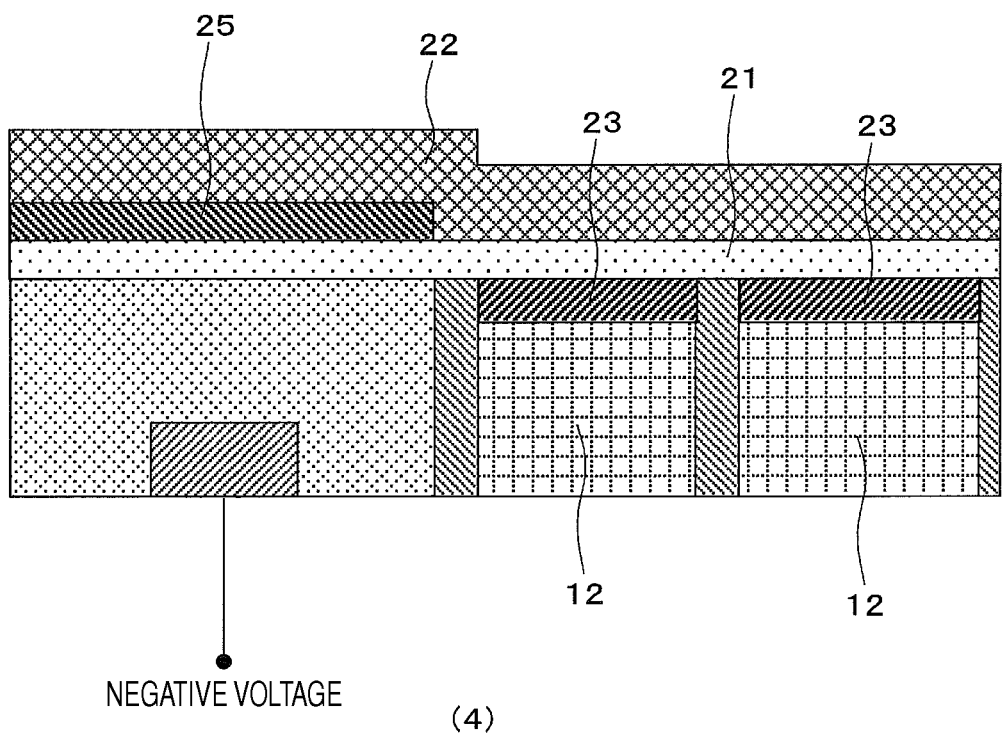
NEGATIVE VOLTAGE
(4)

FIG. 25
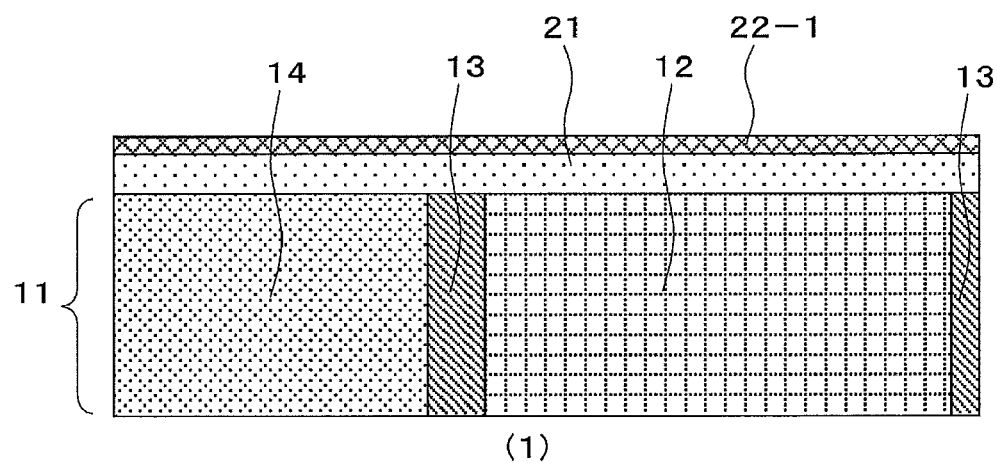
(1)
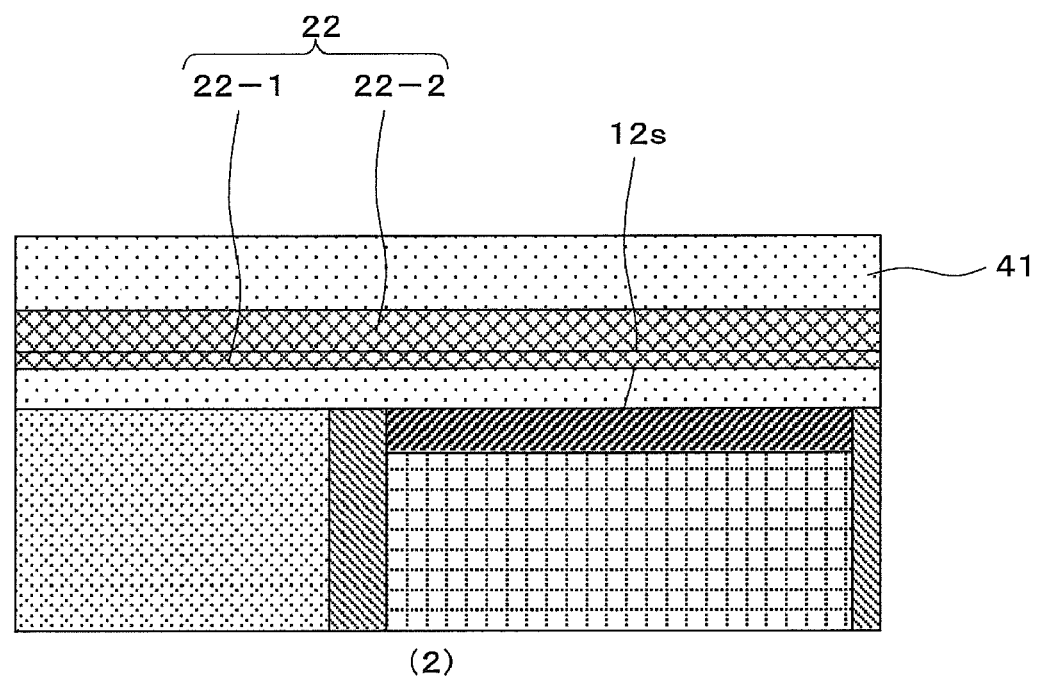
(2)

FIG. 29
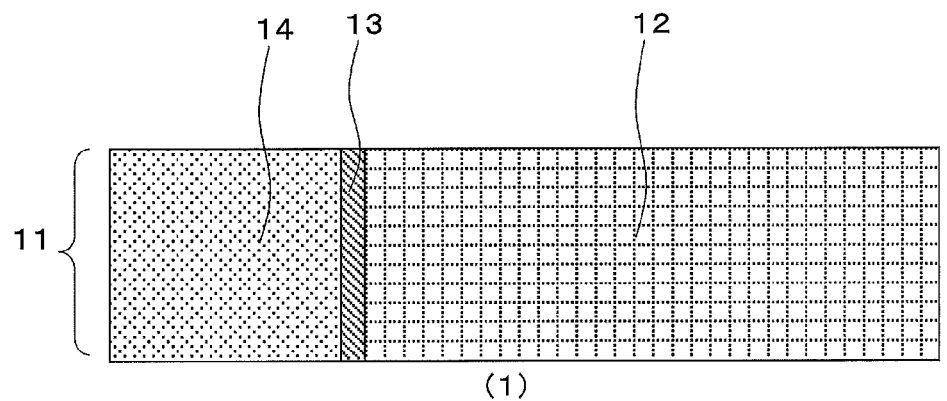
(1)
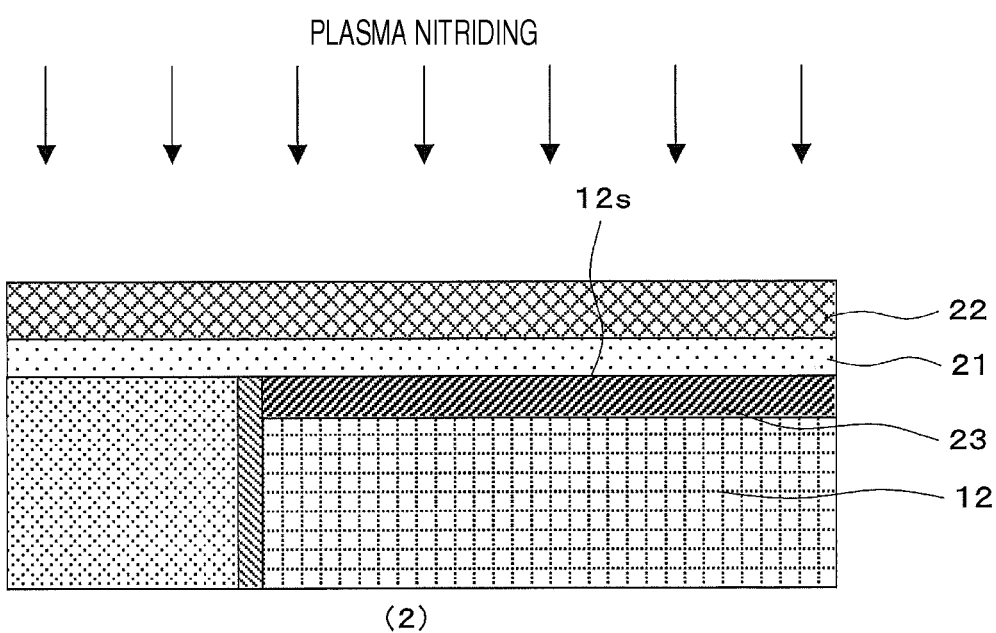
(2)

FIG. 30
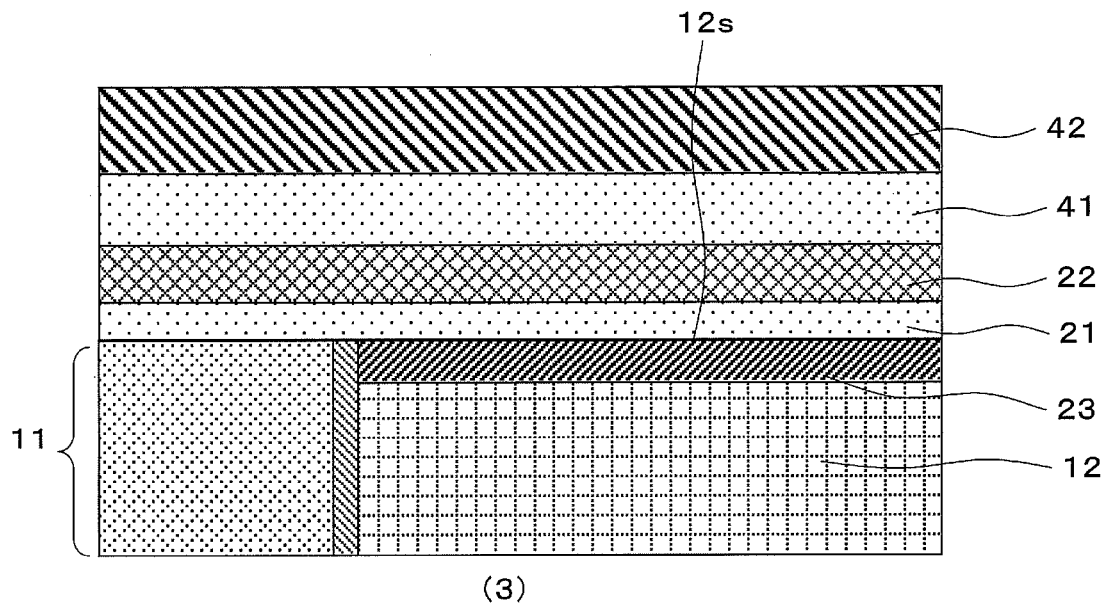
(3)
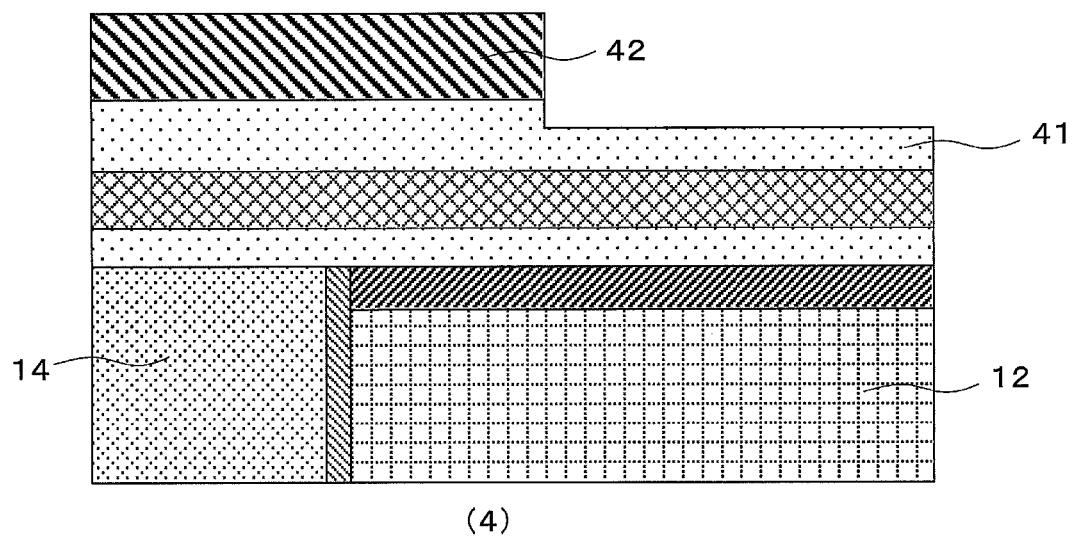
(4)

FIG. 31
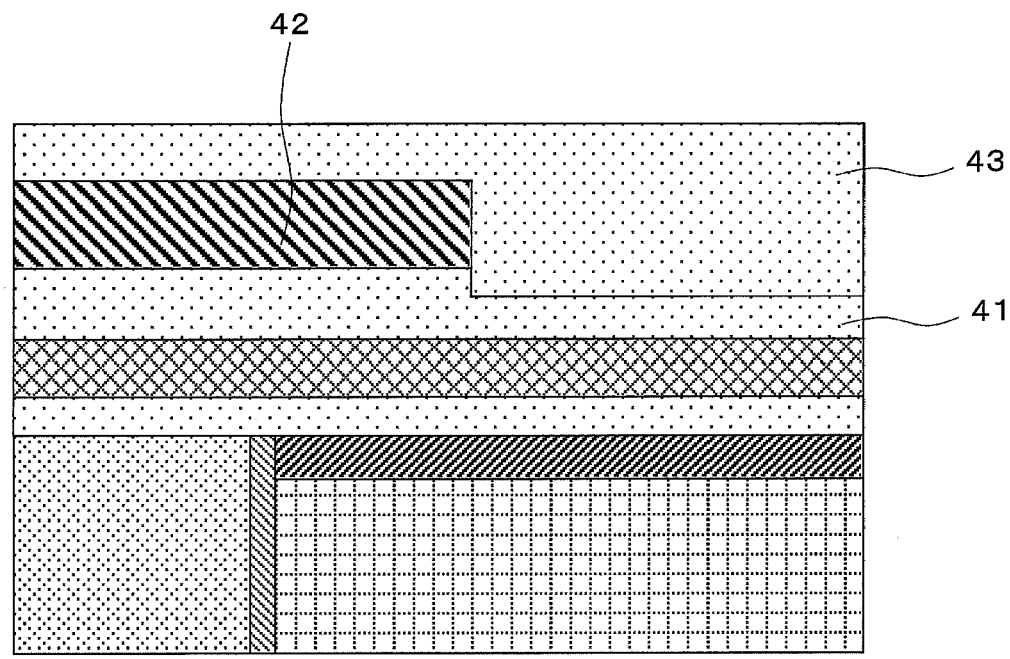
(5)
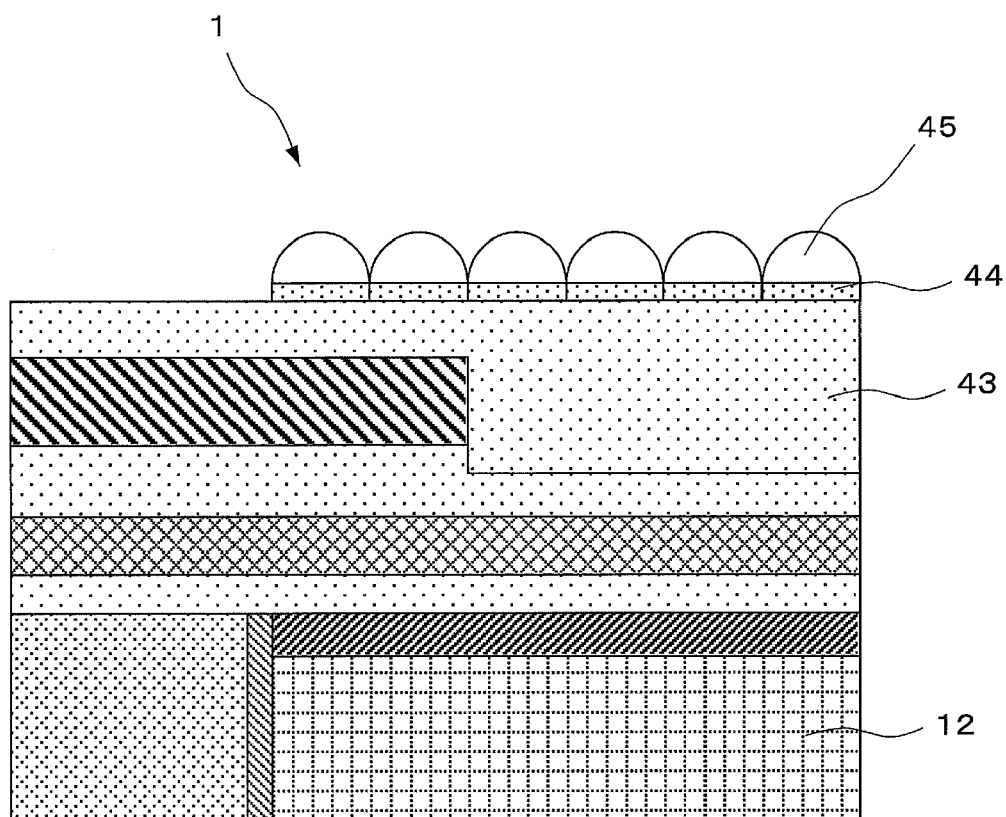
(6)

FIG. 34
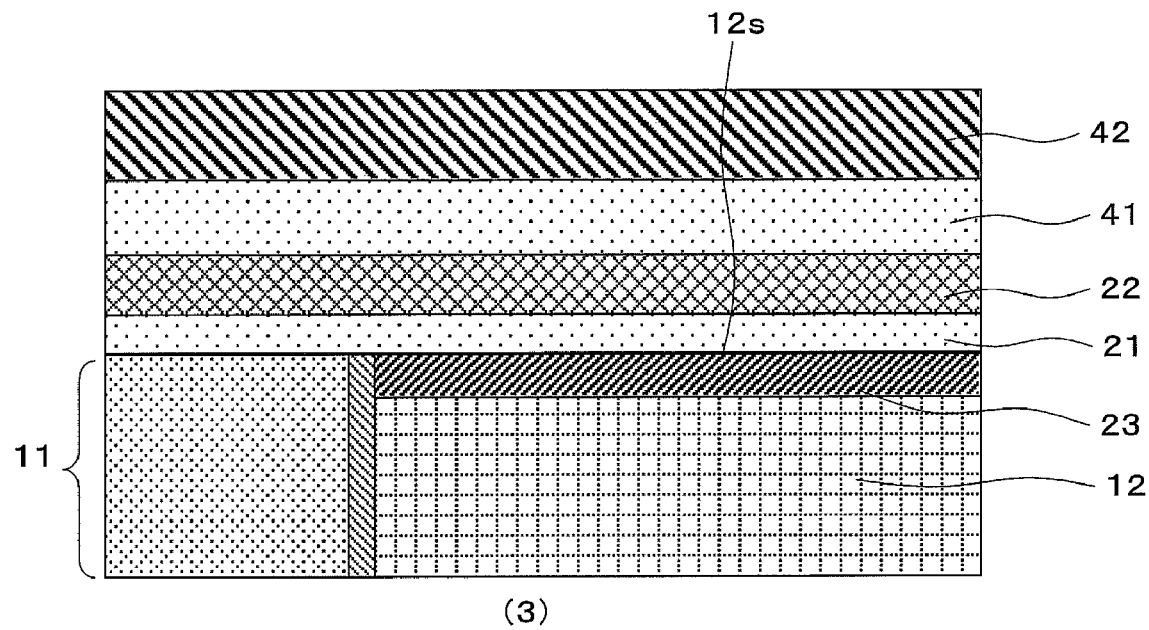
(3)
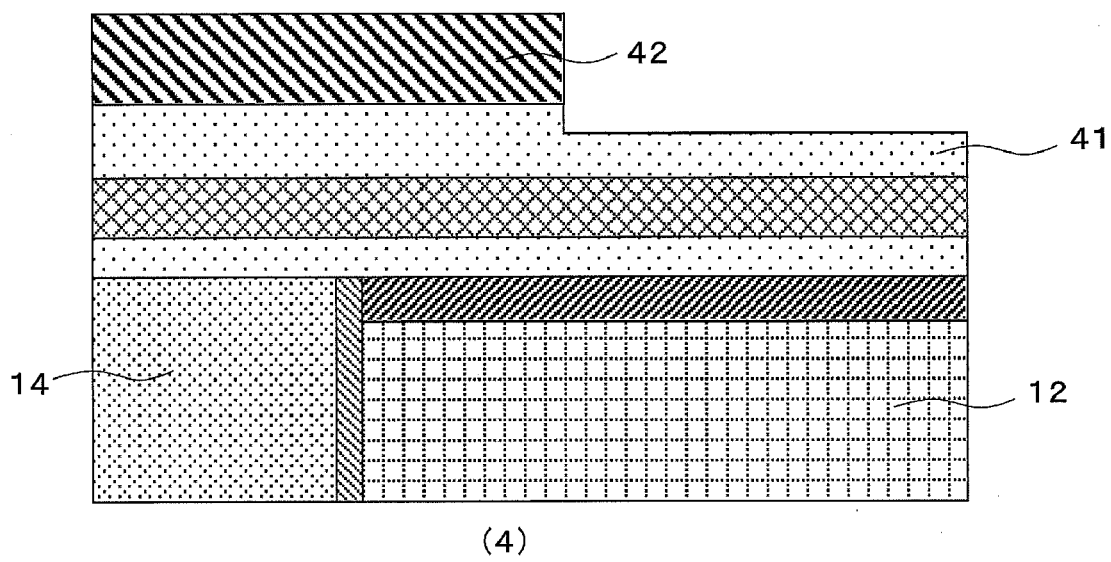
(4)

FIG. 35
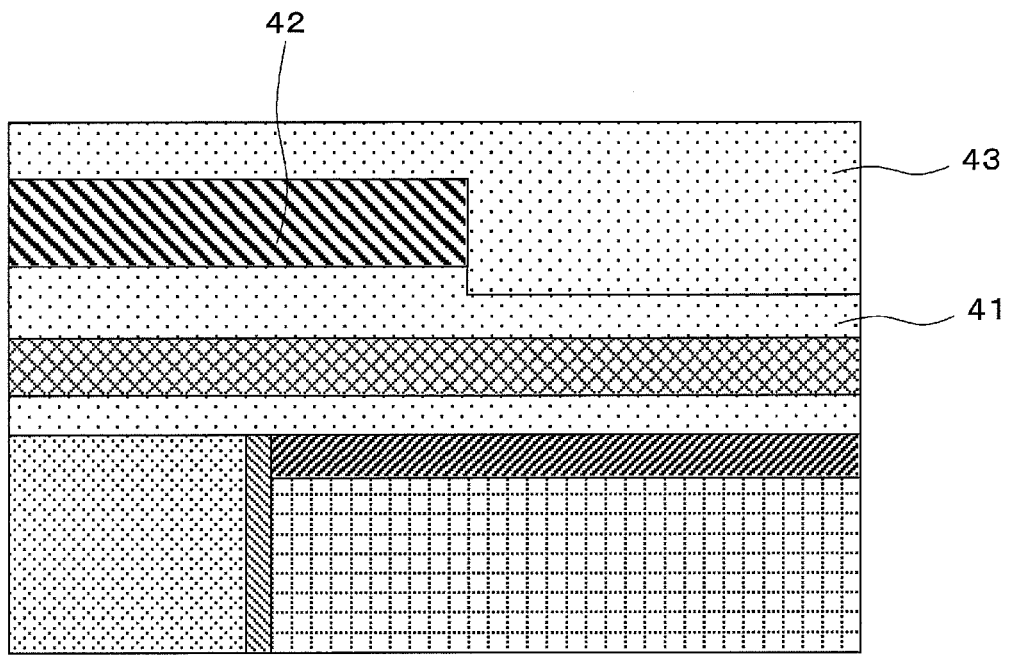
(5)
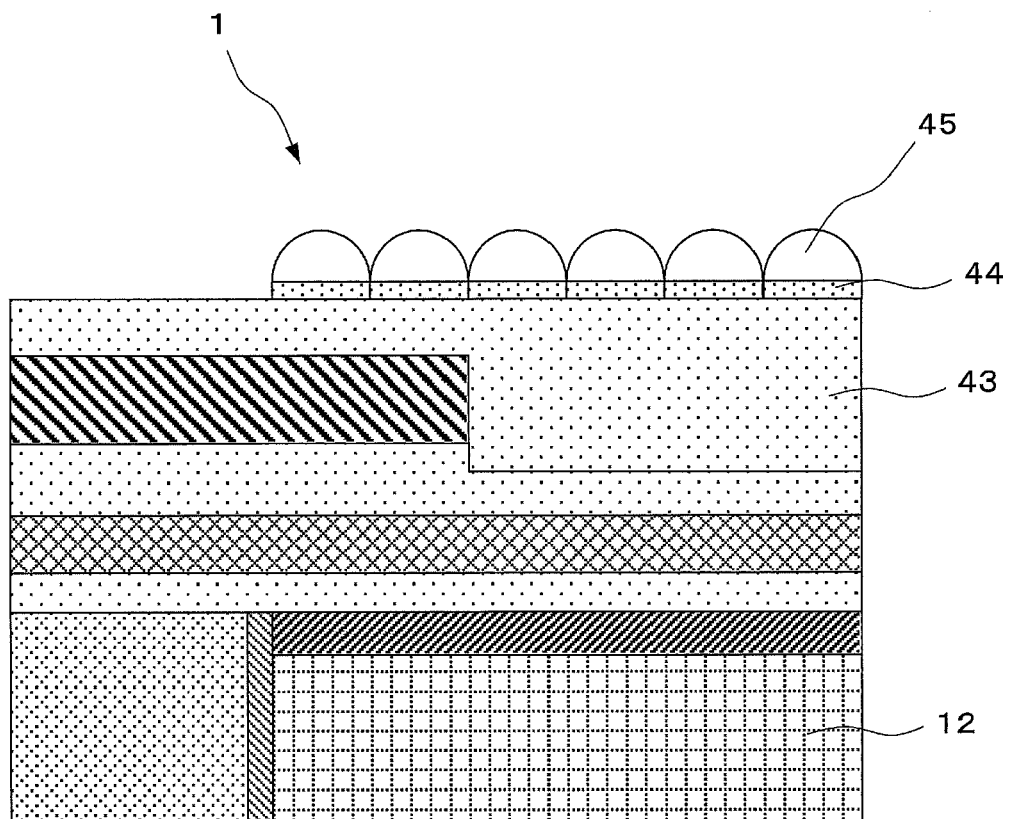
(6)

FIG. 37
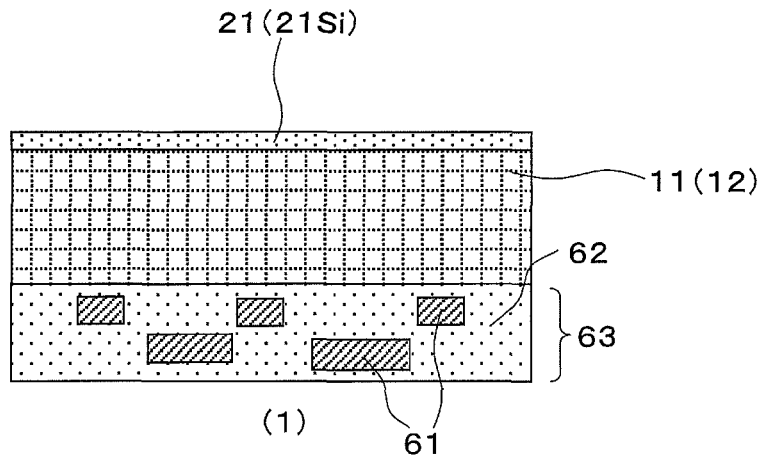
(1)
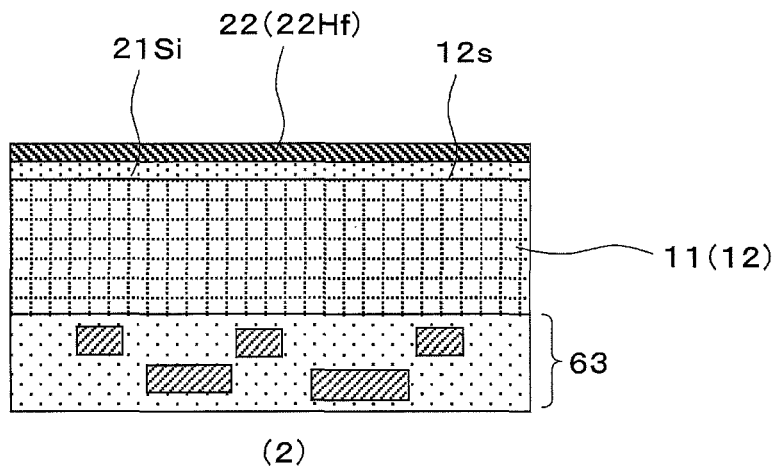
(2)
LIGHT IRRADIATION TREATMENT
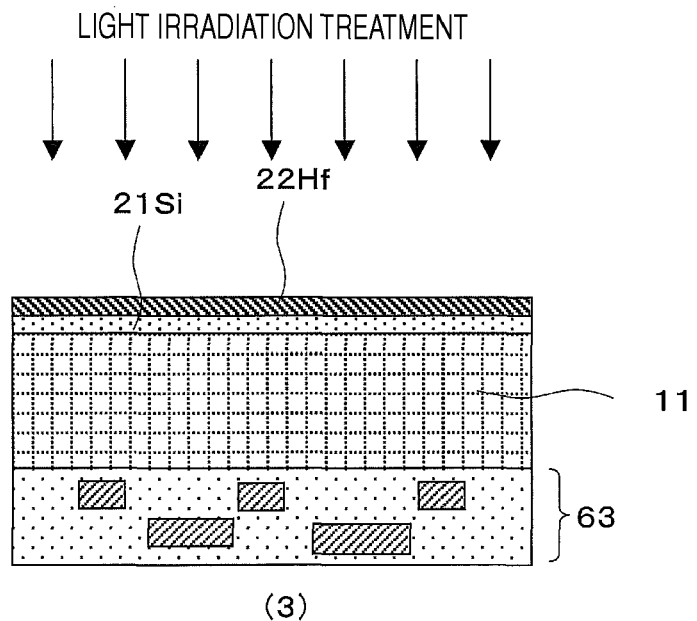
(3)

FIG. 43
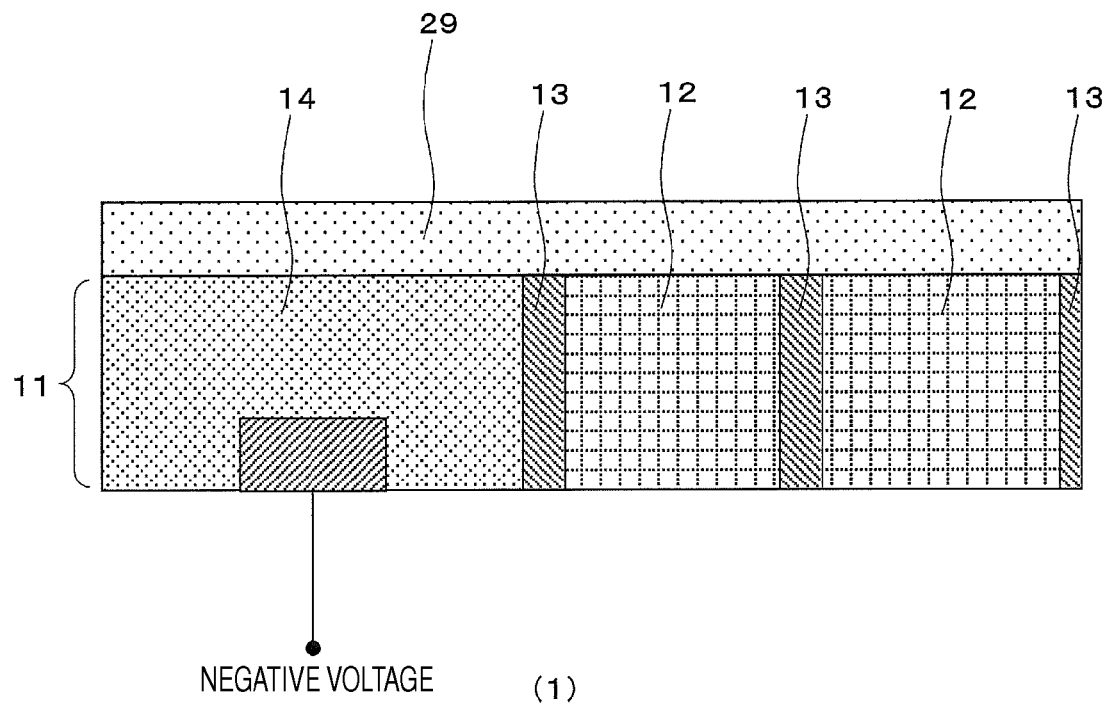
NEGATIVE VOLTAGE    (1)
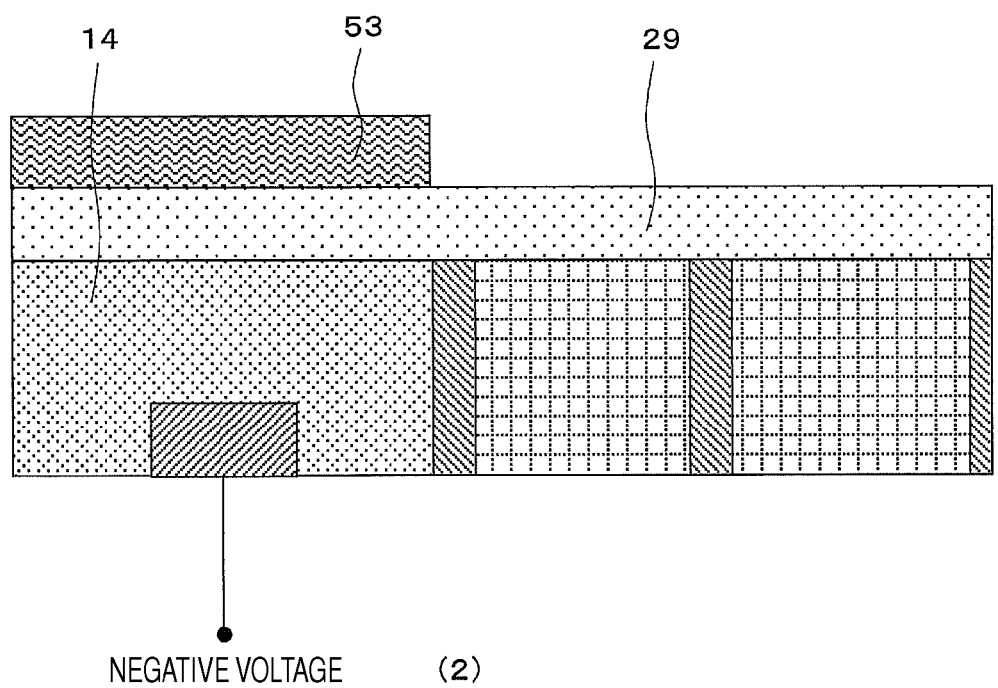
NEGATIVE VOLTAGE    (2)

FIG. 44
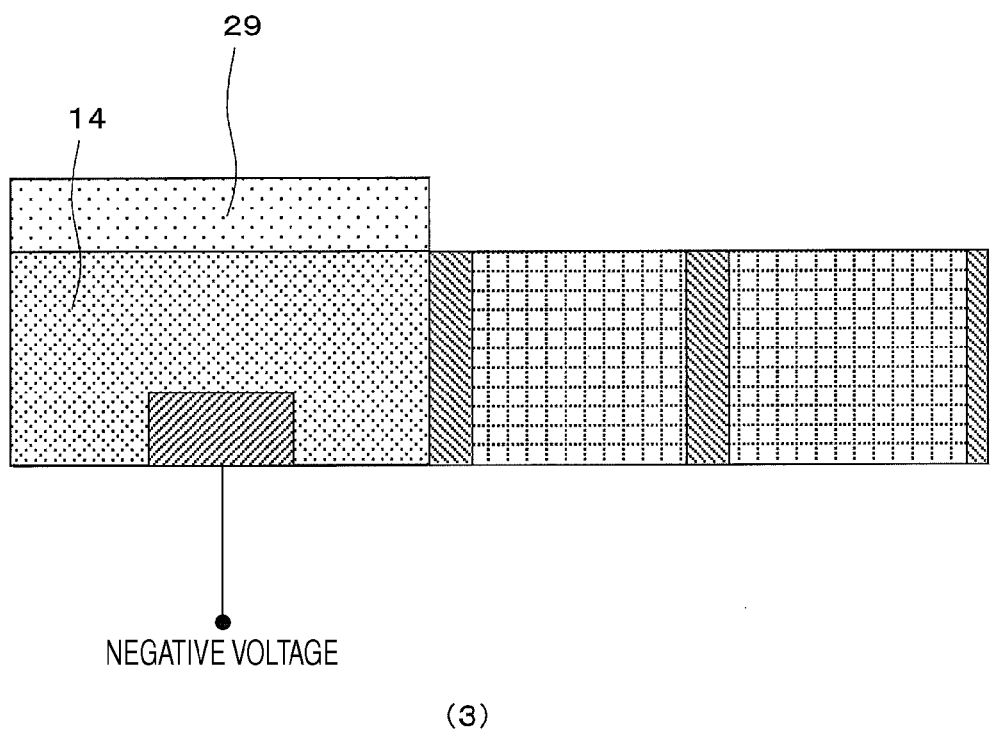
(3)
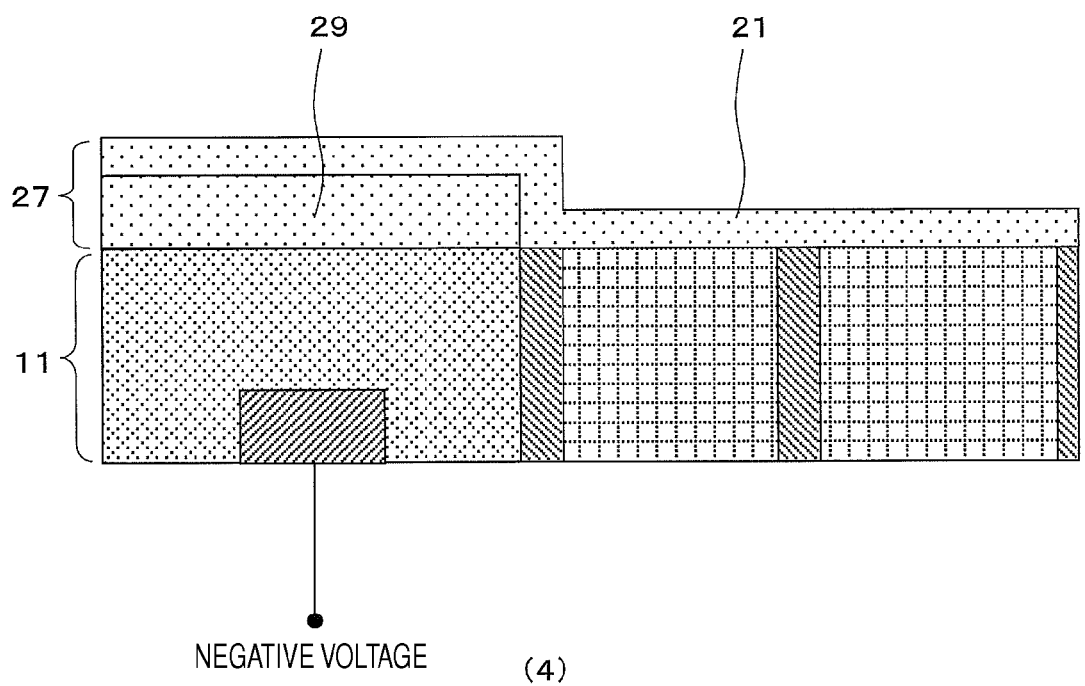
(4)

FIG. 46
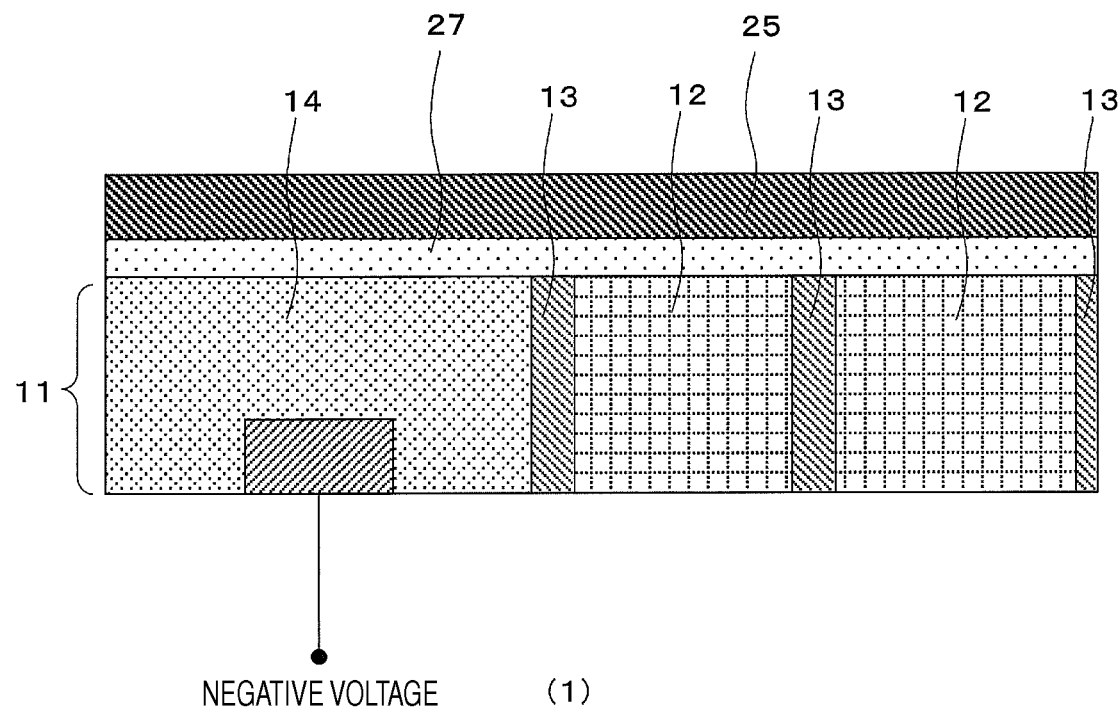
NEGATIVE VOLTAGE (1)
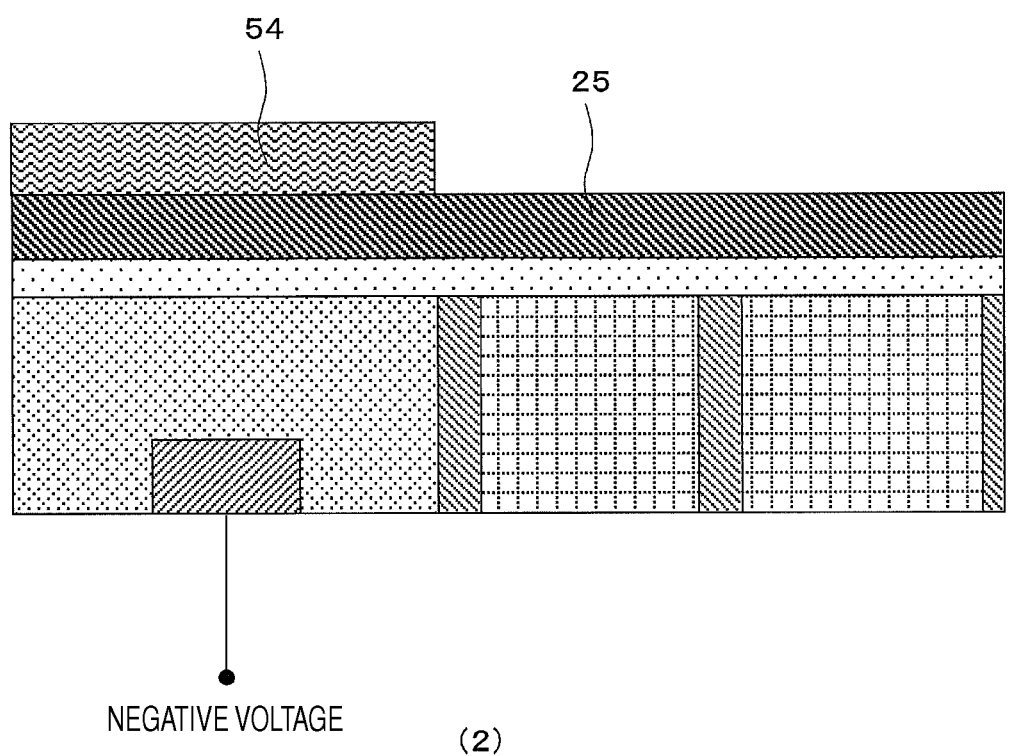
NEGATIVE VOLTAGE (2)

FIG. 47
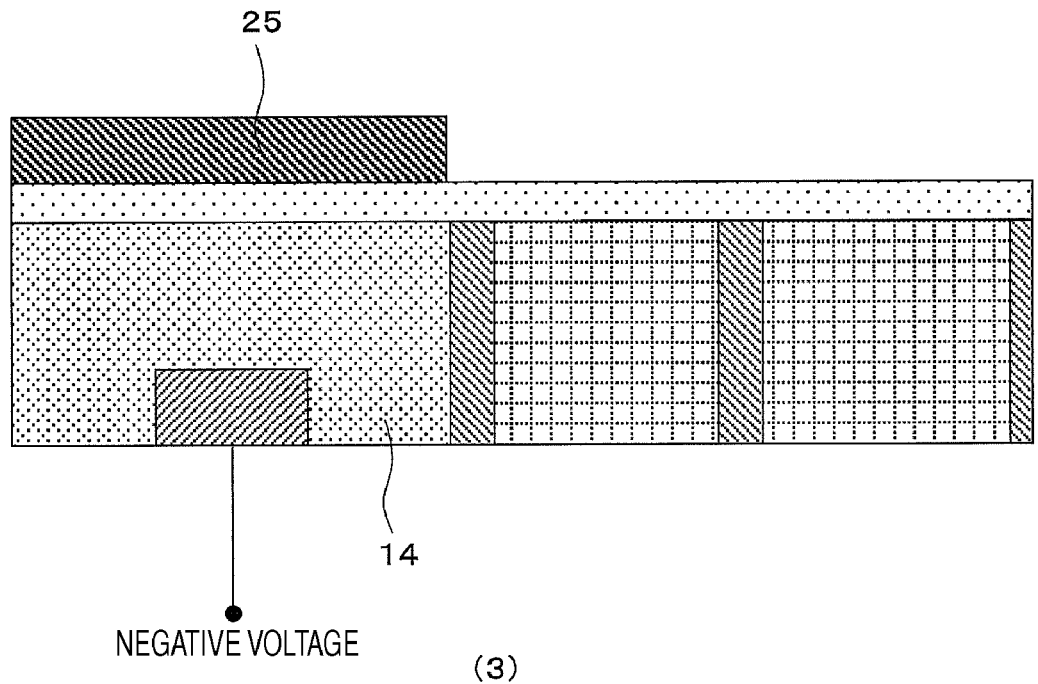
(3)
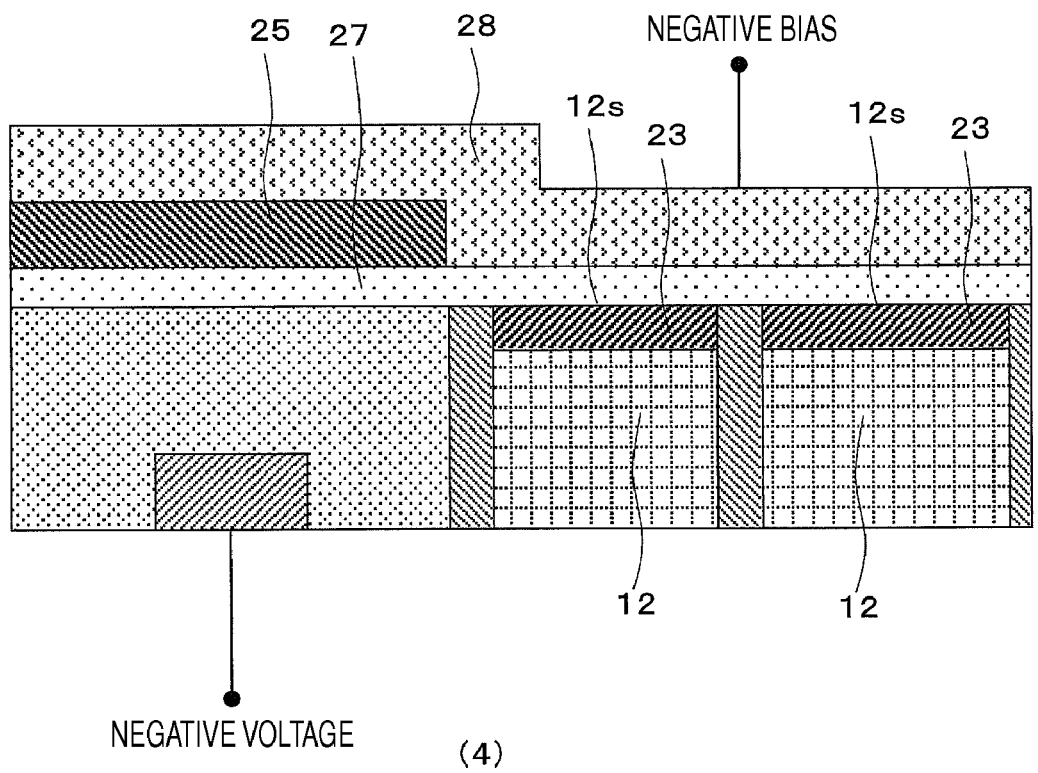
(4)

FIG. 52
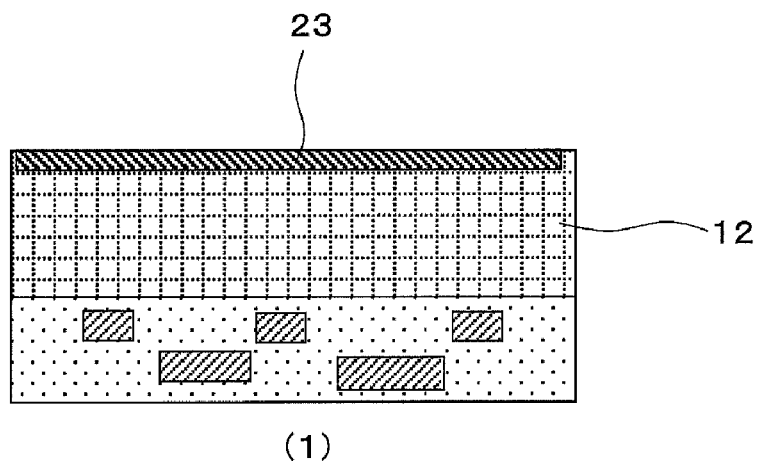
(1)
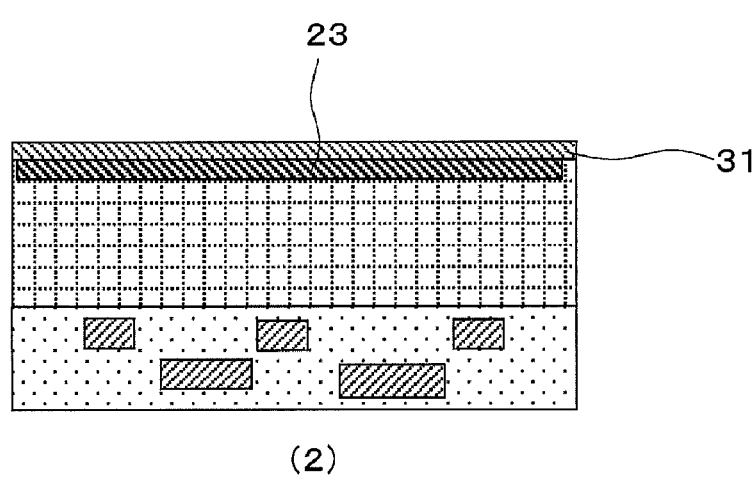
(2)
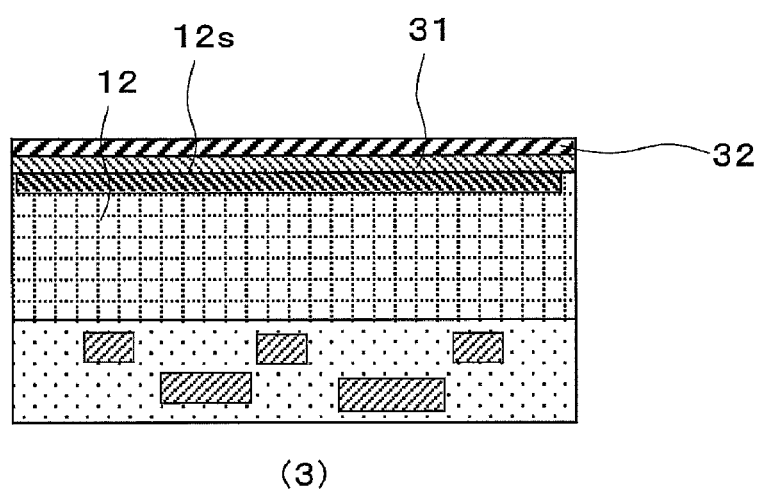
(3)

FIG. 54
Prior Art
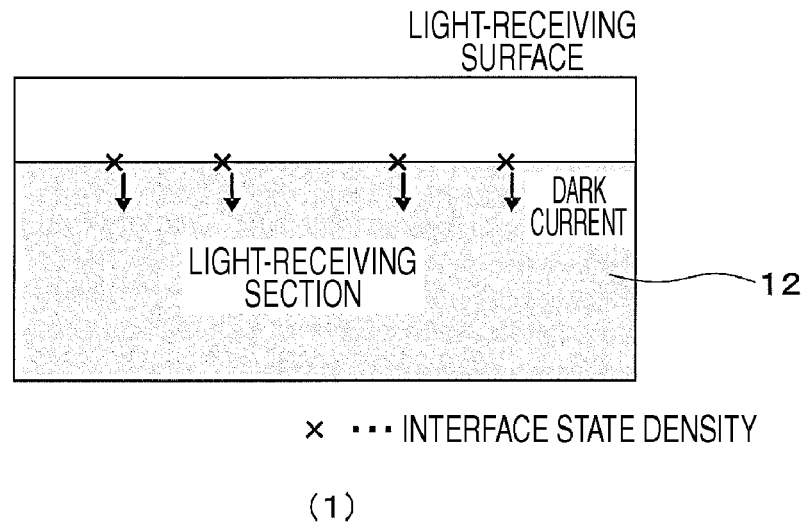
(1)
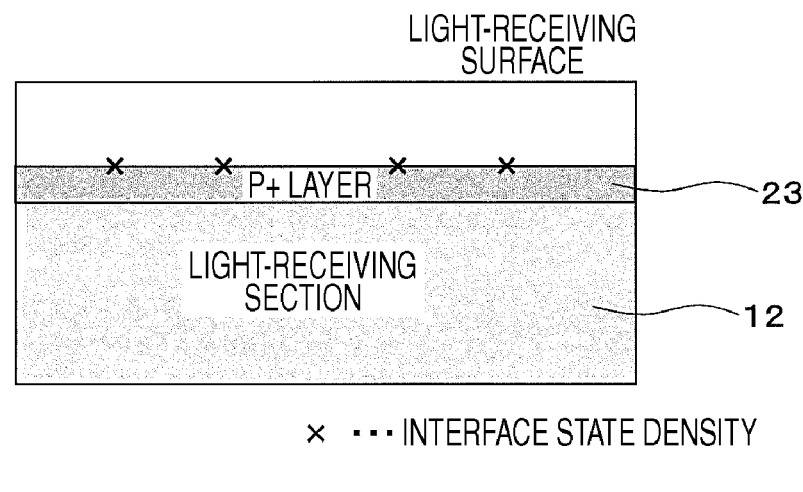
(2)

SOLID-STATE IMAGING DEVICE, AND IMAGING APPARATUS

CROSS-REFERENCES TO RELATED APPLICATIONS

The present invention contains subject matter related filed in the Japanese Patent Office on May 7, 2007 and Dec. 26, 2007, respectively, the entire contents of which being incorporated herein by reference.

BACKGROUND OF THE INVENTION

1. Field of the Invention

The present invention relates to a solid-state imaging device with the generation of dark currents suppressed, a manufacturing method for the solid-state imaging device, and an imaging apparatus.

2. Description of the Related Art

In video cameras and digital still cameras, solid-state imaging devices including CCD (Charge Coupled Device) or CMOS image sensors are widely used. A reduction in noise as well as improvement of sensitivity is an important object for all the solid-stage imaging devices.

Regardless of a state in which there is no incident light, i.e., a state in which there is no pure signal charge generated by photoelectric conversion of incident light, charges (electrons) caused by micro-defects present in a substrate interface of a light-receiving surface are captured as signals and change to micro-currents. The micro-currents are detected as dark currents. Further, dark currents are caused by a deep level defect existing in an interface between a Si layer and an insulating layer (interface state density). In particular, these dark currents are noise that should be reduced for a solid-state imaging device.

As a method of suppressing the generation of the dark currents due to the interface state density, for example, as shown in (2) in FIG. 54, an embedded photodiode structure having a hole accumulation layer 23 including a $P^+$ layer on a light-receiving section (e.g., a photodiode) 12 as shown in (2) in FIG. 54 is used. In this specification, the embedded photodiode structure is referred to as HAD (Hole Accumulated Diode) structure.

As shown in (1) in FIG. 54, in the structure in which the HAD structure is not provided, electrons due to interface state density flow into the photodiode as dark currents.

On the other hand, as shown in (2) in FIG. 54, in the HAD structure, the generation of electrons from the interface is suppressed by the hole accumulation layer 23 formed in the interface. Even if charges (electrons) are generated from the interface, since the charges (electrons) flow in the hole accumulation layers 23 of the $P^+$ layer in which a large number of holes are present without flowing into a charge accumulation portion forming a well of potential in an $N^+$ layer of the light-receiving section 12, the charges (the electrons) can be eliminated.

Therefore, it is possible to prevent the charges due to the interface from changing to dark currents to be detected and suppress the dark currents due to the interface state density.

As a method of forming the HAD structure, it is a general practice to, after ion-implanting impurities forming the $P^+$ layer, for example, boron (B) or boron difluoride ($BF_2$) via a thermal oxide film or a CVD oxide film formed on a substrate, apply activation of the implanted impurities with annealing and form a P-type region near the interface.

However, heat treatment at high temperature equal to or higher than 700° C. is necessary and indispensable for activation of doping impurities. Therefore, it is difficult to form a hole accumulation layer by ion implantation in a low-temperature process at low temperature equal to or lower than 400° C. Even when it is desired to avoid activation for long time at high temperature in order to suppress the spread of a dopant, the method of forming a hole accumulation layer by applying the ion implantation and the annealing is not preferable.

When silicon oxide or silicon nitride are formed on an upper layer of a light-receiving section by a method of low-temperature plasma CVD or the like, compared with an interface between a film formed at high temperature and a light-receiving surface, interface state density is deteriorated. The deterioration in the interface state density causes an increase in dark currents.

As described above, when it is desired to avoid the ion implantation and the annealing at high temperature, it is difficult to perform formation of the hole accumulation layer by the ion implantation in the past. Moreover, the dark currents tend to worsen. To solve such a problem, it is necessary to form a hole accumulation layer with another method not depending the ion implantation in the past.

For example, there is disclosed a technique for increasing the potential of the surface of a photoelectric conversion section by embedding, in an insulating layer made of silicon oxide on a photoelectric conversion element having a conduction type opposite to a conduction type of a semiconductor region formed in the semiconductor region, charge particles having the opposite conduction type and the same polarity and forming an inversion layer on the surface to thereby prevent depletion of the surface and reduce the generation of dark currents (see, for example, JP-A-1-256168).

However, in the technique, although a technique for embedding charge particles in the insulating layer is necessary, it is unclear what kind of embedding technique should be used. In general, in order to inject charges into an insulating film from the outside as in a nonvolatile memory, an electrode for injecting charges is necessary. Even if charges can be injected in a non-contact manner from the outside without using the electrode, in any case, the charges trapped in the insulating film should not be detrapped. A charge holding characteristic poses a problem. Therefore, a high-quality insulating film with a high charge holding characteristic is demanded but it is difficult to realize the insulating film.

SUMMARY OF THE INVENTION

When it is attempted to form a sufficient hole accumulation layer by implanting ions into a light-receiving section (a photoelectric conversion section) at high density, since the light-receiving section is damaged by the ion implantation, annealing at high temperature is necessary but, in the annealing, spread of impurities occurs and a photoelectric conversion characteristic is deteriorated.

On the other hand, when ion implantation is performed at lower density in order to reduce the damage of the ion implantation, the density of a hole accumulation layer falls. The hole accumulation layer does not have a sufficient function of the hole accumulation layer.

In other words, it is difficult to achieve both the realization of a sufficient hole accumulation layer and a reduction in dark currents while suppressing the spread of impurities and having a desired photoelectric conversion characteristic.

Therefore, it is desirable to achieve both the realization of the sufficient hole accumulation layer and the reduction in dark current.

According to an embodiment of the present invention, there is provided a solid-state imaging device (a first solid-state imaging device) having a light-receiving section that photoelectrically converts incident light. The solid-state imaging device has a film for reducing interface state density formed on a light-receiving surface of the light-receiving section and a film having negative fixed charges formed on the film for reducing interface state density. A hole accumulation layer is formed on the light-receiving surface side of the light-receiving section.

In the first solid-state imaging device, since the film having negative fixed charges is formed on the film for reducing interface state density, the hole accumulation layer is sufficiently formed in an interface on the light-receiving surface side of the light-receiving section by an electric field due to the negative fixed charges. Therefore, the generation of charges (electrons) from the interface is suppressed. Even if charges (electrons) are generated, since the charges flows in the hole accumulation layer in which a large number of holes are present without flowing into a charge accumulation portion forming a well of potential in the light-receiving section, the charges (the electrons) can be eliminated. Therefore, it is possible to prevent the charges due to the interface from changing to dark currents to be detected by the light-receiving section and suppress the dark currents due to the interface state density. Moreover, since the film for reducing interface state density is formed on the light-receiving surface of the light-receiving section, the generation of electrons due to the interface state density is further suppressed. Therefore, the electrons due to the interface state density are prevented from flowing into the light-receiving section as dark currents.

According to another embodiment of the present invention, there is provided a solid-state imaging device (a second solid-state imaging device) having a light-receiving section that photoelectrically converts incident light. The solid-state imaging device has an insulating film that is formed on a light-receiving surface of the light-receiving section transmits the incident light and a film that is formed on the insulating film and to which negative voltage is applied. A hole accumulation layer is formed on the light-receiving surface side of the light-receiving section.

In the second solid-state imaging device, since the film to which negative voltage is applied is formed on the insulating film formed on the light-receiving surface of the light-receiving section, the hole accumulation layer is sufficiently formed in an interface on the light-receiving surface side of the light-receiving section by an electric field generated when negative voltage is applied to the film to which negative voltage is applied. Therefore, the generation of charges (electrons) from the interface is suppressed. Even if charges (electrons) are generated, since the charges flows in the hole accumulation layer in which a large number of holes are present without flowing into a charge accumulation portion forming a well of potential in the light-receiving section, the charges (the electrons) can be eliminated. Therefore, it is possible to prevent the charges due to the interface from changing to dark currents to be detected by the light-receiving section and suppress the dark currents due to the interface state density.

According to still another embodiment of the present invention, there is provided a solid-state imaging device (a third solid-state imaging device) having a light-receiving section that photoelectrically converts incident light. The solid-state imaging device has an insulating film formed on an upper layer on a light-receiving surface side of the light-receiving section and a film that is formed on the insulating film and has a value of a work function larger than that of an interface on the light-receiving surface side of the light-receiving section that photoelectrically converts incident light.

In the third solid-state imaging device, the film having a value of a work function larger than that of the interface on the light-receiving surface side of the light-receiving section that photoelectrically converts incident light is formed on the insulating film formed on the light-receiving section. Therefore, hole accumulation in the interface on the light-receiving side of the light-receiving section is possible. Consequently, dark currents are reduced.

According to still another embodiment of the present invention, there is provided a manufacturing method (a first manufacturing method) for a solid-state imaging device for forming, in a semiconductor substrate, a light-receiving section that photoelectrically converts incident light. The manufacturing method has a step of forming a film for reducing interface state density on a semiconductor substrate in which the light-receiving section is formed and a step of forming a film having negative fixed charges on the film for reducing interface state density. A hole accumulation layer is formed on the light-receiving surface side of the light-receiving section by the film having negative fixed charges.

In the manufacturing method (the first manufacturing method) for a solid-state imaging device, since the film having negative fixed charges is formed on the film for reducing interface state density, the hole accumulation layer is sufficiently formed in an interface on the light-receiving surface side of the light-receiving section by an electric field due to the negative fixed charges. Therefore, the generation of charges (electrons) from the interface is suppressed. Even if charges (electrons) are generated, since the charges flows in the hole accumulation layer in which a large number of holes are present without flowing into a charge accumulation portion forming a well of potential in the light-receiving section, the charges (the electrons) can be eliminated. Therefore, it is possible to prevent dark currents generated by the charges due to the interface from being detected by the light-receiving section and suppress the dark currents due to the interface state density. Moreover, since the film for reducing interface state density is formed on the light-receiving surface of the light-receiving section, the generation of electrons due to the interface state density is further suppressed. Therefore, the electrons due to the interface state density are prevented from flowing into the light-receiving section as dark currents. Since the film having negative fixed charges is used, it is possible to form an HAD structure without applying ion implantation and annealing thereto.

According to still another embodiment of the present invention, there is provided a manufacturing method (a first manufacturing method) for a solid-state imaging device for forming, in a semiconductor substrate, a light-receiving section that photoelectrically converts incident light. The manufacturing method has a step of forming, on a light-receiving surface of the light-receiving section, an insulating film that transmits the incident light and a step of forming a film to which negative voltage on the insulating film. A hole accumulation layer is formed on the light-receiving surface side of the light-receiving section by applying negative voltage to the film to which negative voltage is applied.

In the manufacturing method for a solid-state imaging device (the second manufacturing method), since the film to which negative voltage is applied is formed on the insulating film formed on the light-receiving surface of the light-receiving section, the hole accumulation layer is sufficiently formed in an interface on the light-receiving surface side of the light-receiving section by an electric field generated when negative voltage is applied to the film to which negative voltage is applied. Therefore, the generation of charges (electrons) from the interface is suppressed. Even if charges (electrons) are generated, since the charges flows in the hole accumulation layer in which a large number of holes are present without flowing into a charge accumulation portion forming a well of potential in the light-receiving section, the charges (the electrons) can be eliminated. Therefore, it is possible to prevent dark currents generated by the charges due to the interface from being detected by the light-receiving section and suppress the dark currents due to the interface state density. Since the film having negative fixed charges is used, it is possible to form an HAD structure without applying ion implantation and annealing thereto.

According to still another embodiment of the present invention, there is provided a manufacturing method for a solid-state imaging device (a third manufacturing method) for forming, in a semiconductor substrate, a light-receiving section that photoelectrically converts incident light. The manufacturing method has a step of forming an insulating film on an upper layer on a light-receiving surface side of the light-receiving section and a step of forming, on the insulating film, a film having a value of a work function larger than that of an interface on the light-receiving surface side of the light-receiving section that photoelectrically converts incident light.

In the manufacturing method for a solid-state imaging device (the third manufacturing method), the film having a value of a work function larger than that of the interface on the light-receiving surface side of the light-receiving section that photoelectrically converts incident light is formed on the insulating film formed on the light-receiving section. Therefore, it is possible to form a hole accumulation layer in the interface on the light-receiving side of the light-receiving section. Consequently, dark currents are reduced.

According to still another embodiment of the present invention, there is provided an imaging apparatus (a first imaging apparatus) including a condensing optical unit that condenses incident light, a solid-state imaging device that receives the incident light condensed by the condensing optical unit and photoelectrically converts the incident light, and a signal processing unit that processes photoelectrically-converted signal charges. The solid-state imaging device has a film for reducing interface state density formed on a light-receiving surface of a light-receiving section of the solid-stage imaging device that photoelectrically converts the incident light and a film having negative fixed charges formed on the film for reducing interface state density. A hole accumulation layer is formed on the light-receiving surface of the light-receiving section.

In the first imaging apparatus, since the first solid-state imaging device is used, a solid-state imaging device with dark currents reduced is used.

According to still another embodiment of the present invention, there is provided an imaging apparatus (a second imaging apparatus) including a condensing optical unit that condenses incident light, a solid-state imaging device that receives the incident light condensed by the condensing optical unit and photoelectrically converts the incident light, and a signal processing unit that processes photoelectrically-converted signal charges. The solid-state imaging device has an insulating film formed on a light-receiving surface of a light-receiving section of the solid-state imaging device that photoelectrically converts the incident light and a film to which negative voltage is applied formed on the insulating film. The insulating film includes an insulating film that transmits the incident film. A hole accumulation layer is formed on the light-receiving surface of the light-receiving section.

In the second imaging apparatus, since the second solid-state imaging device is used, a solid-state imaging device with dark currents reduced is used.

According to still another embodiment of the present invention, there is provided an imaging apparatus (a third imaging apparatus) including a condensing optical unit that condenses incident light, a solid-state imaging device that receives the incident light condensed by the condensing optical unit and photoelectrically converts the incident light, and a signal processing unit that processes photoelectrically-converted signal charges. The solid-state imaging device has an insulating film formed on an upper layer on a light-receiving surface side of a light-receiving section that converts the incident light into signal charges and a film that is formed on the insulating film and has a value of a work function larger than that of an interface on the light-receiving surface side of the light-receiving section that photoelectrically converts incident light.

In the third imaging apparatus, since the third solid-state imaging device is used, a solid-state imaging device with dark currents reduced is used.

With the solid state imaging apparatuses according to the embodiments, since dark currents can be suppressed, noise in a picked-up image can be reduced. Therefore, there is an effect that it is possible to obtain a high-quality image. In particular, it is possible to reduce generation of white dots (dots of the primary colors in a color CCD) due to dark currents in long-time exposure with a small exposure amount.

With the manufacturing methods for a solid state imaging device according to the embodiments, since dark currents can be suppressed, noise in a picked-up image can be reduced. Therefore, there is an effect that it is possible to realize a solid-state imaging device that can obtain a high-quality image. In particular, it is possible to realize a solid-state imaging device that can reduce generation of white dots (dots of the primary colors in a color CCD) due to dark currents in long-time exposure with a small exposure amount.

With the imaging apparatus according to the embodiments, since the solid-state imaging devices that can suppress dark current are used, noise in a picked-up image can be reduced. Therefore, there is an effect that it is possible to record a high-definition video. In particular, it is possible to reduce generation of white dots (dots of the primary colors in a color CCD) due to dark currents in long-time exposure with a small exposure amount.

BRIEF DESCRIPTION OF THE DRAWINGS

FIG. 2 shows energy band diagrams for explaining an effect of the solid-state imaging device (the first solid-state imaging device) according to the first embodiment;

FIG. 8 shows sectional views of a manufacturing process of a manufacturing method (a first manufacturing method) for a solid-stage imaging device according to the first embodiment;

FIG. 9 shows sectional views of the manufacturing process of the manufacturing method (the first manufacturing method) for a solid-state imaging device according to the first embodiment;

FIG. 11 shows sectional views of a manufacturing process of a manufacturing method (a first manufacturing method) for a solid-state imaging device according to the second embodiment;

FIG. 12 shows sectional views of the manufacturing process of the manufacturing method (the first manufacturing method) for a solid-state imaging device according to the second embodiment;

FIG. 14 shows sectional views of a manufacturing process of a manufacturing method (a first manufacturing method) for a solid-state imaging device according to the third embodiment;

FIG. 15 shows sectional views of the manufacturing process of the manufacturing method (the first manufacturing method) for a solid-state imaging device according to the third embodiment;

FIG. 17 shows sectional views of a manufacturing process of a manufacturing method (a first manufacturing method) for a solid-state imaging device according to a fourth embodiment of the present invention;

FIG. 18 shows sectional views of the manufacturing processing of the manufacturing method (the first manufacturing method) for a solid-state imaging device according to the fourth embodiment;

FIG. 20 shows sectional views of a manufacturing process of a manufacturing method for a solid-state imaging device according to a fifth embodiment of the present invention;

FIG. 21 shows sectional views of the manufacturing process of the manufacturing method (the first manufacturing method) for a solid-state imaging device according to the fifth embodiment;

FIG. 25 shows sectional views of a manufacturing process of a manufacturing method (a first manufacturing method) for a solid-state imaging device according to a sixth embodiment of the present invention;

FIG. 29 shows sectional views of a manufacturing process of a manufacturing method (a first manufacturing method) for a solid-state imaging device according to a seventh embodiment of the present invention;

FIG. 30 shows sectional views of the manufacturing process of the manufacturing method (the first manufacturing method) for a solid-state imaging device according to the seventh embodiment;

FIG. 31 shows sectional views of the manufacturing process of the manufacturing method (the first manufacturing method) for a solid-state imaging device according to the seventh embodiment;

FIG. 34 shows sectional views of the manufacturing process of the manufacturing method (the first manufacturing method) for a solid-state imaging device according to the eighth embodiment;

FIG. 35 shows sectional views of the manufacturing process of the manufacturing method (the first manufacturing method) for a solid-state imaging device according to the eighth embodiment;

FIG. 37 shows sectional views of a manufacturing step of a manufacturing method (a first manufacturing method) for a solid-state imaging device according to a ninth embodiment of the present invention;

FIG. 43 shows sectional views of a manufacturing process of a manufacturing method (a second manufacturing method) for a solid-state imaging device according to the first embodiment;

FIG. 44 shows sectional views of the manufacturing process of the manufacturing method (the second manufacturing method) for a solid-state imaging device according to the first embodiment;

FIG. 46 shows sectional views of a manufacturing process of a manufacturing method (a second manufacturing method) for a solid-state imaging device according to the second embodiment;

FIG. 47 shows sectional views of the manufacturing process of the manufacturing method (the second manufacturing method) for a solid-state imaging device according to the second embodiment;

FIG. 52 shows sectional views of a main part manufacturing process of the manufacturing method (the third manufacturing method) according to the embodiment;

FIG. 54 shows sectional views of a schematic structure of a light-receiving section for explaining a method of suppressing generation of dark currents due to interface state density.

DESCRIPTION OF THE PREFERRED EMBODIMENTS

A solid-state imaging device (a first solid-state imaging device) according to a first embodiment of the present invention is explained below with reference to a sectional view of a main part configuration in FIG. 1.

Figure 1:
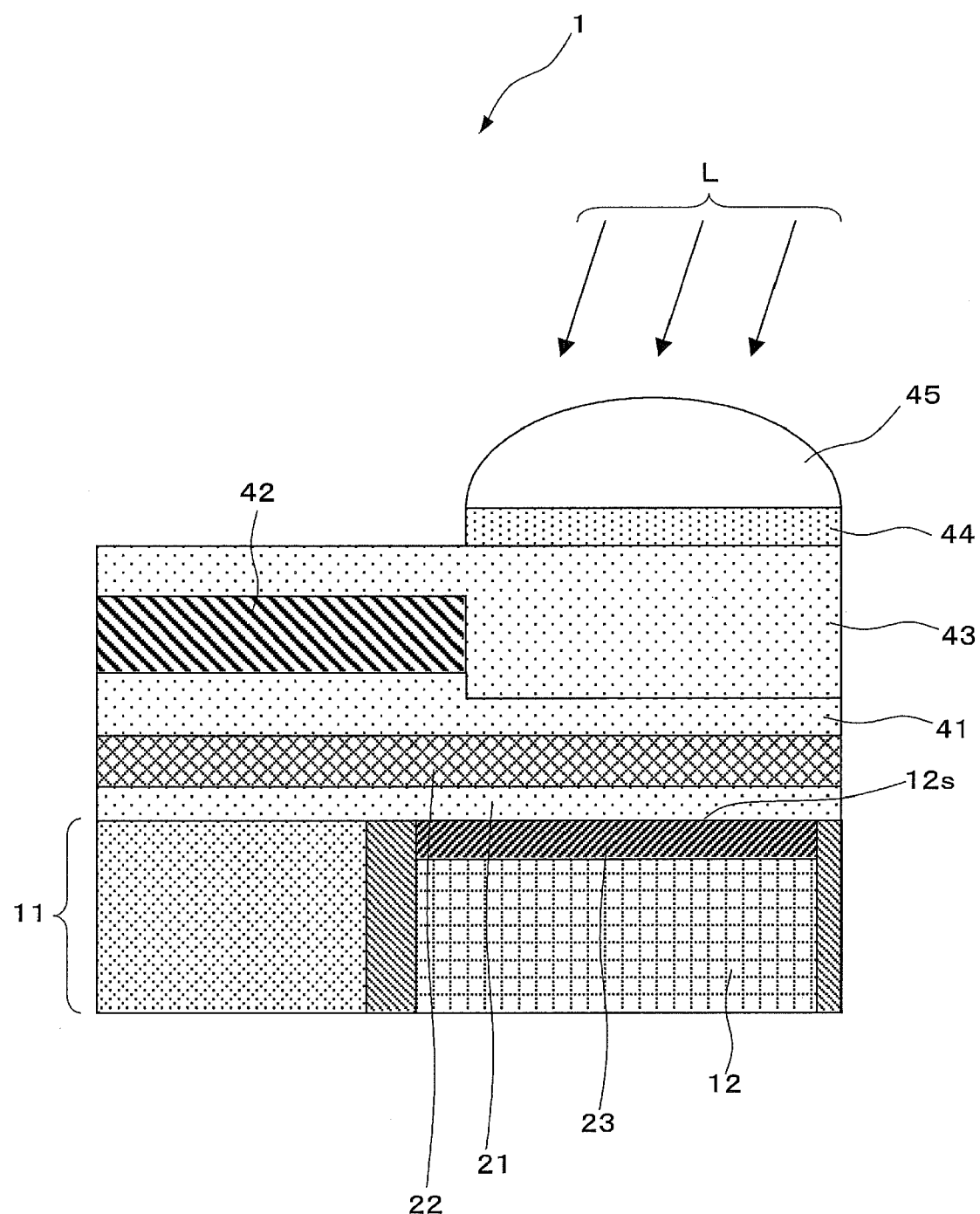
FIG. 1 is a sectional view of a main part configuration of a solid-state imaging device (a first solid-state imaging device) according to a first embodiment of the present invention.

As shown in FIG. 1, the solid-state imaging device 1 has, in a semiconductor substrate (or a semiconductor layer) 11, a light-emitting section 12 that photoelectrically converts incident light L. The solid-state imaging device 1 has, on a side of the light-receiving section 12, a peripheral circuit section 14 in which peripheral circuits (not specifically shown) are formed via a pixel separation area 13.

In the following explanation, the solid-state imaging device 1 has the light-receiving section 12 in the semiconductor substrate 11.

A film 21 for reducing interface state density is formed on a light-receiving surface 12s of the light-receiving section (including a hole accumulation layer 23 described later) 12. The film 21 for reducing interface state density is formed by, for example, a silicon oxide ($SiO_2$) film. A film 22 having negative fixed charges is formed on the film 21 for reducing interface state density. Consequently, the hole accumulation layer 23 is formed on the light-receiving surface side of the light-receiving section 12.

Therefore, at least on the light-receiving section 12, the film 21 for reducing interface state density is formed, by the film 22 having negative fixed charges, in thickness enough for forming the hole accumulation layer 23 on the light-receiving surface 12s side of the light-receiving section 12. The film thickness is, for example, equal to or larger than one atom layer and equal to or smaller than 100 nm.

In the peripheral circuits of the peripheral circuit section 14, for example, when the solid-state imaging device 1 is a CMOS image sensor, there is a pixel circuit including transistors such as a transfer transistor, a reset transistor, an amplification transistor, and a selection transistor.

The peripheral circuits include a driving circuit that performs an operation for reading out a signal of a readout row of a pixel array section including plural light-receiving sections 12, a vertical scanning circuit that transfers the read-out signal, a shift register or an address decoder, and a horizontal scanning circuit as well.

In the peripheral circuits of the peripheral circuit section 14, for example, when the solid-state imaging device 1 is a CCD image sensor, there are a readout gate that reads out photoelectrically-converted signal charges from the light-receiving section to a vertical transfer gate, a vertical-charge transfer section that transfers the read-out signal charges in a vertical direction. The peripheral circuits include a horizontal-charge transfer section as well.

The film 22 having negative fixed charges is formed by, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The films of the kinds described above are actually used in a gate insulating film and the like of an insulated-gate field-effect transistor. Therefore, since a film forming method is established, it is possible to easily form the films.

Examples of the film forming method include the chemical vapor deposition method, the sputtering method, and the atomic layer deposition method. The atomic layer deposition method is suitably used because an $SiO_2$ layer for reducing interface state density can be simultaneously formed by about 1 nm during the film formation.

Examples of materials other than the above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$).

The film 22 having negative fixed charges can be formed by a hafnium nitride film, an aluminum nitride film, a hafnium oxide nitride film, or an aluminum oxide nitride film as well.

Silicon (Si) or nitrogen (N) may be added to the film 22 having negative fixed charges as long as insulating properties thereof are not spoiled. The density of silicon or nitrogen is appropriately determined in a range in which the insulating properties of the film are not spoiled. However, in order to prevent an image defect such as white dotes from being caused, additives such as silicon or nitrogen is preferably added to the surface of the film 22 having negative fixed charges, i.e., a surface on the opposite side of the light-receiving section 12 side.

Such addition of silicon (Si) or nitrogen (N) makes it possible to improve heat resistance of the film and an ability of blocking ion implantation in a process.

An insulating film 41 is formed on the film 22 having negative fixed charges. A light shielding film 42 is formed on the insulating film 41 above the peripheral circuit section 14.

An area in which light does not enter is formed in the light-receiving section 12 by the light shielding film 42. A black level in an image is determined by an output of the light-receiving section 12.

Since light is prevented from entering the peripheral circuit section 14, fluctuation in characteristics caused by the light entering the peripheral circuit section 14 is suppressed.

Moreover, an insulating film 43 having permeability to the incident light is formed. The surface of the insulating film 43 is preferably planarized.

Furthermore, a color filter layer 44 and a condensing lens 45 are formed on the insulating film 43.

In the solid-state imaging device (the first solid-state imaging device) 1, the film 22 having negative fixed charges is formed on the film 21 for reducing interface state density. Therefore, an electric field is applied to the surface of the light-receiving section 12 via the film 21 for reducing interface state density by the negative fixed charges in the film 22 having negative fixed charges. The hole accumulation layer 23 is formed on the surface of the light-receiving section 12.

As shown in (1) in FIG. 2, immediately after the film 22 having negative fixed charges is formed, the vicinity of the interface can be formed as the hole accumulation layer 23 by the electric field, which is applied by the negative fixed charges, present in the film.

Therefore, dark currents generated by the interface state density in the interface between the light-receiving section 12 and the film 21 for reducing interface state density are suppressed. In other words, charges (electrons) generated from the interface are suppressed. Even if charges (electrons) are generated from the interface, since the charges (the electrons) flow in the hole accumulation layer 23 in which a large number of holes are present without flowing into a charge accumulation portion forming a well of potential in the light-receiving section 12, the charges (the electrons) can be eliminated.

Therefore, it is possible to prevent dark currents generated by the charges due to the interface from being detected by the light-receiving section 12 and suppress the dark currents due to the interface state density.

On the other hand, as shown in (2) in FIG. 2, when a hole accumulation layer is not provided, dark currents are generated by interface state density and flow into the light-receiving section 12.

As shown in (3) in FIG. 2, when the hole accumulation layer 23 is formed by ion implantation, as explained above, heat treatment at high temperature equal to or higher than 700° C. is necessary and indispensable for activation of doping impurities in the ion implantation. Therefore, spread of the impurities occurs, the hole accumulation layer in the interface expands, and an area for photoelectric conversion is narrowed. As a result, it is difficult to obtain desired photoelectric conversion characteristics.

In the solid-state imaging device 1, the film 21 for reducing interface state density is formed on the light-receiving surface 12s of the light-receiving section 12. Therefore, the generation of electrons due to interface state density is further suppressed. This prevents the electrons due to interface state density from flowing into the light-receiving section 12 as dark currents.

When a hafnium oxide film is used as the film 22 having negative fixed charges, since the refractive index of the hafnium oxide film is about 2, it is possible not only to form a HAN structure by optimizing film thickness but also to obtain a reflection prevention effect. When a material having a high refractive index is used other than the hafnium oxide film, it is possible to obtain the reflection prevention effect by optimizing the film thickness of the material.

It is known that, when silicon oxide or silicon nitride, which is used in the solid-state imaging device in the past, is formed at low temperature, fixed charges in a film are positive. It is difficult to form the HAD structure using the negative fixed charges.

A solid-state imaging device (a first solid-state imaging device) according to a modification of the embodiment is explained with reference to a sectional view of a main part configuration in FIG. 3.

Figure 3:
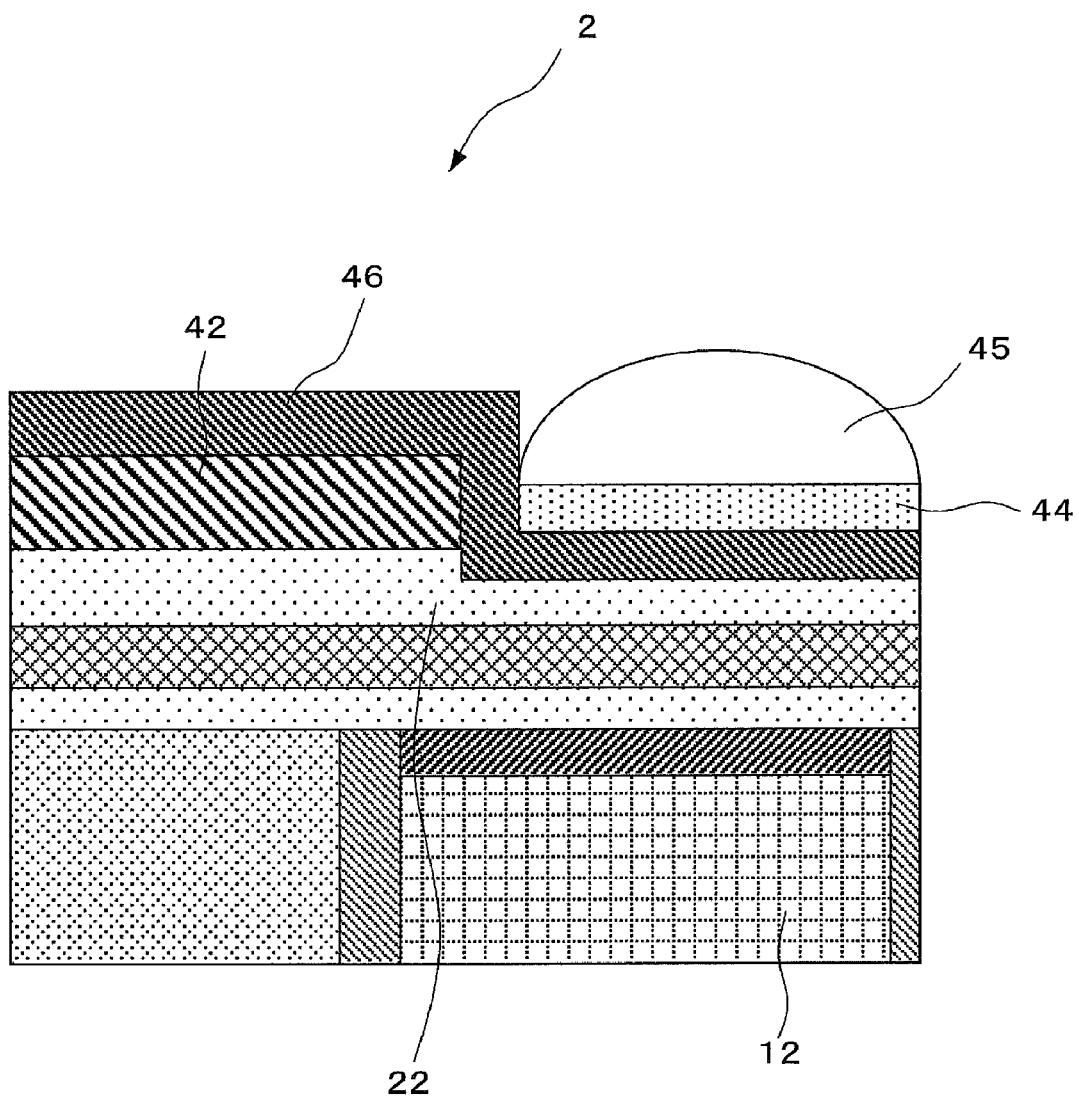
FIG. 3 is a sectional view of a main part configuration of a solid-state imaging device (a first solid-state imaging device) according to a modification of the first embodiment.

As shown in FIG. 3, when the reflection prevention effect on the light-receiving section 12 is insufficient only with the film 22 having negative fixed charges in the solid-state imaging device 1, in a solid-state imaging device 2, a reflection preventing film 46 is formed on the film 22 having negative fixed charges. The reflection preventing film 46 is formed by, for example, a silicon nitride film.

The insulating film 43 formed in the solid-state imaging device 1 is not formed.

Therefore, the color filter layer 44 and the condensing lens 45 are formed on the reflection preventing film 46.

It is possible to maximize the reflection prevention effect by additionally forming the silicon nitride film in this way. This configuration can be applied to a solid-state imaging device 3 explained below.

As explained above, since the reflection preventing film 46 is formed, reflection of light before the light is made incident on the light-receiving section 12 can be reduced. Therefore, an amount of incident light on the light-receiving section 12 can be increased. This makes it possible to improve the sensitivity of the solid-state imaging device 2.

A solid-state imaging device (a first solid-state imaging device) according to another modification of the embodiment is explained with reference to a sectional view of a main part configuration in FIG. 4.

Figure 4:
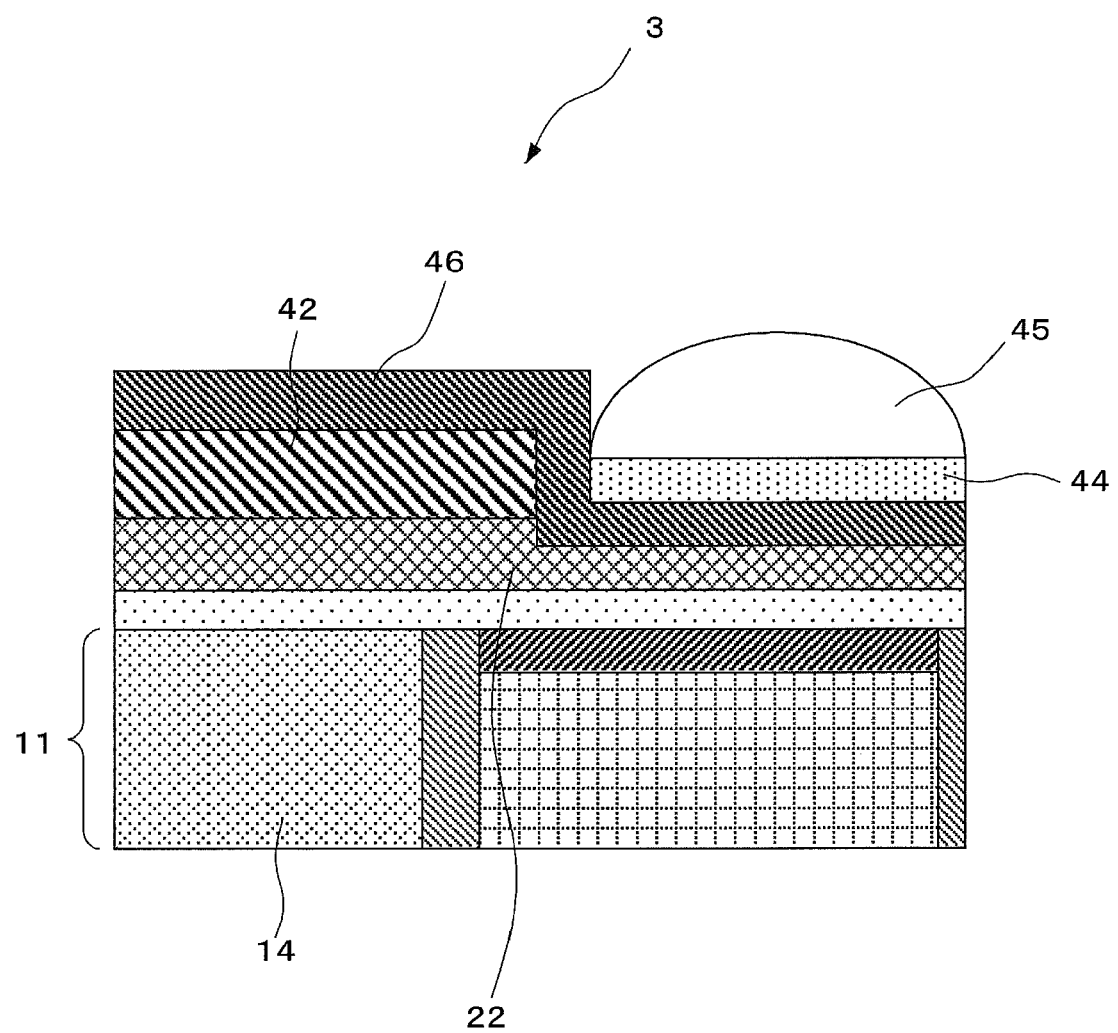
FIG. 4 is a sectional view of a main part configuration of a solid-state imaging device according to another modification of the first embodiment.

As shown in FIG. 4, in a solid-state imaging device 3, the insulating film 41 in the solid-state imaging device 1 is not formed. The light shielding film 42 is directly formed on the film 22 having negative fixed charges. The insulating film 43 is not formed and the reflection preventing film 46 is formed.

Since the light shielding film 42 is directly formed on the film 22 having negative fixed charges, the light shielding film 42 can be set closer to the surface of the semiconductor substrate 11. Therefore, a space between the light shielding film 42 and the semiconductor substrate 11 is narrowed. This makes it possible to reduce components of light obliquely made incident from an upper layer of a neighboring light-receiving section (photodiode), i.e., optical mixed color components.

Figure 5:
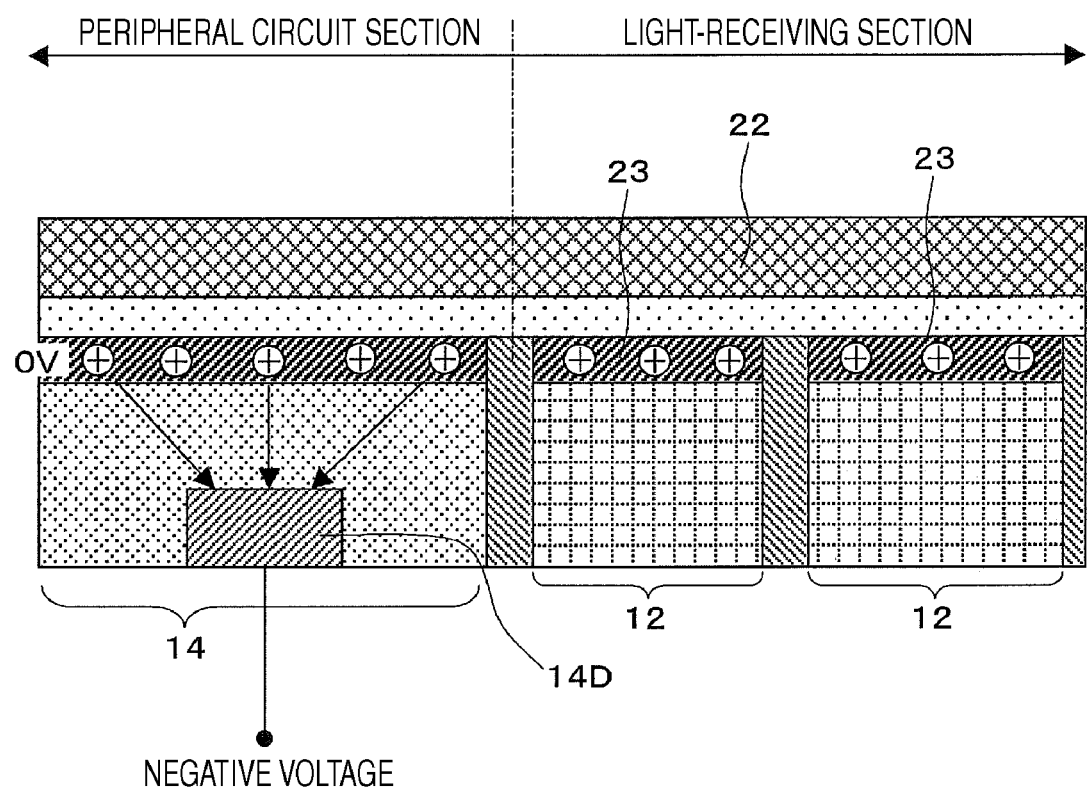
FIG. 5 is a sectional view of a main part configuration for explaining an action of negative fixed charges in the case in which a film having negative fixed charges is present near a peripheral circuit section.

When the film 22 having negative fixed charges is provided near the peripheral circuit section 14 as shown in FIG. 5, dark currents due to interface state density on the surfaces of the light-receiving sections 12 can be prevented by the hole accumulation layers 23 formed by the negative fixed charges of the film 22 having negative fixed charges.

However, a potential difference is caused between the light-receiving sections 12 side and an element 14D present on the surface side. An unexpected carrier flows into the element 14D on the surface side from the surfaces of the light-receiving sections 12 and causes a malfunction of the peripheral circuit section 14.

Configurations for preventing such a malfunction are explained in second and third embodiments of the present invention below.

A solid-state imaging device (a first solid-state imaging device) according to a second embodiment of the present invention is explained with reference to a sectional view of a main part configuration in FIG. 6.

Figure 6:
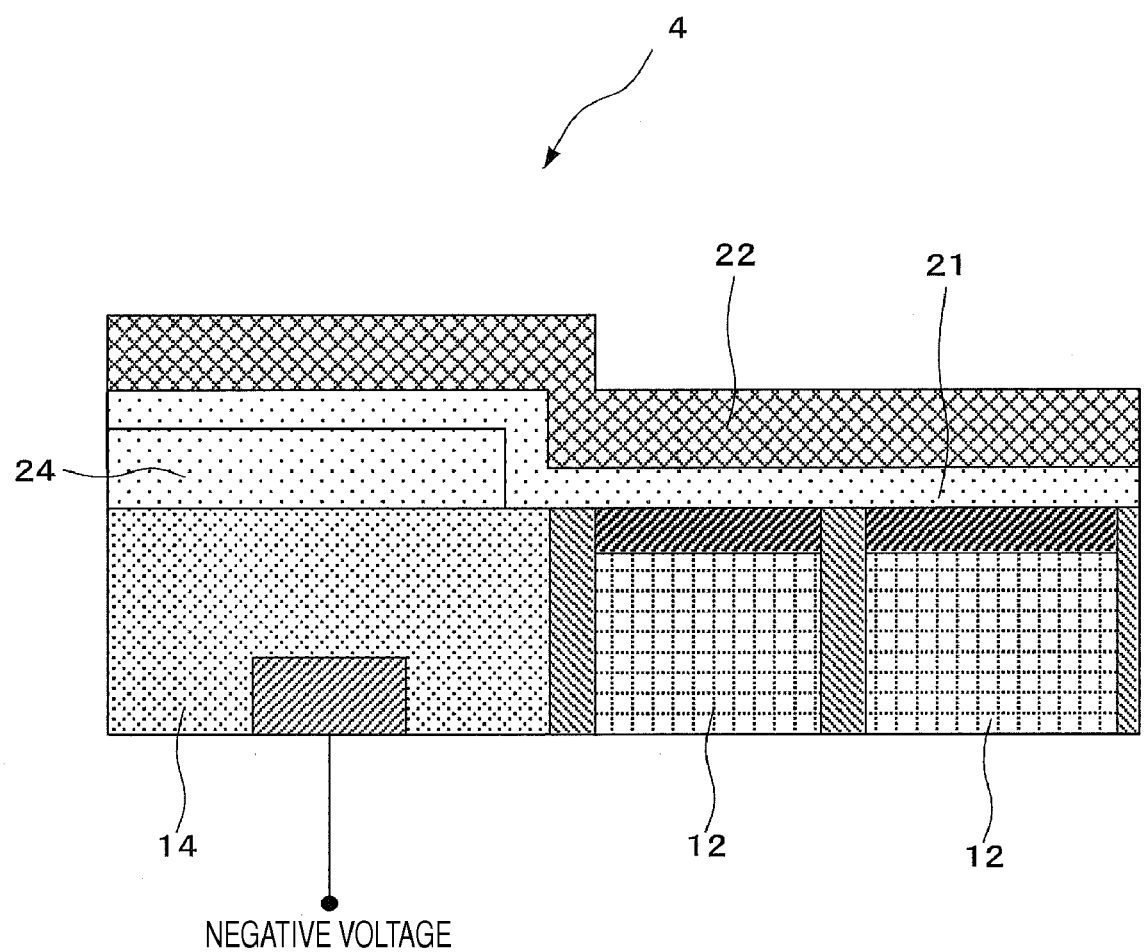
FIG. 6 is a sectional view of a main part configuration of a solid-state imaging device (a first solid-state imaging device) according to a second embodiment of the present invention.

In FIG. 6, a light shielding film that shields a part of a light-receiving section and a peripheral circuit section, a color filter layer that splits light made incident on the light-receiving section, a condensing lens that condenses the incident light on the light-receiving section, and the like are not shown.

As shown in FIG. 6, in a solid-state imaging device 4, an insulating film 24 is formed between the surface of the peripheral circuit section 14 and the film 22 having negative fixed charges such that a distance from the surface of the peripheral circuit section 14 to the film 22 is larger than a distance from the surfaces of the light-receiving sections 12 to the film 22 in the solid-state imaging device 1. When the film for reducing interface state density is formed by a silicon oxide film, the insulating film 24 may be obtained by forming the film 21 for reducing interface state density on the peripheral circuit section 14 thicker than that on the light-receiving sections 12.

In this way, the insulating film 24 is formed between the surface of the peripheral circuit section 14 and the film 22 having negative fixed charges such that the distance from the surface of the peripheral circuit section 14 to the film 22 is larger than the distance from the surfaces of the light-receiving sections 12 to the film 22. Therefore, the peripheral circuit section 14 is not affected by an electric field generated by the negative fixed charges in the film 22 having negative fixed charges.

Therefore, it is possible to prevent a malfunction of peripheral circuits due to the negative fixed charges.

A solid-state imaging device (a first solid-state imaging device) according to a third embodiment of the present invention is explained with reference to a sectional view of a main part configuration in FIG. 7.

Figure 7:
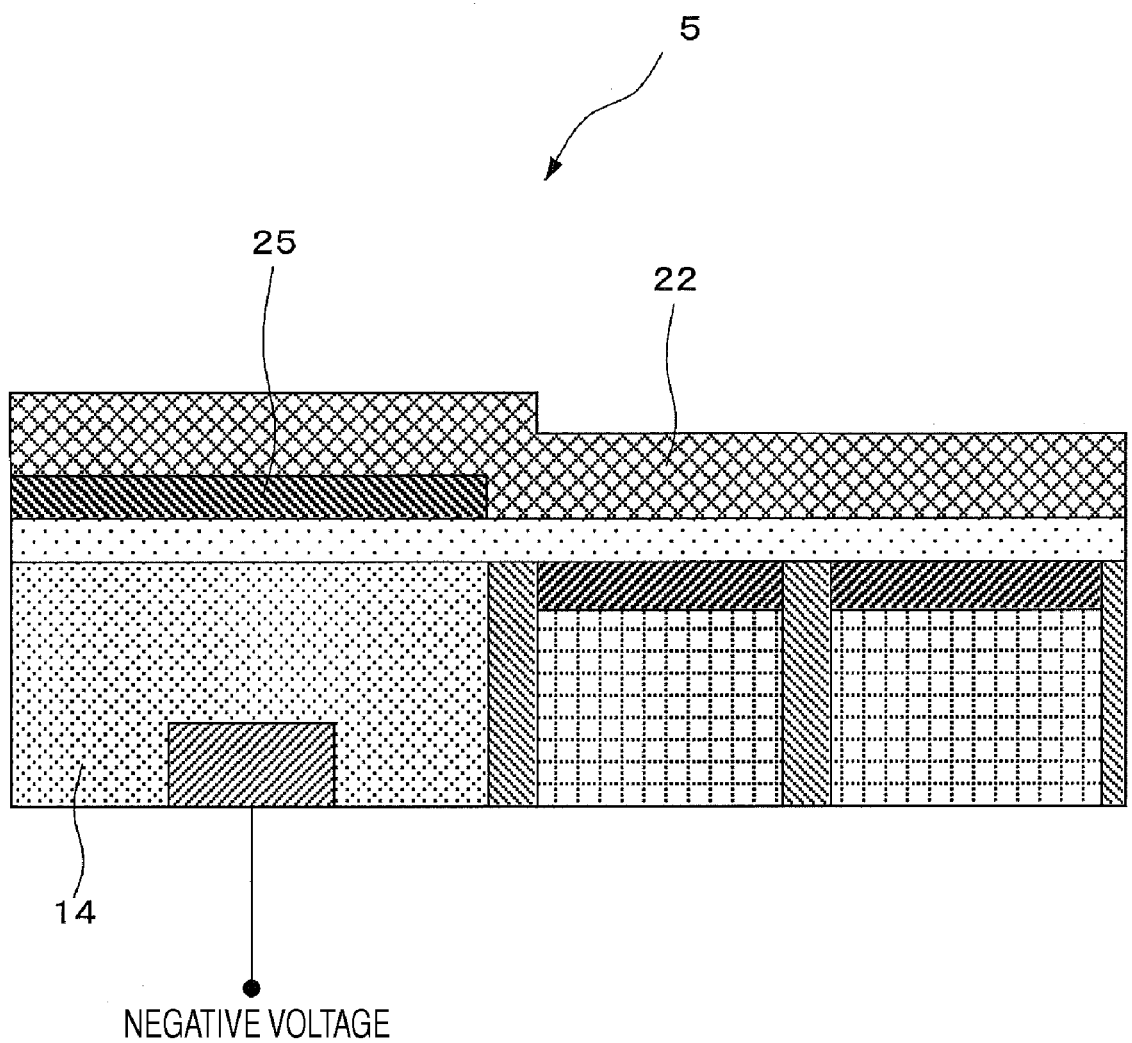
FIG. 7 is a sectional view of a main part configuration of a solid-state imaging device (a first solid-state imaging device) according to a third embodiment of the present invention.

In FIG. 7, a light shielding film that shields a part of a light-receiving section and a peripheral circuit section, a color filter layer that splits light made incident on the light-receiving section, a condensing lens that condenses the incident light on the light-receiving section, and the like are not shown.

As shown in FIG. 7, in a solid-state imaging device 5, a film 25 for separating a film having negative fixed charges and a light-receiving surface is formed between the peripheral circuit section 14 and the film 22 having negative fixed charges in the solid-state imaging device 1. The film 25 desirably has positive fixed charges to cancel the influence of the negative fixed charges. For example, silicon nitride is preferably used for the film 25.

In this way, the film 25 having positive fixed charges is formed between the peripheral circuit section 14 and the film 22 having negative fixed charges. Therefore, the negative fixed charges of the film 22 having negative fixed charges are reduced by the positive fixed charges in the film 25. This prevents the peripheral circuit section 14 from being affected by the electric field of the negative fixed charges in the film 22 having negative fixed charges.

Therefore, it is possible to prevent a malfunction of the peripheral circuit section 14 due to the negative fixed charges.

The configuration in which the film 25 having positive fixed charges is formed between the peripheral circuit section 14 and the film 22 having negative fixed charges as described above can be applied to the solid-state imaging devices 1, 2, 3, and 4 as well. Effects same as those in the solid-state imaging device 5 can be obtained.

In the configuration on the film 22 having negative fixed charges in the solid-state imaging devices 4 and 5, a light shielding film that shields a part of the light-receiving sections 12 and the peripheral circuit section 14, a color filter layer that splits light made incident on at least the light-receiving sections 12, a condensing lens that condenses the incident light on the light-receiving sections 12, and the like are provided. As an example, as the configuration, the configuration of any one of the solid-state imaging devices 1, 2, and 3 can also be applied.

Figure 10:
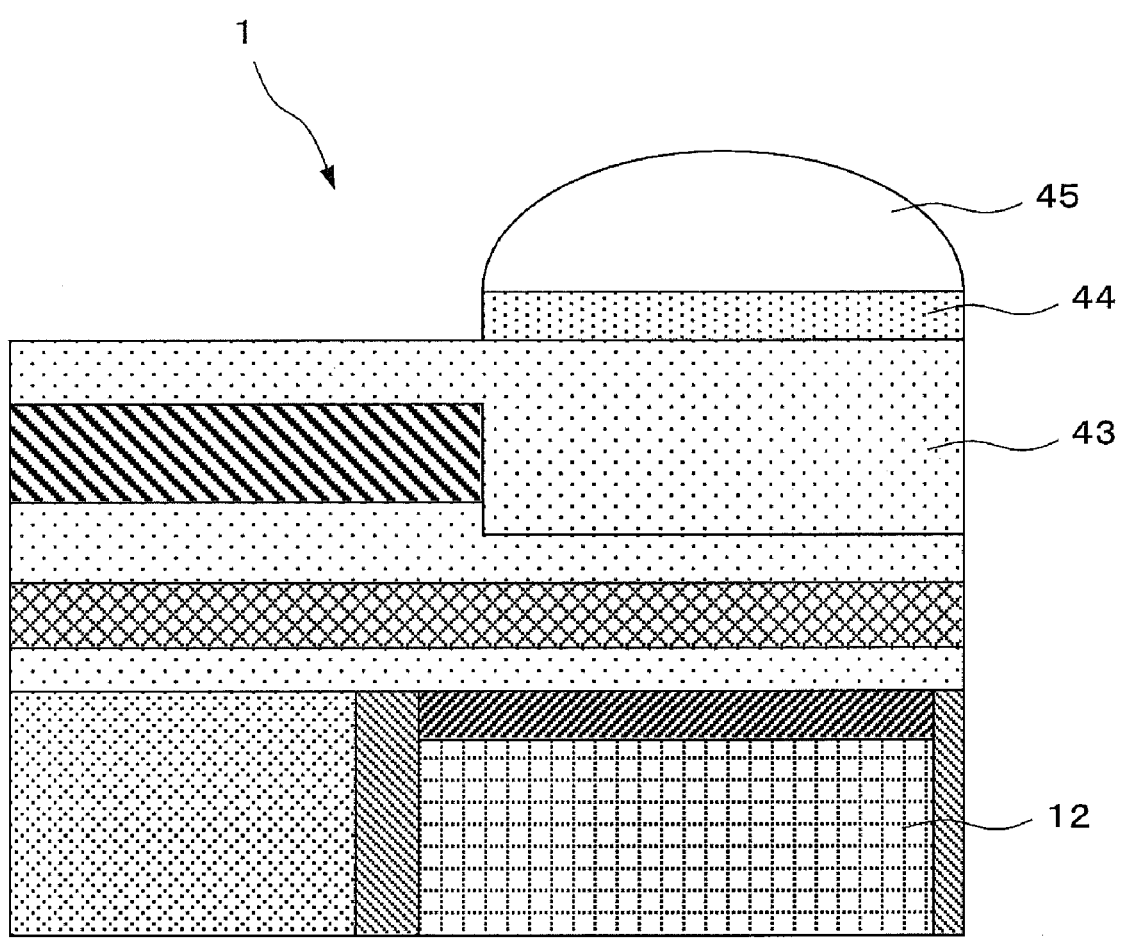
FIG. 10 is a sectional view of the manufacturing process of the manufacturing method (the first manufacturing method) for a solid-state imaging device according to the first embodiment.

A manufacturing method (a first manufacturing method) for a solid-state imaging device according to the first embodiment is explained with reference to sectional views of a manufacturing process showing a main part in FIG. 8 to FIG. 10. In FIG. 8 to FIG. 10, as an example, a manufacturing process for the solid-state imaging device 1 is shown.

As shown in (1) in FIG. 8, the light-receiving section 12 that photoelectrically converts incident light, the pixel separation areas 13 that separate the light-receiving section 12, the peripheral circuit section 14 in which peripheral circuits (not specifically shown) are formed with respect to the light-receiving section 12 via the pixel separation area 13, and the like are formed in the semiconductor substrate (or the semiconductor layer) 11. An existing manufacturing method is used for the manufacturing method.

As shown in (2) in FIG. 8, the film 21 for reducing interface state density is formed on the light-receiving surface 12s of the light-receiving section 12, actually, on the semiconductor substrate 11. The film 21 for reducing interface state density is formed by, for example, a silicon oxide ($SiO_2$) film.

The film 22 having negative fixed charges is formed on the film 21 for reducing interface state density. Consequently, the hole accumulation layer 23 is formed on the light-receiving surface side of the light-receiving section 12.

Therefore, at least on the light-receiving section 12, the film 21 for reducing interface state density needs to be formed, by the film 22 having negative fixed charges, in thickness enough for forming the hole accumulation layer 23 on the light-receiving surface 12s side of the light-receiving section 12. The film thickness is, for example, equal to or larger than one atom layer and equal to or smaller than 100 nm.

The film 22 having negative fixed charges is formed by, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The films of the kinds described above are actually used in a gate insulating film and the like of an insulated-gate field-effect transistor. Therefore, since a film forming method is established, it is possible to easily form the films. As the film forming method, for example, the chemical vapor deposition method, the sputtering method, and the atomic layer deposition method can be used. The atomic layer deposition method is suitably used because an $SiO_2$ layer for reducing interface state density can be simultaneously formed by about 1 nm during the film formation.

As materials other than the above, lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), and the like can be used. The film 22 having negative fixed charges can be formed by a hafnium nitride film, an aluminum nitride film, a hafnium oxide nitride film, or an aluminum oxide nitride film as well. These films also can be formed, for example, by the chemical vapor deposition, the sputtering method, and the atomic layer deposition method.

Silicon (Si) or nitrogen (N) may be added to the film 22 having negative fixed charges as long as insulating properties thereof are not spoiled. The density of silicon or nitrogen is appropriately determined in a range in which the insulating properties of the film are not spoiled. Such addition of silicon (Si) or nitrogen (N) makes it possible to improve heat resistance of the film and an ability of blocking ion implantation in a process.

When the film 22 having negative fixed charges is formed by a hafnium oxide ($HfO_2$) film, since the refractive index of the hafnium oxide film ($HfO_2$) is about 2, it is possible to efficiently obtain a reflection prevention effect by adjusting the film thickness. Naturally, when other kinds of films are used, it is possible to obtain the reflection prevention effect by optimizing film thickness according to a refractive index.

The insulating film 41 is formed on the film 22 having negative fixed charges. The light shielding film 42 is formed on the insulating film 41. The insulating film 41 is formed by, for example, a silicon oxide film. The light shielding film 42 is formed by, for example, a metal film having light shielding properties.

The light shielding film 42 is formed on the film 22 having negative fixed charges via the insulating film 41 in this way. This makes it possible to prevent a reaction of the film 22 having negative fixed charges formed by a hafnium oxide film or the like and the metal of the light shielding film 42.

When the light shielding film 42 is etched, since the insulating film 41 functions as an etching stopper, it is possible to prevent etching damage to the film 22 having negative fixed charges.

As shown in (3) in FIG. 9, a resist mask (not shown) is formed on the light shielding film 42 above a part of the light-receiving section 12 and the peripheral circuit section 14 by the resist application and the lithography technique. The light shielding film 42 is etched by using the resist mask to leave the light shielding film 42 on the insulating film 41 above a part of the light-receiving section 12 and the peripheral circuit section 14.

An area in which light does not enter is formed in the light-receiving section 12 by the light shielding film 42. A black level in an image is determined by an output of the light receiving section 12.

Since light is prevented from entering the peripheral circuit section 14, fluctuation in characteristics caused by the light entering the peripheral circuit section 14 is suppressed.

As shown in (4) in FIG. 9, the insulating film 43 that reduces a step formed by the light shielding film 42 is formed on the insulating film 41. The insulating film 43 is preferably planarized on the surface thereof and is formed by, for example, a coated insulating film.

As shown in FIG. 10, the color filter layer 44 is formed on the insulating film 43 above the light-receiving section 12 by an existing manufacturing technique. The condensing lens 45 is formed on the color filer layer 44. A light transmissive insulating film (not shown) may be formed between the color filter layer 44 and the condensing lens 45 in order to prevent machining damage to the color filter layer 44 in lens machining.

The solid-state imaging device 1 is formed in this way.

In the manufacturing method (the first manufacturing method) for a solid-state imaging device according to the first embodiment, the film 22 having negative fixed charges is formed on the film 21 for reducing interface state density. Therefore, the hole accumulation layer 23 is sufficiently formed in the interface on the light-receiving surface side of the light-receiving section 12 by an electric field due to the negative fixed charges in the film 22 having negative fixed charges.

Therefore, charges (electrons) generated from the interface are suppressed. Even if charges (electrons) are generated, since the charges (electrons) flow in the hole accumulation layer 23 in which a large number of holes are present without flowing into a charge accumulation portion forming a well of potential in the light-receiving section 12, the charges (the electrons) can be eliminated.

Therefore, it is possible to prevent dark currents generated by the charges due to the interface from being detected by the light-receiving section and suppress the dark currents due to the interface state density.

Moreover, since the film 21 for reducing interface state density is formed on the light-receiving surface of the light-receiving section 12, the generation of electrons due to the interface state density is further suppressed. Therefore, the electrons due to the interface state density are prevented from flowing into the light-receiving section 12 as dark currents. Since the film 22 having negative fixed charges is used, it is possible to form an HAD structure without applying ion implantation and annealing thereto.

Figure 13:
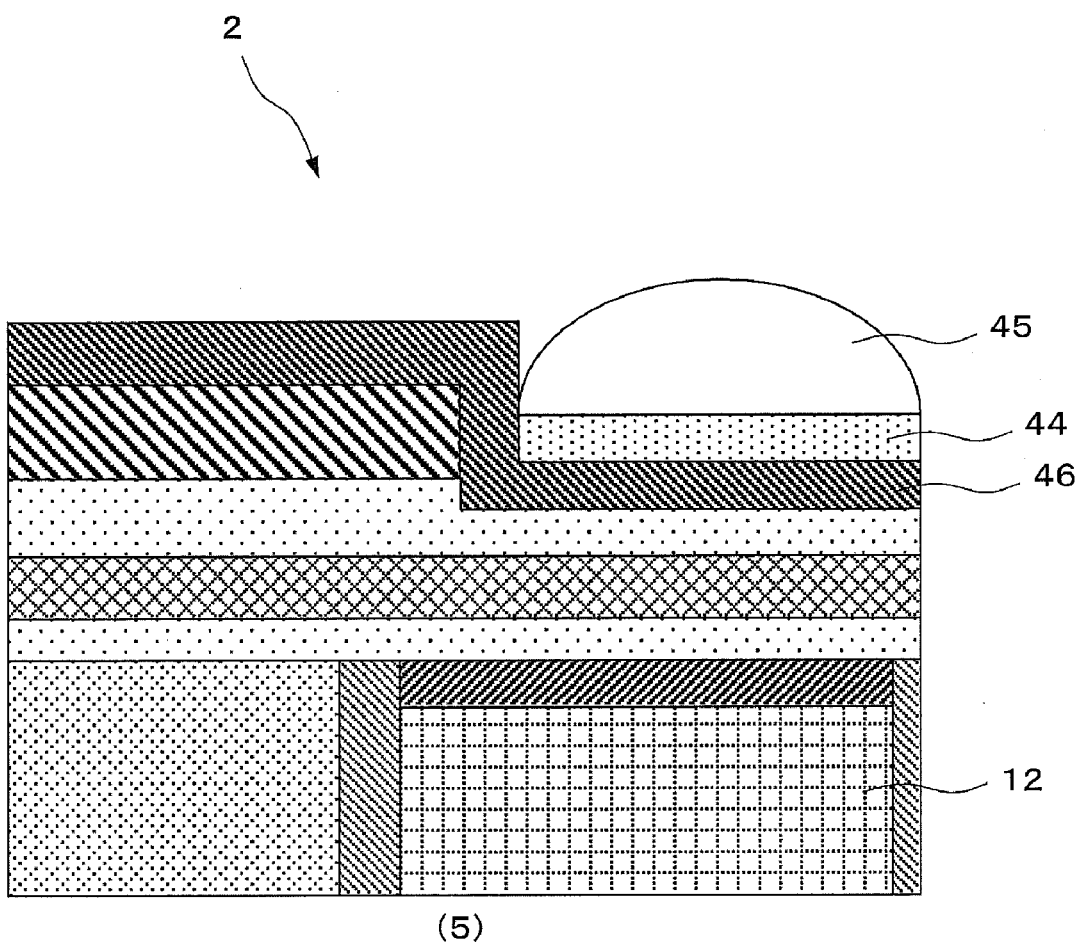
FIG. 13 is a sectional view of the manufacturing process of the manufacturing method (the first manufacturing method) for a solid-state imaging device according to the second embodiment.

A manufacturing method (a first manufacturing method) for a solid-state imaging device according to the second embodiment is explained with reference to sectional views of a manufacturing process showing a main part in FIG. 11 to FIG. 13. In FIG. 11 to FIG. 13, as an example, a manufacturing process for the solid-state imaging device 2 is shown.

As shown in (1) in FIG. 11, the light-receiving section 12 that photoelectrically converts incident light, the pixel separation areas 13 that separate the light-receiving section 12, the peripheral circuit section 14 in which peripheral circuits (not specifically shown) are formed with respect to the light-receiving section 12 via the pixel separation area 13, and the like are formed in the semiconductor substrate (or the semiconductor layer) 11. An existing manufacturing method is used for the manufacturing method.

As shown in (2) in FIG. 11, the film 21 for reducing interface state density is formed on the light-receiving surface 12s of the light-receiving section 12, actually, on the semiconductor substrate 11. The film 21 for reducing interface state density is formed by, for example, a silicon oxide ($SiO_2$) film. The film 22 having negative fixed charges is formed on the film 21 for reducing interface state density. Consequently, the hole accumulation layer 23 is formed on the light-receiving surface side of the light-receiving section 12.

Therefore, at least on the light-receiving section 12, the film 21 for reducing interface state density needs to be formed, by the film 22 having negative fixed charges, in thickness enough for forming the hole accumulation layer 23 on the light-receiving surface 12s side of the light-receiving section 12. The film thickness is, for example, equal to or larger than one atom layer and equal to or smaller than 100 nm.

The film 22 having negative fixed charges is formed by, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film.

The films of the kinds described above are actually used in a gate insulating film and the like of an insulated-gate field-effect transistor. Therefore, since a film forming method is established, it is possible to easily form the films. As the film forming method, for example, the chemical vapor deposition method, the sputtering method, and the atomic layer deposition method can be used.

As materials other than the above, lanthanum oxide ($La_2O_3$), praseodymiumoxide ($Pr_2O_3$), ceriumoxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), and the like can be used. The film 22 having negative fixed charges can be formed by a hafnium nitride film, an aluminum nitride film, a hafnium oxide nitride film, or an aluminum oxide nitride film as well. These films can also be formed by, for example, the chemical vapor deposition method, the sputtering method, and the atomic layer deposition method. The atomic layer deposition method is suitably used because an $SiO_2$ layer for reducing interface state density can be simultaneously formed by about 1 nm during the film formation.

Silicon (Si) or nitrogen (N) may be added to the film 22 having negative fixed charges as long as insulating properties thereof are not spoiled. The density of silicon or nitrogen is appropriately determined in a range in which the insulating properties of the film are not spoiled. Such addition of silicon (Si) or nitrogen (N) makes it possible to improve heat resistance of the film and an ability of blocking ion implantation in a process.

When the film 22 having negative fixed charges is formed by a hafnium oxide ($HfO_2$) film, since the refractive index of the hafnium oxide film ($HfO_2$) is about 2, it is possible to efficiently obtain a reflection prevention effect by adjusting the film thickness. Naturally, when other kinds of films are used, it is possible to obtain the reflection prevention effect by optimizing film thickness according to a refractive index.

The insulating film 41 is formed on the film 22 having negative fixed charges. The light shielding film 42 is formed on the insulating film 41. The insulating film 41 is formed by, for example, a silicon oxide film. The light shielding film 42 is formed by, for example, a metal film having light shielding properties.

The light shielding film 42 is formed on the film 22 having negative fixed charges via the insulating film 41 in this way. This makes it possible to prevent a reaction of the film 22 having negative fixed charges formed by a hafnium oxide film or the like and the metal of the light shielding film 42.

When the light shielding film 42 is etched, since the insulating film 41 functions as an etching stopper, it is possible to prevent etching damage to the film 22 having negative fixed charges.

As shown in (3) in FIG. 12, a resist mask (not shown) is formed on the light shielding film 42 above a part of the light-receiving section 12 and the peripheral circuit section 14 by the resist application and the lithography technique. The light shielding film 42 is etched by using the resist mask to leave the light shielding film 42 on the insulating film 41 above a part of the light-receiving section 12 and the peripheral circuit section 14. An area in which light does not enter is formed in the light-receiving section 12 by the light shielding film 42. A black level in an image is determined by an output of the light receiving section 12. Since light is prevented from entering the peripheral circuit section 14, fluctuation in characteristics caused by the light entering the peripheral circuit section 14 is suppressed.

As shown in (4) in FIG. 12, the reflection preventing film 46 is formed on the insulating film 41 to cover the light shielding film 42. The reflection preventing film 46 is formed by, for example, a silicon nitride film, the refractive index of which is about 2.

As shown in FIG. 13, the color filter layer 44 is formed on the reflection preventing film 46 above the light-receiving section 12 by an existing manufacturing technique. The condensing lens 45 is formed on the color filer layer 44. A light transmissive insulating film (not shown) may be formed between the color filter layer 44 and the condensing lens 45 in order to prevent machining damage to the color filter layer 44 in lens machining.

The solid-state imaging device 2 is formed in this way.

In the manufacturing method (the first manufacturing method) for a solid-state imaging device according to the second embodiment, effects same as those in the first embodiment are obtained.

Since the reflection preventing film 46 is formed, reflection of light before the light is made incident on the light-receiving section 12 can be reduced. Therefore, an amount of incident light on the light-receiving section 12 can be increased. This makes it possible to improve the sensitivity of the solid-state imaging device 2.

Figure 16:
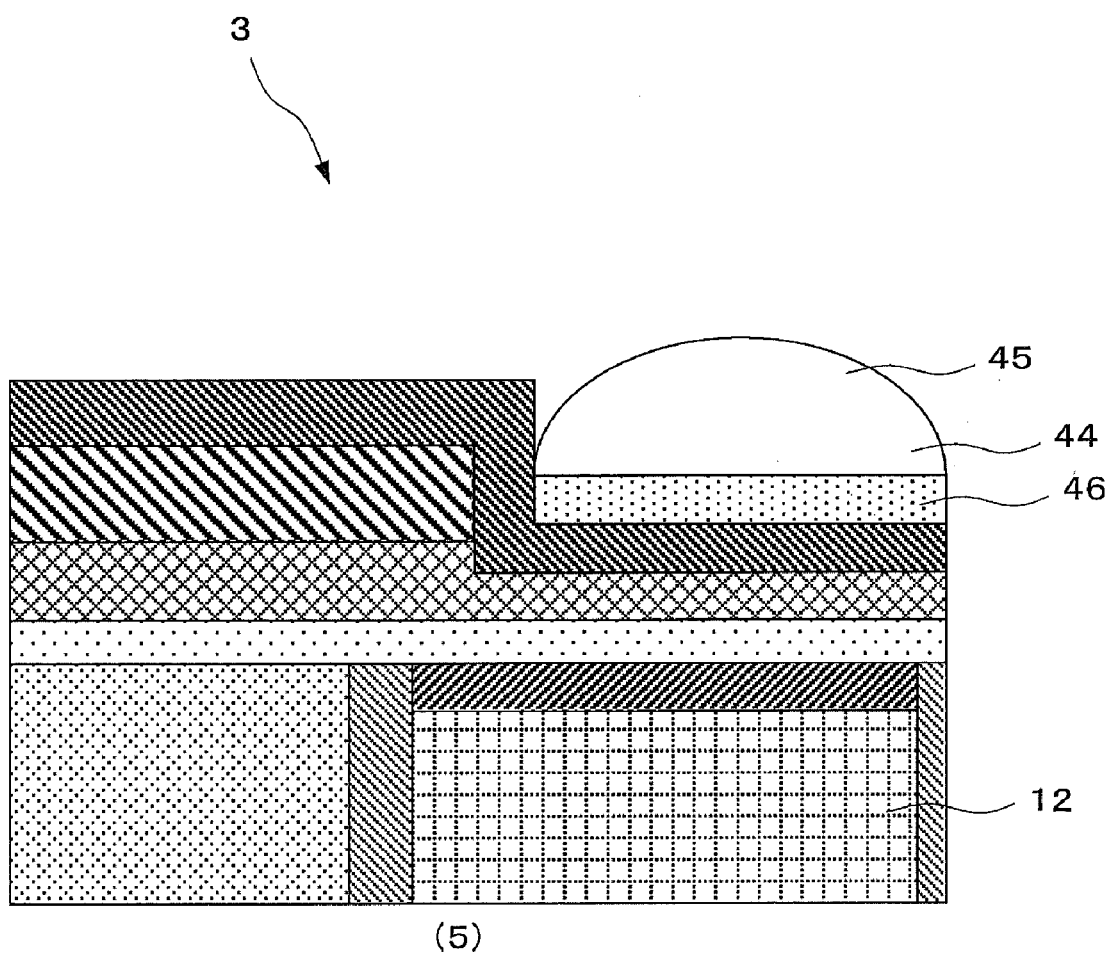
FIG. 16 is a sectional view of the manufacturing process of the manufacturing method (the first manufacturing method) for a solid-state imaging device according to the third embodiment.

A manufacturing method (a first manufacturing method) for a solid-state imaging device according to the third embodiment is explained with reference to sectional views of a manufacturing process showing a main part in FIG. 14 to FIG. 16. In FIG. 14 to FIG. 16, as an example, a manufacturing method for the solid-state imaging device 3 is shown.

As shown in (1) in FIG. 14, the light-receiving section 12 that photoelectrically converts incident light, the pixel separation areas 13 that separate the light-receiving section 12, the peripheral circuit section 14 in which peripheral circuits (not specifically shown) are formed with respect to the light-receiving section 12 via the pixel separation area 13, and the like are formed in the semiconductor substrate (or the semiconductor layer) 11. An existing manufacturing method is used for the manufacturing method.

As shown in (2) in FIG. 14, the film 21 for reducing interface state density is formed on the light-receiving surface 12s of the light-receiving section 12, actually, on the semiconductor substrate 11. The film 21 for reducing interface state density is formed by, for example, a silicon oxide ($SiO_2$) film.

The film 22 having negative fixed charges is formed on the film 21 for reducing interface state density. Consequently, the hole accumulation layer 23 is formed on the light-receiving surface side of the light-receiving section 12.

Therefore, at least on the light-receiving section 12, the film 21 for reducing interface state density needs to be formed, by the film 22 having negative fixed charges, in thickness enough for forming the hole accumulation layer 23 on the light-receiving surface 12s side of the light-receiving section 12. The film thickness is, for example, equal to or larger than one atom layer and equal to or smaller than 100 nm.

The film 22 having negative fixed charges is formed by, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The films of the kinds described above are actually used in a gate insulating film and the like of an insulated-gate field-effect transistor. Therefore, since a film forming method is established, it is possible to easily form the films. As the film forming method, for example, the chemical vapor deposition method, the sputtering method, and the atomic layer deposition method can be used. The atomic layer deposition method is suitably used because an $SiO_2$ layer for reducing interface state density can be simultaneously formed by about 1 nm during the film formation.

As materials other than the above, lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), and the like can be used. The film 22 having negative fixed charges can be formed by a hafnium nitride film, an aluminum nitride film, a hafnium oxide nitride film, or an aluminum oxide nitride film as well. These films can also be formed by, for example, the chemical vapor deposition method, the sputtering method, and the atomic layer deposition method.

Silicon (Si) or nitrogen (N) may be added to the film 22 having negative fixed charges as long as insulating properties thereof are not spoiled. The density of silicon or nitrogen is appropriately determined in a range in which the insulating properties of the film are not spoiled. Such addition of silicon (Si) or nitrogen (N) makes it possible to improve heat resistance of the film and an ability of blocking ion implantation in a process.

When the film 22 having negative fixed charges is formed by a hafnium oxide ($HfO_2$) film, it is possible to efficiently obtain a reflection prevention effect by adjusting the film thickness of the hafnium oxide film ($HfO_2$). Naturally, when other kinds of films are used, it is possible to obtain the reflection prevention effect by optimizing film thickness according to a refractive index.

The light shielding film 42 is formed on the film 22 having negative fixed charges. The light shielding film 42 is formed by, for example, a metal film having light shielding properties.

The light shielding film 42 is directly formed on the film 22 having negative fixed charges in this way. Therefore, since the light shielding film 42 can be set closer to the surface of the semiconductor substrate 11, a space between the light shielding film 42 and the semiconductor substrate 11 is narrowed. This makes it possible to reduce components of light obliquely made incident from an upper layer of a neighboring light-receiving section (photodiode), i.e., optical mixed color components.

As shown in (3) in FIG. 15, a resist mask (not shown) is formed on the light shielding film 42 above a part of the light-receiving section 12 and the peripheral circuit section 14 by the resist application and the lithography technique. The light shielding film 42 is etched by using the resist mask to leave the light shielding film 42 on the film 22 having negative fixed charges above a part of the light-receiving section 12 and the peripheral circuit section 14.

An area in which light does not enter is formed in the light-receiving section 12 by the light shielding film 42. A black level in an image is determined by an output of the light receiving section 12.

Since light is prevented from entering the peripheral circuit section 14, fluctuation in characteristics caused by the light entering the peripheral circuit section 14 is suppressed.

As shown in (4) in FIG. 15, the reflection preventing film 46 is formed on the film 22 having negative fixed charges to cover the light shielding film 42. The reflection preventing film 46 is formed by, for example, a silicon nitride film, the refractive index of which is about 2.

As shown in FIG. 16, the color filter layer 44 is formed on the reflection preventing film 46 above the light-receiving section 12 by an existing manufacturing technique.

The condensing lens 45 is formed on the color filer layer 44. A light transmissive insulating film (not shown) may be formed between the color filter layer 44 and the condensing lens 45 in order to prevent machining damage to the color filter layer 44 in lens machining.

The solid-state imaging device 3 is formed in this way.

In the manufacturing method (the first manufacturing method) for a solid-state imaging device according to the third embodiment, effects same as those in the first embodiment are obtained. Since the light shielding film 42 is directly formed on the film 22 having negative fixed charges, the light shielding film 42 can be set closer to the surface of the semiconductor substrate 11. Therefore, a space between the light shielding film 42 and the semiconductor substrate 11 is narrowed. This makes it possible to reduce components of light obliquely made incident from an upper layer of a neighboring light-receiving section (photodiode), i.e., optical mixed color components.

Since the reflection preventing film 46 is formed, when the reflection prevention effect is insufficient only with the film 22 having negative fixed charges, it is possible to maximize the reflection prevention effect.

Figure 19:
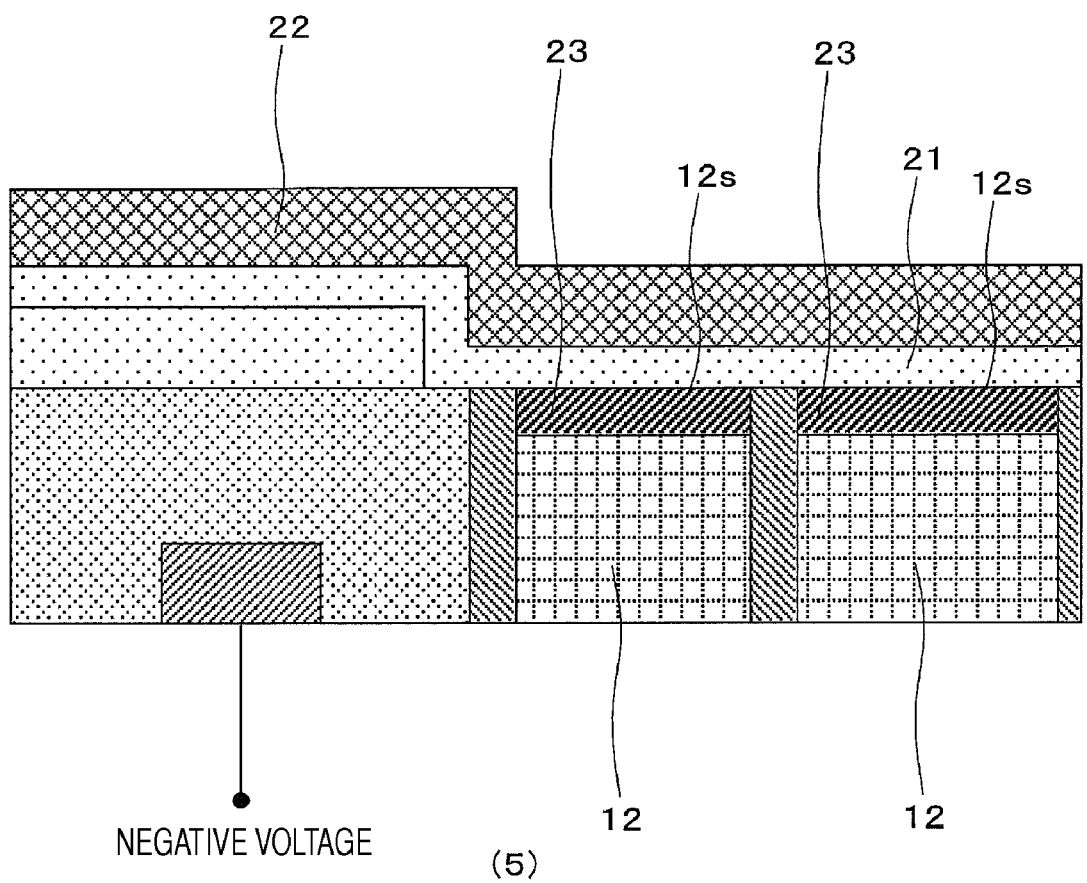
FIG. 19 is a sectional view of the manufacturing process of the manufacturing method (the first manufacturing method) for a solid-state imaging device according to the fourth embodiment.

A manufacturing method (a first manufacturing method) according to a fourth embodiment of the present invention is explained with reference to sectional views of a manufacturing process showing a main part in FIG. 17 to FIG. 19. In FIG. 17 to FIG. 19, as an example, a manufacturing process for the solid-state imaging device 4 is shown.

As shown in (1) in FIG. 17, the light-receiving sections 12 that photoelectrically convert incident light, the pixel separation areas 13 that separate the light-receiving sections 12, the peripheral circuit section 14 in which peripheral circuits (e.g., a circuit 14C) are formed with respect to the light-receiving section 12 via the pixel separation area 13, and the like are formed in the semiconductor substrate (or the semiconductor layer) 11. An existing manufacturing method is used for the manufacturing method.

An insulating film 26 having permeability to the incident light is formed. The insulating film 26 is formed by, for example, a silicon oxide film.

As shown in (2) in FIG. 17, a resist mask 51 is formed on the insulating film 26 above the peripheral circuit section 14 by the resist application and the lithography technique.

As shown in (3) in FIG. 18, the insulating film 26 is etched by using the resist mask 51 (see (2) in FIG. 17) to leave the insulating film 26 on the peripheral circuit section 14.

Thereafter, the resist mask 51 is removed.

As shown in (4) in FIG. 18, the film 21 for reducing interface state density that covers the insulating film 26 is formed on the light-receiving surfaces 12s of the light-receiving sections 12, actually, on the semiconductor substrate 11. The film 21 for reducing interface state density is formed by, for example, a silicon oxide ($SiO_2$) film.

As shown in FIG. 19, the film 22 having negative fixed charges is formed on the film 21 for reducing interface state density. Consequently, the hole accumulation layers 23 are formed on the light-receiving surfaces side of the light-receiving sections 12.

Therefore, at least on the light-receiving sections 12, the film 21 for reducing interface state density needs to be formed, by the film 22 having negative fixed charges, in thickness enough for forming the hole accumulation layers 23 on the light-receiving surfaces 12s side of the light-receiving sections 12. The film thickness is, for example, equal to or larger than one atom layer and equal to or smaller than 100 nm.

The film 22 having negative fixed charges is formed by, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The films of the kinds described above are actually used in a gate insulating film and the like of an insulated-gate field-effect transistor. Therefore, since a film forming method is established, it is possible to easily form the films. As the film forming method, for example, the chemical vapor deposition method, the sputtering method, and the atomic layer deposition method can be used. The atomic layer deposition method is suitably used because a silicon oxide ($SiO_2$) layer for reducing interface state density can be simultaneously formed by about 1 nm during the film formation.

As materials other than the above, lanthanum oxide ($La_2O_3$), praseodymiumoxide ($Pr_2O_3$), ceriumoxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosiumoxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), and the like can be used. The film 22 having negative fixed charges can be formed by a hafnium nitride film, an aluminum nitride film, a hafnium oxide nitride film, or an aluminum oxide nitride film as well. These films can also be formed by, for example, the chemical vapor deposition method, the sputtering method, and the atomic layer deposition method.

Silicon (Si) or nitrogen (N) may be added to the film 22 having negative fixed charges as long as insulating properties thereof are not spoiled. The density of silicon or nitrogen is appropriately determined in a range in which the insulating properties of the film are not spoiled. Such addition of silicon (Si) or nitrogen (N) makes it possible to improve heat resistance of the film and an ability of blocking ion implantation in a process.

When the film 22 having negative fixed charges is formed by a hafnium oxide ($HfO_2$) film, since the refractive index of the hafnium oxide film ($HfO_2$) is about 2, it is possible to efficiently obtain a reflection prevention effect by adjusting the film thickness. Naturally, when other kinds of films are used, it is possible to obtain the reflection prevention effect by optimizing film thickness according to a refractive index.

In the configuration on the film 22 having negative fixed charges in the solid-state imaging device 4, a light shielding film that shields a part of the light-receiving sections 12 and the peripheral circuit section 14, a color filter layer that splits light made incident on at least the light-receiving sections 12, a condensing lens that condenses the incident light on the light-receiving sections 12, and the like are provided. As an example, as the configuration, the configuration of any one of the solid-state imaging devices 1, 2, and 3 can also be applied.

In the manufacturing method (the first manufacturing method) for a solid-state imaging device according to the fourth embodiment, the film 22 having negative fixed charges is formed on the film 21 for reducing interface state density. Therefore, the hole accumulation layers 23 are sufficiently formed in the interfaces on the light-receiving surfaces side of the light-receiving sections 12 by an electric field due to the negative fixed charges in the film 22 having negative fixed charges.

Therefore, charges (electrons) generated from the interface can be suppressed. Even if charges (electrons) are generated, since the charges (electrons) flow in the hole accumulation layers 23 in which a large number of holes are present without flowing into charge accumulation portions forming wells of potential in the light-receiving sections 12, the charges (the electrons) can be eliminated.

Therefore, it is possible to prevent dark currents generated by the charges due to the interface from being detected by the light-receiving sections and suppress the dark currents due to the interface state density. Further, since the film 21 for reducing interface state density is formed on the light-receiving surfaces of the light-receiving sections 12, the generation of electrons due to the interface state density is further suppressed. Therefore, the electrons due to the interface state density are prevented from flowing into the light-receiving sections 12 as dark currents. Since the film 22 having negative fixed charges is used, it is possible to form an HAD structure without applying ion implantation and annealing thereto.

Moreover, since the insulating film 26 is formed on the peripheral circuit section 14, a distance to the film 22 having negative fixed charges on the peripheral circuit section 14 is longer than a distance to the film 22 having negative fixed chares on the light-receiving sections 12. Therefore, a negative electric field applied to the peripheral circuit section 14 from the film 22 having negative fixed charges is relaxed. In other words, since the influence of the film 22 having negative fixed charges on the peripheral circuit section is reduced, a malfunction of the peripheral circuit section due to the negative electric field by the film 22 having negative fixed charges is prevented.

A manufacturing method (a first manufacturing method) for a solid-state imaging device according to a fifth embodiment of the present invention is explained with reference to sectional views of a manufacturing process showing a main part in FIG. 20 and FIG. 21. In FIG. 20 and FIG. 21, as an example, a manufacturing process for the solid-state imaging device 4 is shown.

As shown in (1) in FIG. 20, the light-receiving sections that photoelectrically convert incident light, the pixel separation areas 13 that separate the light-receiving sections 12, the peripheral circuit section 14 in which peripheral circuits (e.g., a circuit 14C) are formed with respect to the light-receiving section 12 via the pixel separation area 13, and the like are formed in the semiconductor substrate (or the semiconductor layer) 11. An existing manufacturing method is used for the manufacturing method.

The film 21 for reducing interface state density that has permeability to the incident light is formed. The film 21 for reducing interface state density is formed by, for example, a silicon oxide film.

Moreover, the film 25 for separating a film having negative fixed charges from a light-receiving surface is formed on the film 21 for reducing interface state density. The film 25 desirably has positive fixed charges to cancel the influence of the negative fixed charges. Silicon nitride is preferably used for the film 25. The film 25 is hereinafter referred to as film having positive fixed charges.

At least on the light-receiving sections 12, the film 21 for reducing interface state density needs to be formed, by the film 22 having negative fixed charges formed later, in thickness enough for forming the hole accumulation layers 23, described later, on the light-receiving surfaces 12s side of the light-receiving sections 12. The film thickness is, for example, equal to or larger than one atom layer and equal to or smaller than 100 nm.

As shown in (2) in FIG. 20, a resist mask 52 is formed on the film 25 having positive fixed charges above the peripheral circuit section 14 by the resist application and the lithography technique.

As shown in (3) in FIG. 21, the film 25 having positive fixed charges is etched by using the resist mask 52 (see (2) in FIG. 20) to leave the film 25 having positive fixed charges on the peripheral circuit section 14. Thereafter, the resist mask 52 is removed.

As shown in (4) in FIG. 21, the film 22 having negative fixed charges that covers the film 25 having positive fixed charges is formed on the film 21 for reducing interface state density.

The film 22 having negative fixed charges is formed by, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The films of the kinds described above are actually used in a gate insulating film and the like of an insulated-gate field-effect transistor. Therefore, since a film forming method is established, it is possible to easily form the films. As the film forming method, for example, the chemical vapor deposition method, the sputtering method, and the atomic layer deposition method can be used. The atomic layer deposition method is suitably used because an $SiO_2$ layer for reducing interface state density can be simultaneously formed by about 1 nm during the film formation.

As materials other than the above, lanthanum oxide ($La_2O_3$), praseodymiumoxide ($Pr_2O_3$), ceriumoxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosiumoxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), and the like can be used. The film 22 having negative fixed charges can be formed by a hafnium nitride film, an aluminum nitride film, a hafnium oxide nitride film, or an aluminum oxide nitride film as well. These films can also be formed by, for example, the chemical vapor deposition method, the sputtering method, and the atomic layer deposition method.

Silicon (Si) or nitrogen (N) may be added to the film 22 having negative fixed charges as long as insulating properties thereof are not spoiled. The density of silicon or nitrogen is appropriately determined in a range in which the insulating properties of the film are not spoiled. Such addition of silicon (Si) or nitrogen (N) makes it possible to improve heat resistance of the film and an ability of blocking ion implantation in a process.

When the film 22 having negative fixed charges is formed by a hafnium oxide ($HfO_2$) film, it is possible to efficiently obtain a reflection prevention effect by adjusting the film thickness of the hafnium oxide ($HfO_2$) film. Naturally, when other kinds of films are used, it is possible to obtain the reflection prevention effect by optimizing film thickness according to a refractive index.

In the configuration on the film 22 having negative fixed charges in the solid-state imaging device 5, a light shielding film that shields a part of the light-receiving sections 12 and the peripheral circuit section 14, a color filter layer that splits light made incident on at least the light-receiving sections 12, a condensing lens that condenses the incident light on the light-receiving sections 12, and the like are provided. As an example, as the configuration, the configuration of any one of the solid-state imaging devices 1, 2, and 3 can also be applied.

In the manufacturing method (the first manufacturing method) for a solid-state imaging device according to the fifth embodiment, the film 22 having negative fixed charges is formed on the film 21 for reducing interface state density. Therefore, the hole accumulation layer 23 is sufficiently formed in the interface on the light-receiving surfaces side of the light-receiving sections 12 by an electric field due to the negative fixed charges in the film 22 having negative fixed charges.

Therefore, charges (electrons) generated from the interface can be suppressed. Even if charges (electrons) are generated from the electric field, since the charges (electrons) flow in the hole accumulation layers 23 in which a large number of holes are present without flowing into charge accumulation portions forming wells of potential in the light-receiving sections 12, the charges (the electrons) can be eliminated.

Therefore, it is possible to prevent dark currents generated by the charges due to the interface from being detected by the light-receiving sections and suppress the dark currents due to the interface state density.

Further, since the film 21 for reducing interface state density is formed on the light-receiving surfaces of the light-receiving sections 12, the generation of electrons due to the interface state density is further suppressed. Therefore, the electrons due to the interface state density are prevented from flowing into the light-receiving sections 12 as dark currents.

Since the film 22 having negative fixed charges is used, it is possible to form an HAD structure without applying ion implantation and annealing thereto.

Moreover, the film 25 preferably having positive fixed charges and used for separating a film having negative fixed charges from the surface of a light-receiving surface is formed between the peripheral circuit section 14 and the film 22 having negative fixed charges. Therefore, the negative fixed charges of the film 22 having negative fixed charges are reduced by the positive fixed charges in the film 25 having positive fixed charges. This prevents the electric field of the negative fixed charges in the film 22 having negative fixed charges from affecting the peripheral circuit section 14.

Therefore, it is possible to prevent a malfunction of the peripheral circuit section 14 due to the negative fixed charges.

Presence of negative fixed charges in a hafnium oxide ($HfO_2$) film as an example of the film having negative fixed charges is explained below.

As a first sample, a MOS capacitor in which a gate electrode was formed on a silicon substrate via a thermal silicon oxide ($SiO_2$) film and the thickness of the thermal silicon oxide film was changed was prepared.

As a second sample, a MOS capacitor in which a gate electrode was formed on a silicon substrate via a CVD silicon oxide (CVD-$SiO_2$) film and the thickness of the CVD silicon oxide film was changed was prepared.

As a third sample, a MOS capacitor in which a gate electrode was formed on a silicon substrate via a laminated film obtained by laminating an ozone silicon oxide ($O_3$—$SiO_2$) film, a hafnium oxide ($HfO_2$) film, and a CVD silicon oxide ($SiO_2$) film in order and the thickness of the CVD silicon oxide film was changed was prepared. The thickness of the $HfO_2$ film and the thickness of the $O_3$—$SiO_2$ film were fixed.

The CVD-$SiO_2$ films of the respective samples are formed by the CVD method using a mixed gas of monosilane ($SiH_4$) and oxygen ($O_2$). The $HfO_2$ film is formed by the ALD method using tetrakisethylmethyl-amino hafnium (TEMAHf) and ozone ($O_3$) as materials. The $O_3$—$SiO_2$ film in the third sample is an interface oxide film having the thickness of about 1 nm formed between and a silicon substrate when the $HfO_2$ film is formed by the ALD method. In all the gate electrodes in the samples, the structure in which an aluminum (Al) film, a titanium nitride (TiN) film, and a titanium (Ti) film are laminated from above is used.

In the sample structure, in the first sample and the second sample, the gate electrode was formed right above the $SiO_2$ film. On the other hand, in only an applied product of the $HfO_2$ film of the third sample, the CVD-$SiO_2$ film was laminated on the film. This is for the purpose of preventing, by directly setting $HfO_2$ and the gate electrode in contact with each other, the electrode from causing a reaction in an interface thereof.

In the laminated structure of the third sample, the $HfO_2$ film thickness was fixed to 10 nm and the thickness of the CVD-$SiO_2$ film above was changed. This is because, since $HfO_2$ has a large relative dielectric constant and the thickness in terms of an oxide film is several nanometers even when film thickness is at the level of 10 nm, it is difficult to see a change in a flat band voltage Vfb with respect to the effective thickness of the silicon oxide layer (oxide film equivalent thickness).

The flat band voltage Vfb with respect to oxide film equivalent thickness Tox was checked for the first sample, the second sample, and the third sample. A result of the check is shown in FIG. 22.

Figure 22:
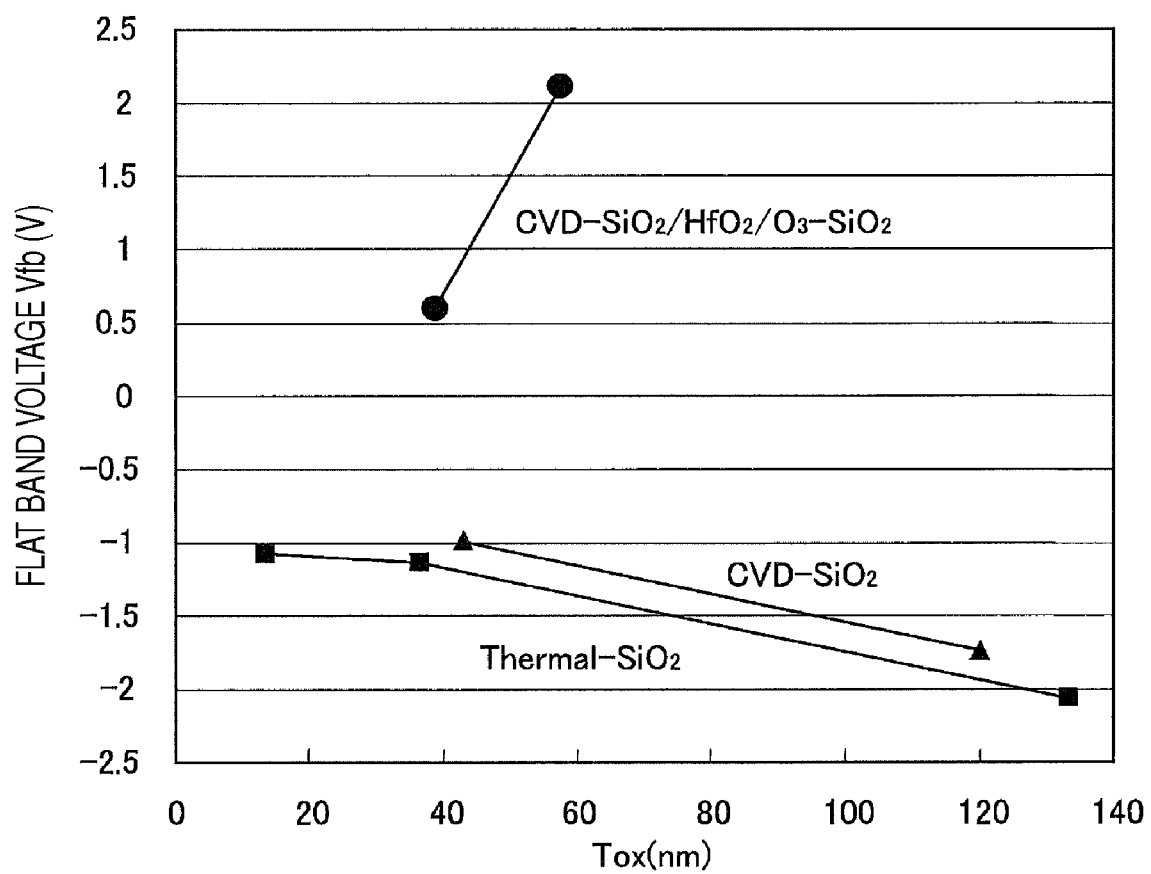
FIG. 22 is a relational graph of flat band voltage and oxide film equivalent thickness for explaining that negative fixed charges are present in a hafnium oxide ($HfO_2$) film.

As shown in FIG. 22, in the first sample of the thermal oxide (Thermal-$SiO_2$) film and the second sample of the CVD-$SiO_2$ film, the flat band voltage shifts in a minus direction with respect to an increase in the film thickness.

On the other hand, only in the applied product of the $HfO_2$ film of the third sample, it could be confirmed that the flat band voltage shifted in a plus direction with respect to an increase in the film thickness. According to the behavior of the flat band voltage, it is seen that minus charges are present in the $HfO_2$ film.

Concerning materials forming the film having negative fixed charges other than $HfO_2$, it is known that the materials have negative fixed charges in the same manner as $HfO_2$.

Figure 23:
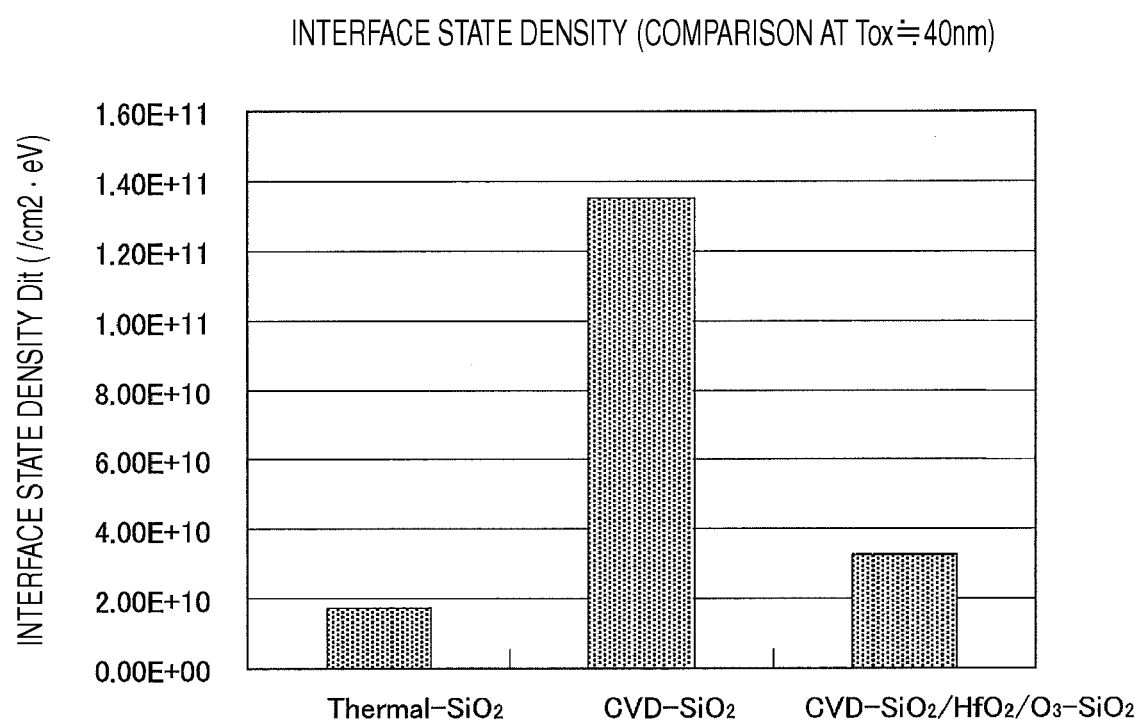
FIG. 23 is a comparative graph of interface state density for explaining that negative fixed charges are present in the hafnium oxide ($HfO_2$) film.

Data of interface state density in the respective samples is shown in FIG. 23. In FIG. 23, interface state density Dit is compared by using the first, second, and third samples, oxide film equivalent thicknesses Tox of which are substantially equal at about 40 nm in FIG. 22.

As a result, as shown in FIG. 23, whereas the first sample of the thermal oxide (Thermal-$SiO_2$) film has a characteristic equal to or lower than 2E10 ($cm^2 \cdot eV$), the interface state density is deteriorated by one digit in the second sample of the CVD-$SiO_2$ film.

On the other hand, it can be confirmed that the third sample in which the $HfO_2$ film is used has a satisfactory interface close to that of the thermal oxide film at about 3E10/$cm^2 \cdot eV$.

Concerning the materials forming the film having negative fixed charges other than $HfO_2$, it is known that, like $HfO_2$, the materials have the satisfactory interface state density close to that of the thermal oxide film.

When the film 25 having positive fixed charges was formed, the flat band voltage Vfb with respect to the oxide film equivalent thickness Tox was checked. A result of the check is shown in FIG. 24.

Figure 24:
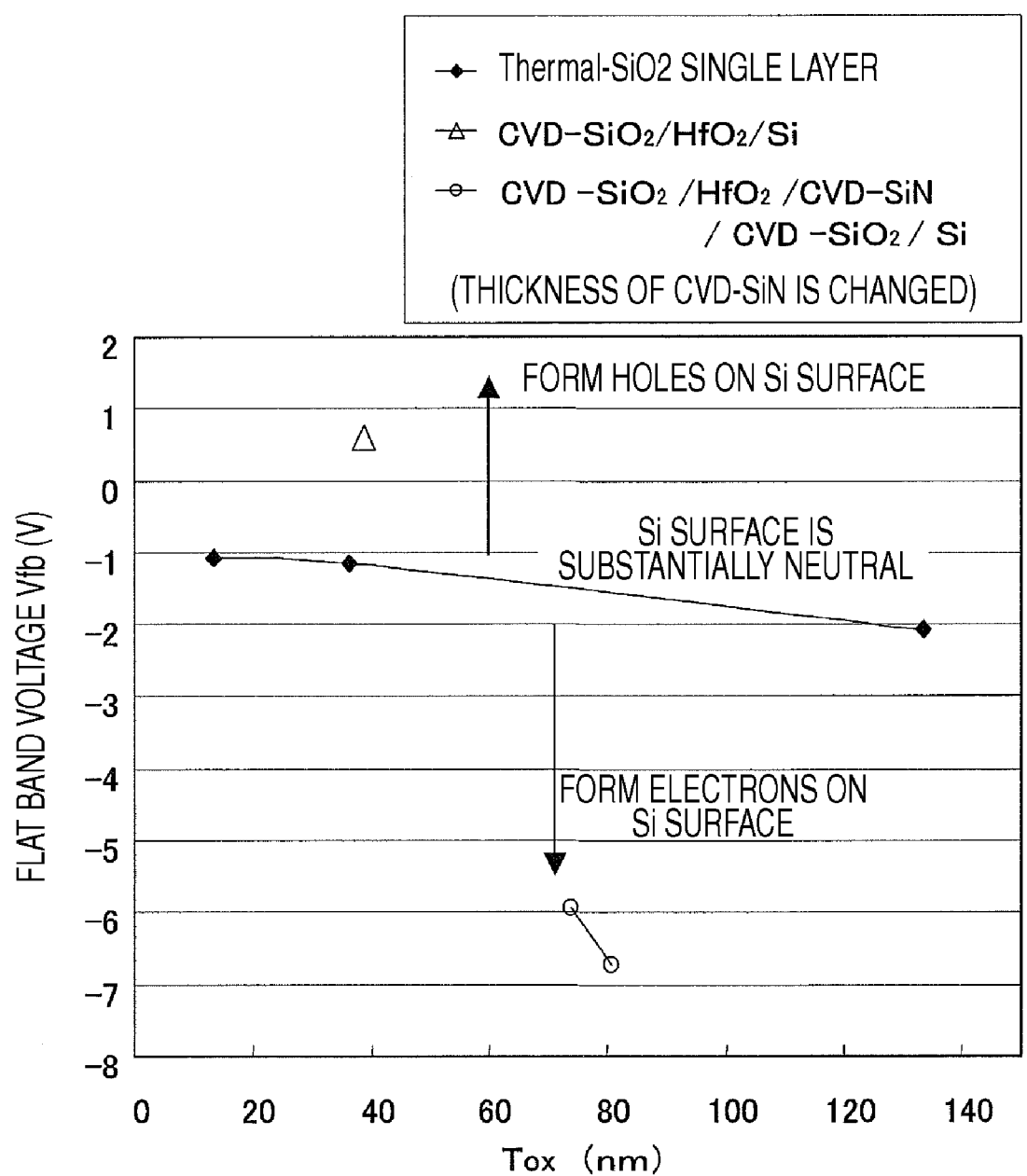
FIG. 24 is a relational chart of flat band voltage and oxide film equivalent thickness for explaining formation of electrons and formation of holes relative to a thermal oxide film.

As shown in FIG. 24, when the flat band voltage Vfb is larger than the flat band voltage of the thermal oxide film, negative charges are present in a film. Holes are formed in the silicon (Si) surface. As such a laminated film, for example, there is a laminated film in which an $HfO_2$ film and a CVD-$SiO_2$ film are laminated in order from below on the surface of a silicon (Si) substrate.

On the other hand, when the flat band voltage Vfb is smaller than the flat band voltage of the thermal oxide film, positive charges are present in a film. Electrons are formed in the silicon (Si) surface. As such a laminated film, for example, there is a laminated film in which a CVD-$SiO_2$ film, a CVD-SiN film, an $HfO_2$ film, and a CVD-$SiO_2$ film are laminated in order from below on the surface of a silicon (Si) substrate. When the thickness of the CVD-SiN film is increased, the flat band voltage substantially shifts in a minus direction compared with the thermal oxide film. The influence of positive charges in the CVD-SiN film cancels negative charges in hafnium oxide ($HfO_2$).

In the solid-state imaging device 1 to the solid-state imaging device 5 according to the embodiments, as explained above, when nitrogen (N) is contained in the film 22 having negative fixed charges, after forming the film 22 having negative fixed charges, it is possible to contain nitrogen (N) in the film 22 with nitriding by high-frequency plasma or microwave plasma.

It is possible to increase the negative fixed charges in the film 22 having negative fixed charges by applying electron beam curing by electron beam irradiation to the film 22 having negative fixed charges after forming the film.

A preferred manufacturing method according to a sixth embodiment in the case in which hafnium oxide is used for the film 22 having negative fixed charges used in the manufacturing methods (the first manufacturing methods) for a solid-state imaging device according to the first to fifth embodiments is explained below with reference to FIG. 25. In FIG. 25, as an example, the manufacturing method is applied to the first manufacturing method according to the first embodiment. A method of forming a film having negative fixed charges according to this embodiment can be applied to methods of forming a film having negative fixed charges of the first manufacturing methods according to the second to fifth embodiments as well.

When the film 22 having negative fixed charges is formed of oxide hafnium by the atomic layer deposition method (the ALD method), although a film quality is excellent, film formation time is long.

Therefore, as shown in (1) in FIG. 25, the semiconductor substrate (or the semiconductor layer) 11 on which the light-receiving section 12 that photoelectrically converts incident light, the pixel separation areas 13 that separate the light-receiving section 12, the peripheral circuit section 14 in which peripheral circuits (not specifically shown) are formed with respect to the light-receiving section 12 via the pixel separation area 13, and the like are formed is prepared. The film 21 for reducing interface state density is formed on the light-receiving surface 12s of the light-receiving section 12, actually, on the semiconductor substrate 11.

A first hafnium oxide film 22-1 is formed on the film 21 for reducing interface state density by the atomic layer deposition method. The first hafnium oxide film 22-1 is formed in thickness at least equal to or larger than 3 nm of thickness necessary for the film 22 having negative fixed charges.

As an example of a film formation condition of the atomic layer deposition method (the ALD method) for forming the first hafnium oxide film 22-1, TEMA-Hf (Tetrakis ethylmethylamido hafnium), TDMA-Hf (Tetrakis dimethylamido hafnium), or TDEA-Hf (Tetrakis diethylamido hafnium) was used as a precursor, film formation substrate temperature was set to 200° C. to 500° C., a flow rate of the precursor was set to 10 $cm^3$/min to 500 $cm^3$/min, irradiation time of the precursor was set to 1 second to 15 seconds, and a flow rate of ozone ($O_3$) was set to 5 $cm^3$/min to 50 $cm^3$/min.

The first hafnium oxide film 22-1 can be formed by the organic metal chemical vapor deposition method (the MOCVD method) as well. As an example of a film formation condition in this case, EMA-Hf (Tetrakis ethylmethylamino hafnium), TDMA-Hf (Tetrakis dimethylamino hafnium), or TDEA-Hf (Tetrakis diethylamnio hafnium) was used as a precursor, film formation substrate temperature was set to 200° C. to 600° C., a flow rate of the precursor was set to 10 $cm^3$/min to 500 $cm^3$/min, irradiation time of the precursor was set to 1 second to 15 seconds, and a flow rate of ozone ($O_3$) was set to 5 $cm^3$/min to 50 $cm^3$/min.

As shown in (2) in FIG. 25, a second hafnium oxide film 22-2 is formed on the first hafnium oxide film 22-1 by the physical vapor deposition method (the PVD method) to complete the film 22 having negative fixed charges. For example, the second hafnium oxide film 22-2 is formed such that the total thickness of the first hafnium oxide film 22-1 and the second hafnium oxide film 22-2 is 50 nm to 60 nm.

Thereafter, as explained in the first to fifth embodiments, the following process for forming the insulating film 41 on the film 22 having negative fixed charges is performed.

As an example of a film formation condition in the physical vapor deposition method (the PVD method) of the second hafnium oxide film 22-2, a hafnium metal target was used as a target, argon and oxygen were used as process gasses, the voltage of a film formation atmosphere was set to 0.01 Pa to 50 Pa, power was set to 500 W to 2.00 kW, a flow rate of argon (Ar) was set to 5 cm$^3$/min to 50 cm$^3$/min, and a flow rate of oxygen ($O_2$) was set to 5 cm$^3$/min to 50 cm$^3$/min.

The thickness of the film 22 having negative fixed charges formed of hafnium oxide was set to 60 nm. A C-V (capacity-voltage) characteristic of the solid-state imaging device in this case was checked using the thickness of the first hafnium oxide film 22-1 as a parameter.

Figure 26:
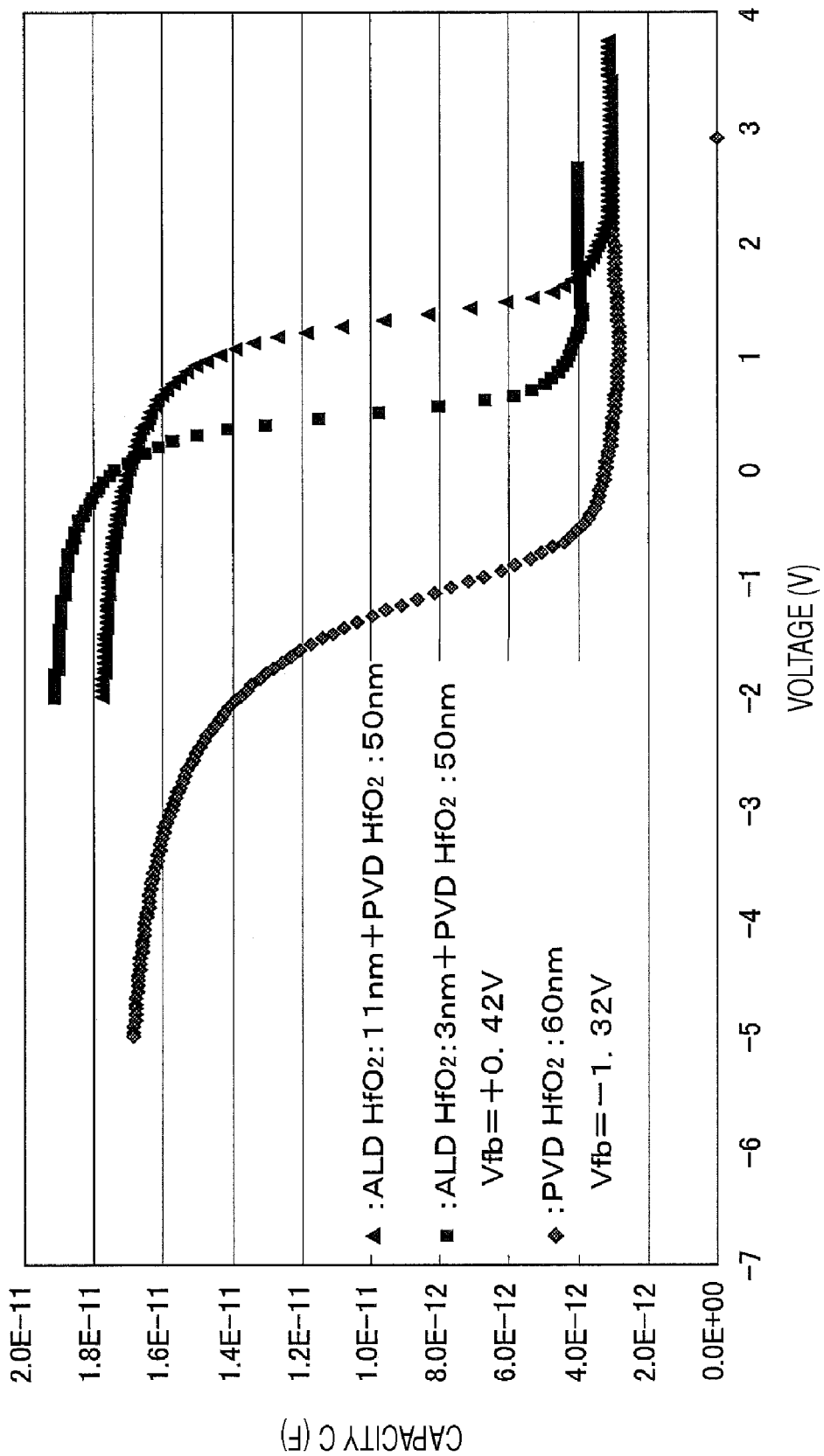
FIG. 26 is a graph of a C-V (capacity-voltage) characteristic of a solid-state imaging device, in which a film having negative fixed charges is used, manufactured by the manufacturing method according to the sixth embodiment.
Figure 27:
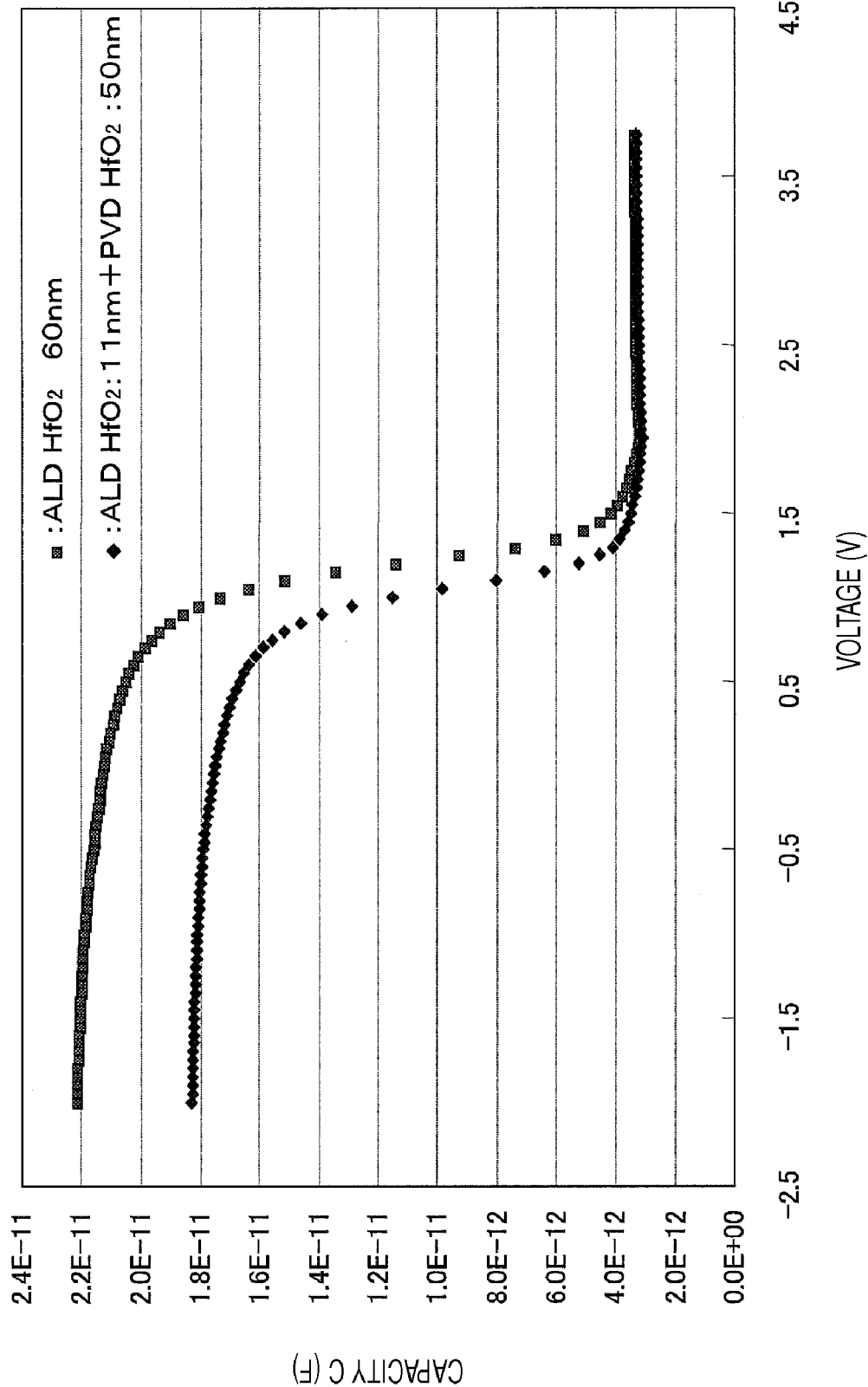
FIG. 27 is a graph of a C-V (capacity-voltage) characteristic of the solid-state imaging device, in which the film having negative fixed charges is used, manufactured by the first manufacturing method according to the sixth embodiment.

A result of the check is shown in FIGS. 26 and 27. In both FIGS. 26 and 27, the ordinate indicates capacity (C) and the abscissa indicates voltage (V).

As shown in FIG. 26, when a hafnium oxide ($HfO_2$) film is formed by only the PVD method, the flat band voltage Vfb is −1.32 V, which is negative voltage. The film is not a film having negative fixed charges.

The flat band voltage Vfb needs to be positive voltage to obtain a film having negative fixed charges.

Since a rising edge is dull, interface state density is large. As explained later, in this case, the evaluation of the interface state density Dit was unavailable because the interface state density is too high.

On the other hand, when, after the first hafnium oxide film 22-1 is formed in the thickness of 3 nm by the ALD method, the second hafnium oxide film 22-2 is formed in the thickness of 50 nm on the first hafnium oxide film 22-1 by the PVD method, the flat band voltage Vfb is +0.42V, which is positive voltage. Therefore, the film is a film having negative fixed charges.

Since a rising edge is steep, the interface state density Dit is low at 5.14E10/cm$^2$·eV.

When, after the first hafnium oxide film 22-1 is formed in the thickness of 11 nm by the ALD method, the second hafnium oxide film 22-2 is formed in the thickness of 50 nm on the first hafnium oxide film 22-1 by the PVD method, the flat band voltage Vfb is higher positive voltage. Therefore, the film is a film having negative fixed charges.

Since a rising edge is steeper, the interface state density Dit is lower.

As shown in FIG. 27, when, after the first hafnium oxide film 22-1 is formed in the thickness of 11 nm by the ALD method, the second hafnium oxide film 22-2 is formed in the thickness of 50 nm on the first hafnium oxide film 22-1 by the PVD method, the flat band voltage Vfb close to that obtained when the film 22 having negative fixed charges is entirely formed by the ALD method is obtained. A rising edge is in a state substantially close to that obtained when the film 22 having negative fixed charges is entirely formed by the ALD method.

A film having negative fixed charges was obtained when, after the first hafnium oxide film 22-1 was formed in the thickness of 11 nm, the second hafnium oxide film 22-2 was formed in the thickness of 50 nm on the first hafnium oxide film 22-1 by the PVD method. Concerning this film, general measurement of a C-V characteristic (Qs-CV: Quasi-static-CV) with a direct current and measurement (Hf-CV) with a high-frequency wave were performed. The Qs-CV measurement is a measurement method for sweeping gate voltage as a linear function of time and calculating a displacement current flowing between a gate and a substrate. Capacitance in a low-frequency region is calculated from the displacement current.

Figure 28:
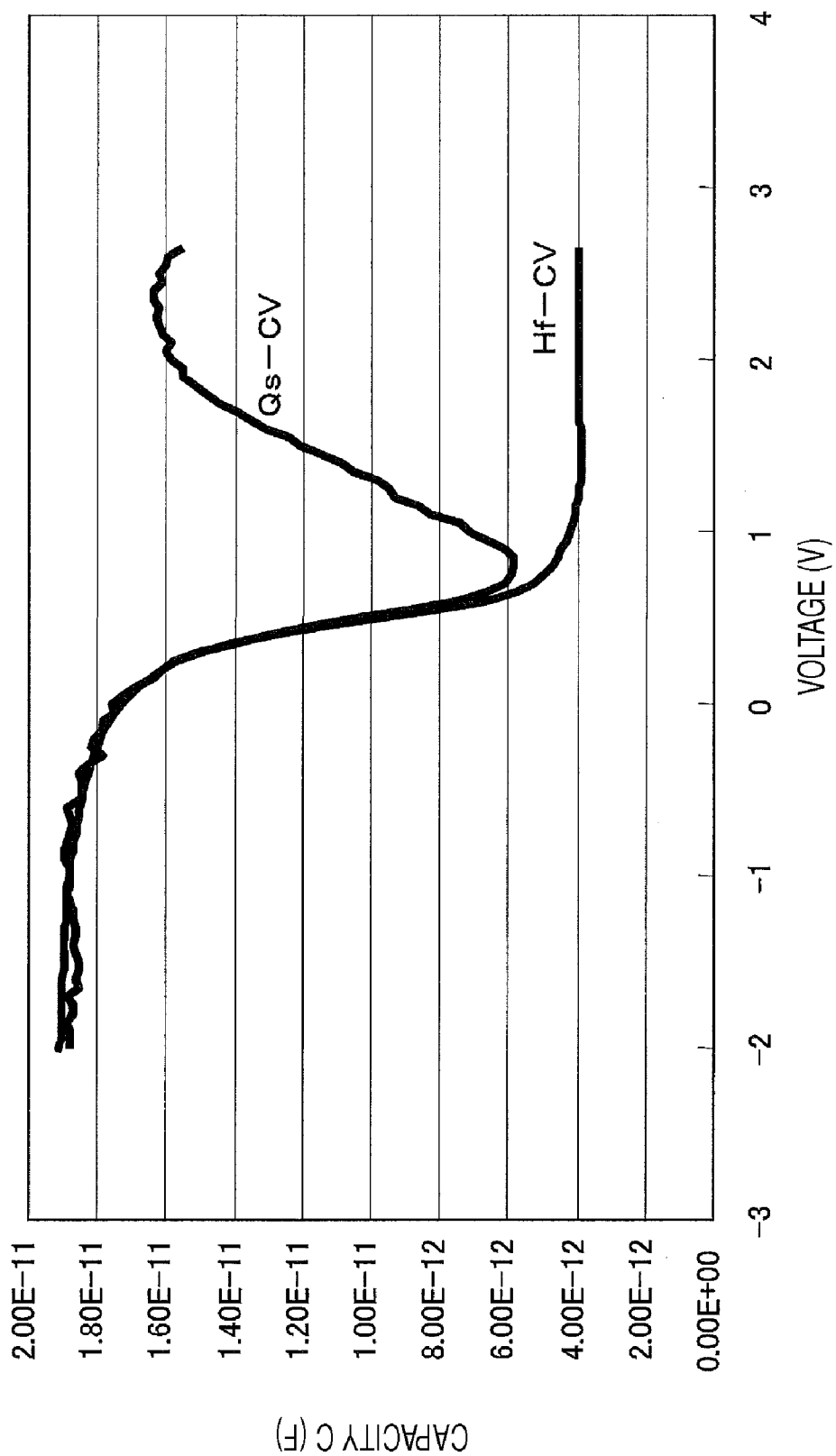
FIG. 28 is a graph of a C-V (capacity-voltage) characteristic of the solid-state imaging device, in which the film having negative fixed charges is used, manufactured by the first manufacturing method according to the sixth embodiment.

A result of the measurement is shown in FIG. 28.

The interface state density Dit was calculated from a difference between a measurement value of Qs-CV and a measurement value of Hf-CV. As a result, Dit was 5.14E10/cm$^2$·eV, which was a sufficiently low value. As explained above, the flat band voltage Vfb was +0.42 V, which was positive voltage.

Therefore, it is possible to set a value of the flat band voltage Vfb of the film 22 having negative fixed charges to a positive voltage and set the interface state density Dit low by forming the first hafnium oxide film 22-1 in the thickness equal to or larger than 3 nm.

It is preferable to form the first hafnium oxide film 22-1 in thickness equal to or larger than 3 nm of thickness necessary for the film 22 having negative fixed charges.

The first hafnium oxide film 22-1 is a film formed by the atomic layer deposition method. In the formation of a hafnium oxide film by the atomic layer deposition method, at the film thickness thereof smaller than 3 nm, when the next formation of the second hafnium oxide film 22-2 is performed by the PVD method, interface damage due to the PVD method occurs. However, when the thickness of the first hafnium oxide film 22-1 is increased to be equal to or larger than 3 nm, the interface damage is suppressed even when the next formation of the second hafnium oxide film 22-2 is performed by the PVD method. When the thickness of the first hafnium oxide film 22-1 is set to be equal to or larger than 3 nm to suppress the interface damage due to the PVD method in this way, in a film obtained by combining the first hafnium oxide film 22-1 and the second hafnium oxide film 22-2, a value of the flat band voltage Vfb is positive voltage. Therefore, the film is a film having negative fixed charges.

Therefore, the first hafnium oxide film 22-1 formed on the side of the interface with the film 21 for reducing interface state density has the thickness equal to or smaller than 3 nm.

As an example of the PVD method, there is the sputtering method.

On the other hand, when the film 22 having negative fixed charges is entirely formed by the atomic layer deposit method, although the C-V characteristic is excellent, since film formation takes too long time, productivity markedly falls. Therefore, it is difficult to set the thickness of the first hafnium oxide film 22-1 very large.

In the atomic layer deposit method, for example, it takes about forty-five minutes to form a hafnium oxide film in the thickness of 10 nm. On the other hand, in the physical vapor deposition method, for example, it takes only about three minutes to form a hafnium oxide film in the thickness of 50 nm. Therefore, an upper limit of the thickness of the first hafnium oxide film 22-1 is determined by taking into account productivity. For example, when formation time for the film 22 having negative fixed charges is within one hour, an upper limit of the thickness of the first hafnium oxide film 22-1 is about 11 nm to 12 nm.

With the film formation method employing both the atomic layer deposition method and the physical vapor deposition method, it is possible to substantially reduce film formation time from time for forming the film 22 having negative fixed charges entirely with the atomic layer deposition method or the CVD method. Therefore, it is possible to realize improvement of mass production efficiency.

In the atomic layer deposition method and the MOCVD method, there is almost no damage to a substrate compared with the film formation by the physical vapor deposition method.

Therefore, damage to a light-reception sensor unit is reduced. The problem of increasing interface state density as a cause of generation of dark currents can be solved.

In the above explanation, the film 22 having negative fixed charges is formed by a hafnium oxide film. However, the manufacturing method according to this embodiment for, first, forming a film with the atomic layer deposition method and, then, forming a film with the physical vapor deposition method can be applied in the same manner to the film 22 having negative fixed charges formed by the films explained above. Examples of the films include the aluminum oxide ($Al_2O_3$) film, the zirconium oxide ($ZrO_2$) film, the tantalum oxide ($Ta_2O_5$) film, and the a titanium oxide ($TiO_2$) film, the films of lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), and the like, and the hafnium nitride film, the aluminum nitride film, the hafnium oxide nitride film, and the aluminum oxide nitride film. In this case, effects same as those in the case of the hafnium oxide film can be obtained.

A preferred manufacturing method according to a seventh embodiment for the film 22 having negative fixed charges used in the manufacturing methods (the first manufacturing methods) for a solid-state imaging device according to the first to fifth embodiments is explained below with reference to FIG. 29 to FIG. 31. In FIG. 29 to FIG. 31, as an example, the manufacturing method is applied the first manufacturing method according to the first embodiment. A method of forming a film having negative fixed charges according to this embodiment can be applied to the methods of forming a film having negative fixed charges of the first manufacturing methods according to the second to fifth embodiments as well. In this explanation, as an example of a film having negative fixed charges, a hafnium oxide film is used.

As shown in (1) in FIG. 29, the plural light-receiving sections 12 that photoelectrically convert incident light, the peripheral circuit section 14 in which peripheral circuits (not specifically shown) for processing signals photoelectrically converted and obtained by the respective light-receiving sections 12 are formed, the pixel separation areas 13 that separate, for example, the light-receiving section 12 and the peripheral circuit section 14, the light-receiving sections 12 (the pixel separation areas 13 among the light-receiving sections 12 are not shown), and the like are formed in the semiconductor substrate (or the semiconductor layer) 11. An existing manufacturing method is used for the manufacturing method.

As shown in (2) in FIG. 29, the film 21 for reducing interface state density is formed on the light-receiving surfaces 12s of the light-receiving sections 12, actually, on the semiconductor substrate 11. The film 21 for reducing interface state density is formed by, for example, a silicon oxide ($SiO_2$) film.

The film 22 having negative fixed charges is formed on the film 21 for reducing interface state density. Consequently, the hole accumulation layers 23 are formed on the light-receiving surfaces side of the light-receiving sections 12.

Therefore, at least on the light-receiving sections 12, the film 21 for reducing interface state density needs to be formed, by the film 22 having negative fixed charges, in thickness enough for forming the hole accumulation layers 23 on the light-receiving surfaces 12s side of the light-receiving sections 12. The film thickness is, for example, equal to or larger than one atom layer and equal to or smaller than 100 nm.

The film 22 having negative fixed charges is formed by, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The films of the kinds described above are actually used in a gate insulating film and the like of an insulated-gate field-effect transistor. Therefore, since a film forming method is established, it is possible to easily form the films. As the film forming method, for example, the chemical vapor deposition method, the sputtering method, and the atomic layer deposition method can be used. The atomic layer deposition method is suitably used because an $SiO_2$ layer for reducing interface state density can be simultaneously formed by about 1 nm during the film formation.

As materials other than the above, lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), and the like can be used. For these films, for example, the chemical vapor deposition method, the sputtering method, and the atomic layer deposition method can be used.

When the film 22 having negative fixed charges is formed by a hafnium oxide ($HfO_2$) film, it is possible to efficiently obtain a reflection prevention effect by adjusting the thickness of the hafnium oxide ($HfO_2$) film. Naturally, when other kinds of films are used, it is possible to obtain the reflection prevention effect by optimizing film thickness according to a refractive index.

The surface of the film 22 having negative fixed charges is subjected to plasma nitriding.

Negative fixed charges are further generated in the hafnium oxide film according to the plasma nitriding and larger band bending is formed. As a plasma nitriding condition, for example, a high-frequency plasma processing device is used and nitrogen ($N_2$) or ammonium ($NH_3$) is used as gas for nitriding supplied into a chamber and, for example, RF power is set to 200 W to 900 W and voltage is set to 0.13 Pa to 13.3 Pa. Under this condition, plasma is generated in the chamber to perform nitriding.

A plasma processing device is not limited to the high-frequency plasma processing device. Any plasma processing device may be used as long as plasma can be generated in the chamber. For example, a microwave plasma processing device, an ICP plasma processing device, an ECR plasma processing device, and the like can be used.

The plasma nitriding is performed such that nitrogen (N) is introduced into the surface of the film 22 having negative fixed charges. It is important to set a plasma nitriding condition to perform the plasma nitriding such that nitrogen (N) does not reach an interface on the light-receiving sections 12 side of the film 22 having negative fixed charges. For example, supply amounts of nitrogen gas and ammonium gas to the chamber, RF power, and the like only have to be adjusted by taking into account the thickness, a material, and the like of the film 22 having negative fixed charges.

When nitrogen (N) reaches the interface on the light-receiving sections 12 side of the film 22 having negative fixed charges, nitrogen causes occurrence of a white dot defect in the light-receiving sections 12.

As shown in (3) in FIG. 30, the insulating film 41 is formed on the film 22 having negative fixed charges. The light shielding film 42 is formed on the insulating film 41. The insulating film 41 is formed by, for example, a silicon oxide film. The light shielding film 42 is formed by, for example, a metal film having light shielding properties.

The light shielding film 42 is formed on the film 22 having negative fixed charges via the insulating film 41 in this way. This makes it possible to prevent a reaction of the film 22 having negative fixed charges formed by a hafnium oxide film or the like and the metal of the light shielding film 42.

When the light shielding film 42 is etched, since the insulating film 41 functions as an etching stopper, it is possible to prevent etching damage to the film 22 having negative fixed charges.

As shown in (4) in FIG. 30, a resist mask (not shown) is formed on the light shielding film 42 above a part of the light-receiving sections 12 and the peripheral circuit section 14 by the resist application and the lithography technique. The light shielding film 42 is etched by using the resist mask to leave the light shielding film 42 on the insulating film 41 above a part of the light-receiving sections 12 and the peripheral circuit section 14.

An area in which light does not enter is formed in the light-receiving sections 12 by the light shielding film 42. A black level in an image is determined by an output of the light-receiving sections 12.

Since light is prevented from entering the peripheral circuit section 14, fluctuation in characteristics caused by the light entering the peripheral circuit section 14 is suppressed.

As shown in (5) in FIG. 31, the insulating film 43 that reduces a step formed by the light shielding film 42 is formed on the insulating film 41. The insulating film 43 is preferably planarized on the surface thereof and is formed by, for example, a coated insulating film.

As shown in (6) in FIG. 31, the color filter layer 44 is formed on the insulating film 43 above the light-receiving section 12 by an existing manufacturing technique. The condensing lens 45 is formed on the color filer layer 44. A light transmissive insulating film (not shown) may be formed between the color filter layer 44 and the condensing lens 45 in order to prevent machining damage to the color filter layer 44 in lens machining.

The solid-state imaging device 1 is formed in this way.

A state of generation of dark currents according to presence or absence of the plasma nitriding in the solid-state imaging device 1 in which a hafnium oxide ($HfO_2$) film was used for the film 22 having negative fixed charges was checked. A result of the check is shown in FIG. 32.

Figure 32:
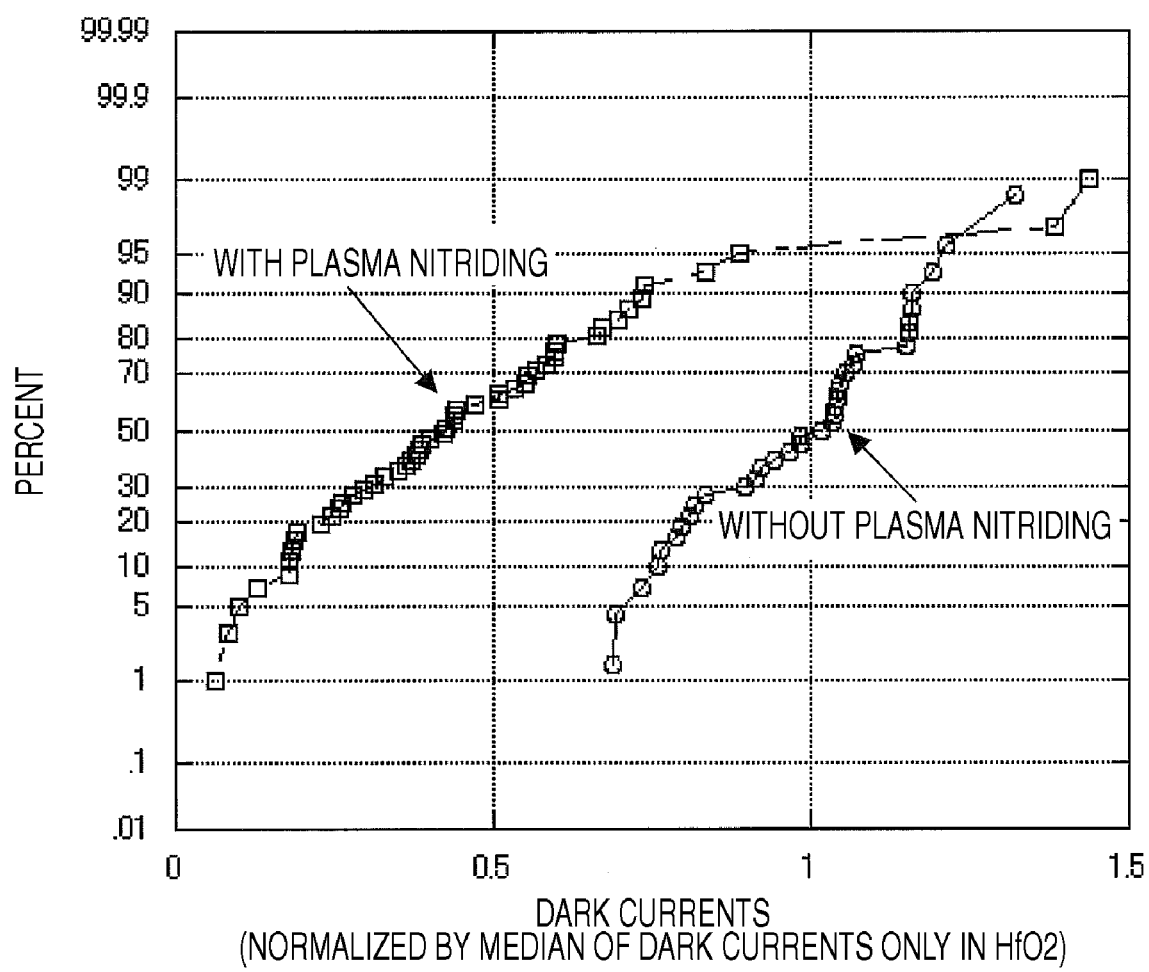
FIG. 32 is a graph for explaining a dark current suppression effect of a solid-state imaging device, in which a film having negative fixing charges is used, manufactured by the first manufacturing method according to the seventh embodiment.

In FIG. 32, the ordinate indicates a percentage of generation (%) of dark currents and the abscissa indicates dark currents normalized by a median of dark currents in only the hafnium oxide film ($HfO_2$).

As shown in FIG. 32, it is seen that, in a solid-state imaging device in which a film having negative fixed charges obtained by subjecting the surface of a hafnium oxide film to plasma nitriding is used, dark currents are substantially reduced from those in a solid-state imaging device in which a hafnium nitride film not subjected to plasma nitriding is used for a film having negative fixed charges.

In the film 22 having negative fixed charges including the various films other than the hafnium oxide film, as in the hafnium oxide film, it is possible to obtain an effect that the solid-state imaging device in which a film having negative fixed charges obtained by subjecting the surface of a hafnium oxide film to plasma nitriding is used can substantially reduce dark currents compared with the solid-state imaging device in which a hafnium nitride film not subjected to plasma nitriding is used for a film having negative fixed charges.

Therefore, in the manufacturing method (the first manufacturing method) for a solid-state imaging device according to the seventh embodiment, since the surface of the film 22 having negative fixed charges is subjected to plasma nitriding, the negative fixed charges in the film 22 having negative fixed charges increase and stronger band bending can be formed. Therefore, dark currents generated in the light-receiving section 12 can be reduced.

Figure 33:
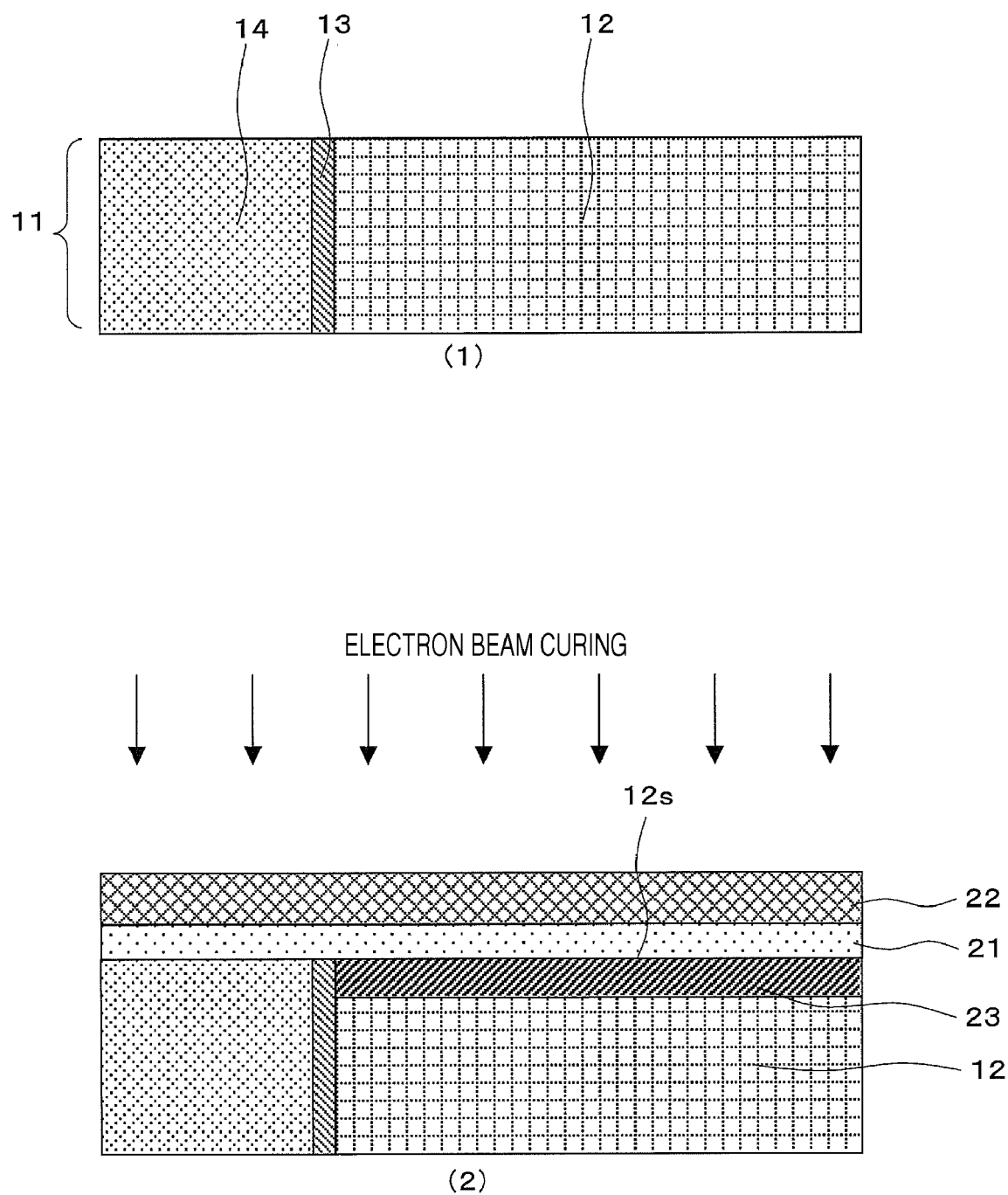
FIG. 33 shows sectional views of a manufacturing process of a manufacturing method (a first manufacturing method) for a solid-state imaging device according to an eighth embodiment of the present invention.

A preferred manufacturing method according to an eighth embodiment for the film 22 having negative fixed charges used in the manufacturing methods (the first manufacturing methods) for a solid-state imaging device according to the first to fifth embodiments is explained below with reference to FIG. 33 to FIG. 35. In FIG. 33 to FIG. 35, as an example, the manufacturing method is applied the first manufacturing method according to the first embodiment. A method of forming a film having negative fixed charges according to this embodiment can be applied to the methods of forming a film having negative fixed charges of the first manufacturing methods according to the second to fifth embodiments as well. In this explanation, as an example of a film having negative fixed charges, a hafnium oxide film is used.

As shown in (1) in FIG. 33, the plural light-receiving sections 12 that photoelectrically convert incident light, the peripheral circuit section 14 in which peripheral circuits (not specifically shown) for processing signals photoelectrically converted and obtained by the respective light-receiving sections 12 are formed, the pixel separation areas 13 that separate the light-receiving sections 12 and the peripheral circuit section 14, the light-receiving sections 12 (the pixel separation areas 13 among the light-receiving sections 12 are not shown), and the like are formed in the semiconductor substrate (or the semiconductor layer) 11. An existing manufacturing method is used for the manufacturing method.

As shown in (2) in FIG. 33, the film 21 for reducing interface state density is formed on the light-receiving surfaces 12s of the light-receiving sections 12, actually, on the semiconductor substrate 11. The film 21 for reducing interface state density is formed by, for example, a silicon oxide ($SiO_2$) film.

The film 22 having negative fixed charges is formed on the film 21 for reducing interface state density. Consequently, the hole accumulation layer 23 is formed on the light-receiving surface sides of the light-receiving sections 12.

Therefore, at least on the light-receiving section 12, the film 21 for reducing interface state density needs to be formed, by the film 22 having negative fixed charges, in thickness enough for forming the hole accumulation layer 23 on the light-receiving surface 12s side of the light-receiving section 12. The film thickness is, for example, equal to or larger than one atom layer and equal to or smaller than 100 nm.

The film 22 having negative fixed charges is formed by, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The films of the kinds described above are actually used in a gate insulating film and the like of an insulated-gate field-effect transistor. Therefore, since a film forming method is established, it is possible to easily form the films. As the film forming method, for example, the chemical vapor deposition method, the sputtering method, and the atomic layer deposition method can be used. The atomic layer deposition method is suitably used because an $SiO_2$ layer for reducing interface state density can be simultaneously formed by about 1 nm during the film formation.

As materials other than the above, lanthanum oxide ($La_2O_3$), praseodymiumoxide ($Pr_2O_3$), ceriumoxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosiumoxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), and the like can be used. For these films, for example, the chemical vapor deposition method, the sputtering method, and the atomic layer deposition method can be used.

When the film 22 having negative fixed charges is formed by a hafnium oxide ($HfO_2$) film, it is possible to efficiently obtain a reflection prevention effect by adjusting the film thickness of the hafnium oxide ($HfO_2$). Naturally, when other kinds of films are used, it is possible to obtain the reflection prevention effect by optimizing film thickness according to a refractive index.

The surface of the film 22 having negative fixed charges is subjected to plasma nitriding.

Negative fixed charges are further generated in the hafnium oxide film according to the plasma nitriding and larger band bending is formed. As a plasma nitriding condition, for example, an electron beam irradiating device is used, for example, acceleration voltage is set to 0.5 kV to 50 kV, voltage in a chamber is set to 0.13 Pa to 13.3 Pa, and substrate temperature is set to 200° C. to 500° C. An electron beam is irradiated on the surface of the film 22 to perform electron beam curing.

As shown in (3) in FIG. 34, the insulating film 41 is formed on the film 22 having negative fixed charges. The light shielding film 42 is formed on the insulating film 41. The insulating film 41 is formed by, for example, a silicon oxide film. The light shielding film 42 is formed by, for example, a metal film having light shielding properties.

The light shielding film 42 is formed on the film 22 having negative fixed charges via the insulating film 41 in this way. This makes it possible to prevent a reaction of the film 22 that is formed by a hafnium oxide film or the like and has having negative fixed charges and the metal of the light shielding film 42.

When the light shielding film 42 is etched, since the insulating film 41 functions as an etching stopper, it is possible to prevent etching damage to the film 22 having negative fixed charges.

As shown in (4) in FIG. 34, a resist mask (not shown) is formed on the light shielding film 42 above a part of the light-receiving sections 12 and the peripheral circuit section 14 by the resist application and the lithography technique. The light shielding film 42 is etched by using the resist mask to leave the light shielding film 42 on the insulating film 41 above a part of the light-receiving sections 12 and the peripheral circuit section 14.

An area in which light does not enter is formed in the light-receiving sections 12 by the light shielding film 42. A black level in an image is determined by an output of the light-receiving sections 12.

Since light is prevented from entering the peripheral circuit section 14, fluctuation in characteristics caused by the light entering the peripheral circuit section 14 is suppressed.

As shown in (5) in FIG. 35, the insulating film 43 that reduces a step formed by the light shielding film 42 is formed on the insulating film 41. The insulating film 43 is preferably planarized on the surface thereof and is formed by, for example, a coated insulating film.

As shown in (6) in FIG. 35, the color filter layer 44 is formed on the insulating film 43 above the light-receiving sections 12 by an existing manufacturing technique. The condensing lens 45 is formed on the color filer layer 44. A light transmissive insulating film (not shown) may be formed between the color filter layer 44 and the condensing lens 45 in order to prevent machining damage to the color filter layer 44 in lens machining.

The solid-state imaging device 1 is formed in this way.

A state of generation of dark currents according to presence or absence of the electron beam curing in the solid-state imaging device 1 in which a hafnium oxide ($HfO_2$) film was used for the film 22 having negative fixed charges was checked. A result of the check is shown in FIG. 36.

Figure 36:
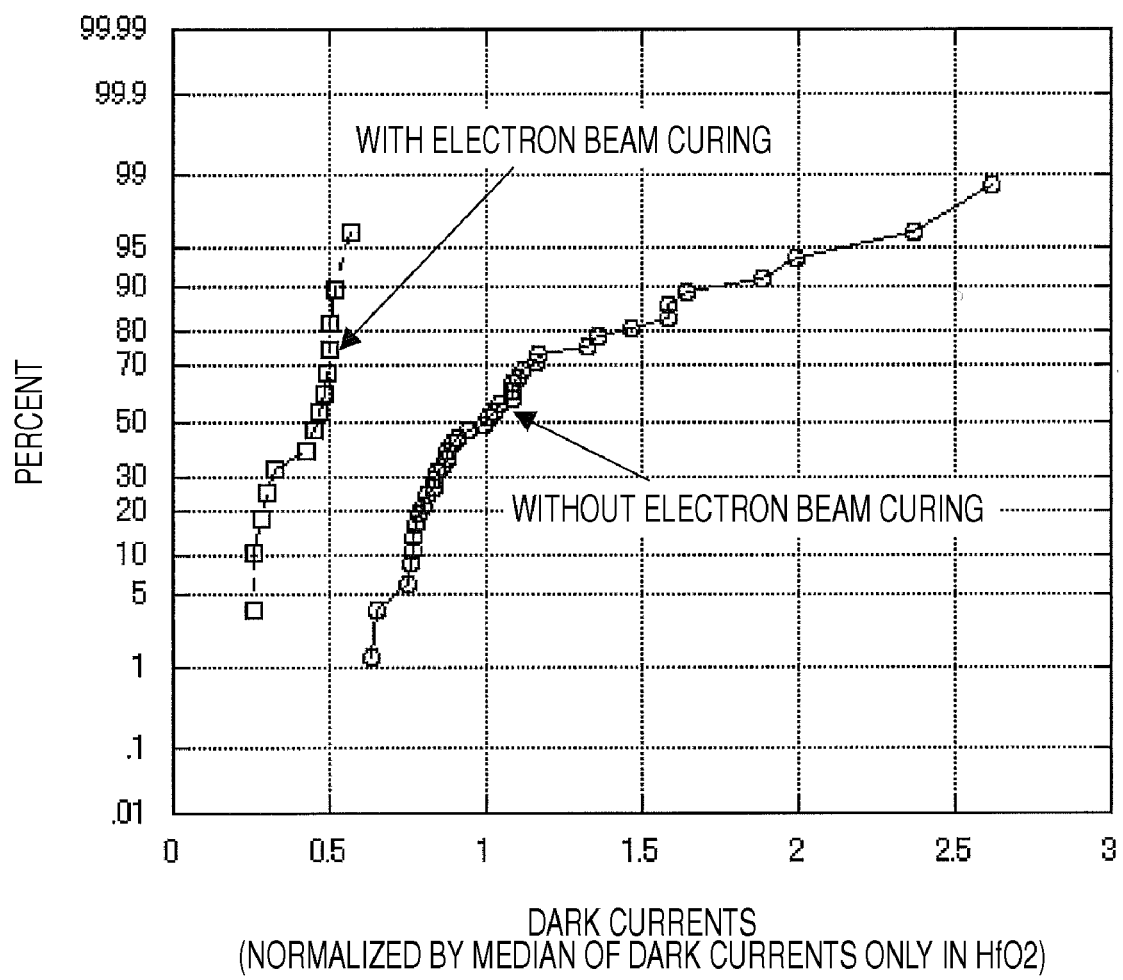
FIG. 36 is a graph for explaining a dark current suppression effect of a solid-state imaging device, in which a film having negative fixing charges is used, manufactured by the first manufacturing method according to the eight embodiment.

In FIG. 36, the ordinate indicates a percentage of generation (%) of dark currents and the abscissa indicates dark currents normalized by a median of dark currents of only the hafnium oxide film ($HfO_2$).

As shown in FIG. 36, it is seen that, in a solid-state imaging device in which a film having negative fixed charges obtained by subjecting the surface of a hafnium oxide film to electron beam curing is used, dark currents can be substantially reduced from those in a solid-state imaging device in which a hafnium nitride film not subjected to electron beam curing is used for a film having negative fixed charges.

In the film 22 having negative fixed charges including the various films other than the hafnium oxide film, as in the hafnium oxide film, it is possible to obtain an effect that the solid-state imaging device in which a film having negative fixed charges obtained by subjecting the surface of a hafnium oxide film to electron beam curing is used can substantially reduce dark currents compared with the solid-state imaging device in which a hafnium nitride film not subjected to electron beam curing is used for a film having negative fixed charges.

Therefore, in the manufacturing method (the first manufacturing method) for a solid-state imaging device according to the eighth embodiment, since the surface of the film 22 having negative fixed charges is subjected to electron beam curing, the negative fixed charges in the film 22 having negative fixed charges increase and stronger band bending can be formed. Therefore, dark currents generated in the light-receiving section 12 can be reduced.

A preferred manufacturing method according to a ninth embodiment for the film 22 having negative fixed charges used in the manufacturing methods (the first manufacturing methods) for a solid-state imaging device according to the first to fifth embodiments is explained below with reference to FIG. 37. In FIG. 37, as an example, the manufacturing method is applied the first manufacturing method according to the first embodiment. A method of forming a film having negative fixed charges according to this embodiment can be applied to the methods of forming a film having negative fixed charges of the first manufacturing methods according to the second to fifth embodiments as well. In this explanation, as an example of a film having negative fixed charges, a hafnium oxide film is used.

Although not shown in (1) in FIG. 37, pixel separation areas, the light-receiving section 12, transistors, and the like are formed in the semiconductor substrate (or the semiconductor layer) 11. For example, a wiring layer 63 is formed on a rear surface side of the semiconductor substrate 11. The wiring layer 63 includes wiring 61 and an insulating film 62 that covers the wiring 61.

The film 21 for reducing interface state density is formed on the semiconductor substrate 11. The film 21 for reducing interface state density is formed by, for example, a silicon oxide ($SiO_2$) film 21Si.

As the semiconductor substrate 11, for example, a monocrystal silicon substrate is used. The semiconductor substrate 11 is formed in the thickness of about 3 μm to 5 μm.

As shown in (2) in FIG. 37, a hafnium oxide ($HfO_2$) film 22Hf is formed on the silicon oxide ($SiO_2$) film 21Si as the film 22 having negative fixed charges. Consequently, a hole accumulation layer is formed on the light-receiving surface side of the light-receiving section 12.

Therefore, at least on the light-receiving section 12, the film 21 for reducing interface state density needs to be formed, by the hafnium oxide film 22Hf, in thickness enough for forming a hole accumulation layer on the light-receiving surface 12s side of the light-receiving section 12. The film thickness is, for example, equal to or larger than one atom layer and equal to or smaller than 100 nm. As an example, the film 21 for reducing interface state density is formed in the thickness of 30 nm. A function of a reflection preventing film can be imparted to this silicon oxide film.

In the film formation of the hafnium oxide film 22Hf, for example, the atomic layer deposit method is used. In this film formation, the semiconductor substrate 11, the wiring layer 63, and the like need to be held at the temperature equal to or lower than 400° C. This is for the purpose of securing reliability of a diffusion area and wiring formed in the wiring layer 63, the semiconductor device 11, and the like.

Since film formation temperature is held at the temperature equal to or lower than 400° C., the hafnium oxide film 22Hf is formed in an amorphous state.

As shown in (3) in FIG. 37, light irradiation treatment for irradiating light L on the surface of the hafnium oxide film 22Hf is performed to crystallize the amorphous hafnium oxide film 22Hf.

For example, according to condition setting under which the temperature of the surface of a hafnium oxide film was set to be equal to or higher than 1400° C. when light having the wavelength of 528 nm was irradiated for 120 ns, 140 ns, 160 ns, and 200 ns, a temperature distribution in a depth direction from the surface of the hafnium oxide film was calculated by simulation. A result of the simulation is shown in FIG. 38.

Figure 38:
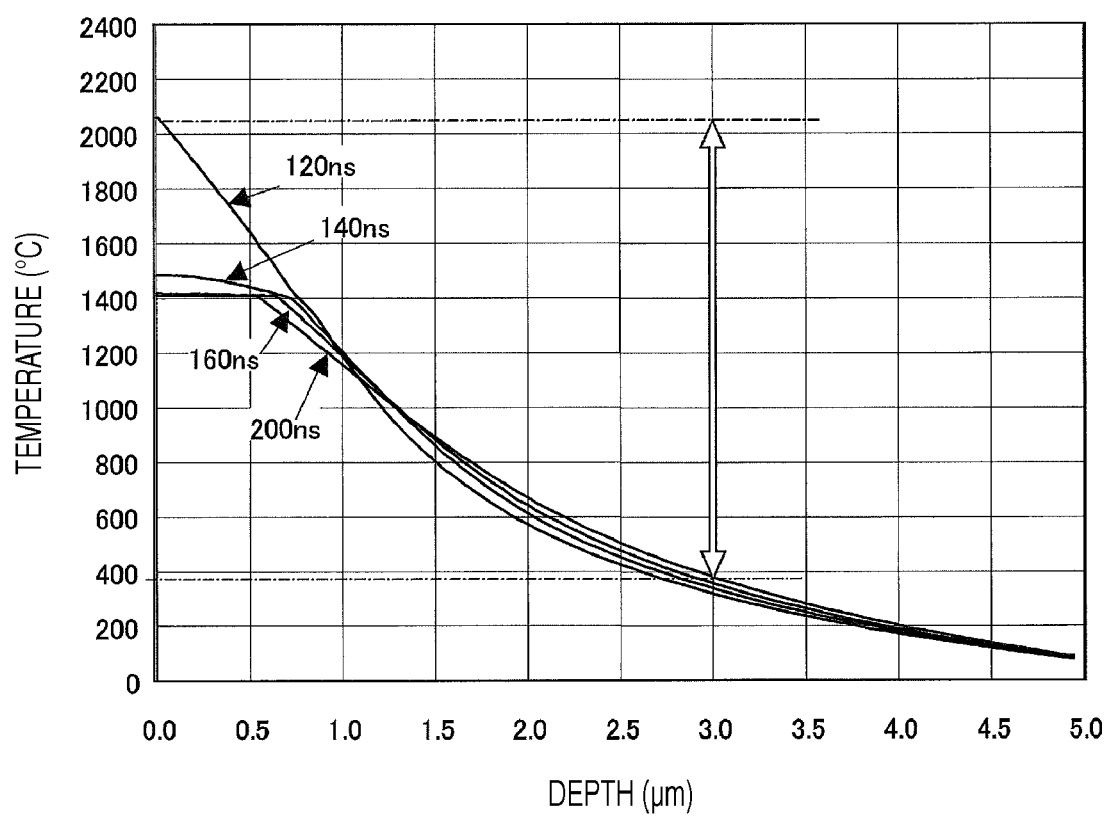
FIG. 38 is a relational graph of temperature and depth relative to light irradiation time.

In FIG. 38, the ordinate indicates temperature and the abscissa indicates depth from the surface of the hafnium oxide film.

As shown in FIG. 38, it was found that, with their radiation time of 120 ns to 200 ns, an area having the temperature equal to or lower than 400° C. was an area deeper than 3 μm.

For example, according to condition setting under which the temperature of the surface of a hafnium oxide film was set to be equal to or higher than 1400° C. when light having the wavelength of 528 nm was irradiated for 800 ns, 1200 ns, and 1600 ns, a temperature distribution in a depth direction from the surface of the hafnium oxide film was calculated by simulation. A result of the simulation is shown in FIG. 39.

Figure 39:
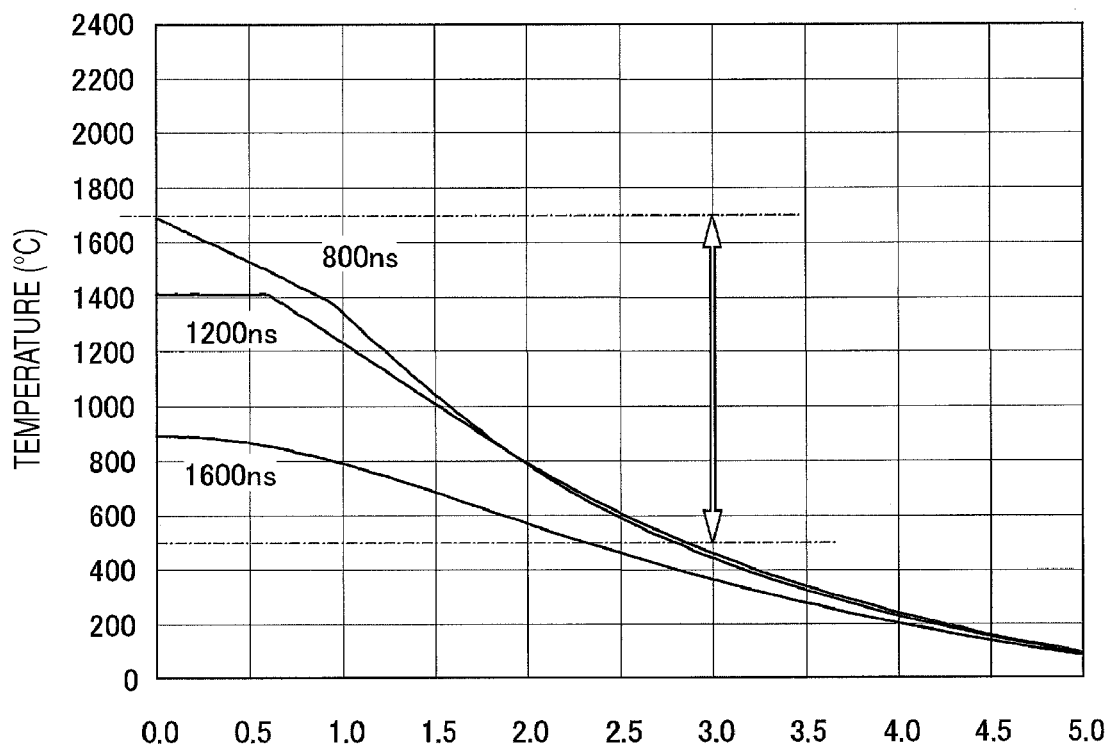
FIG. 39 is a relational graph of temperature and depth relative to light irradiation time.

In FIG. 39, the ordinate indicates temperature and the abscissa indicates depth from the surface of the hafnium oxide film.

As shown in FIG. 39, it was found that, with the irradiation time of 800 ns to 1200 ns, an area having the temperature equal to or lower than 400° C. was an area deeper than 3 μm.

According to a simulation result, irradiation time needs to be equal to or shorter than 1200 ns for light irradiation to set the temperature of the surface of the hafnium oxide film 22Hf formed on the surface side of the semiconductor substrate 11 via the silicon oxide film 21Si to be equal to or higher than 1400° C. and the temperature of the wiring layer 63 formed on the rear surface side of the semiconductor substrate 11 to be equal to or lower than 400° C.

Therefore, in the light irradiation treatment, light irradiation time is preferably set to be equal to or shorter than 1 ms. It is seen that a temperature difference between the wiring layer 63 and the surface of the hafnium oxide film 22Hf is larger as the irradiation time is shorter.

According to the simulation result, a condition for efficiently using, for crystallization of the hafnium oxide film 22Hf, light irradiated to keep the wiring layer 63 at the temperature equal to or lower than 400° C. and heating and crystallizing the hafnium oxide film 22Hf was checked.

Light having wavelength, penetration length "d" of which into the semiconductor substrate 11 of monocrystal silicon is equal to or smaller than 3 μm, is used. The penetration length "d" is defined as $d=\lambda/(4\pi k)$.

When the light is irradiated, absorption of the light and heat generation occur in a portion near the silicon oxide film 21Si in the semiconductor substrate 11 of monocrystal silicon. The hafnium oxide film 22Hf is heated by heat conduction from the semiconductor substrate 11 side and crystallized. The irradiated light does not reach a portion near the wiring layer 63 in the semiconductor substrate 11 of monocrystal silicon. Therefore, the temperature of the wiring layer 63 can be kept low, for example, at the temperature equal to or lower than 400° C., preferably, equal to or lower than 200° C.

As an example, when the light has the wavelength λ of 527 nm, the extinction coefficient "k" of the hafnium oxide film 22Hf is 0, the extinction coefficient "k" of silicon oxide is 0, and the extinction coefficient "k" of silicon is 0.03. Therefore, there is no loss of the incident light in the hafnium oxide film 22Hf and the silicon oxide film 21Si.

On the other hand, there is a loss of the incident light in the semiconductor substrate 11 of monocrystal silicon. Since the penetration length of the light $d=\lambda/(4\pi k)$ is 1.3 μm, when it is assumed that the thickness of the semiconductor substrate 11 of monocrystal silicon is 5 μm, the influence of the irradiated light can be neglected in the wiring layer 63. In a simulation taking into account heat conduction, as in the simulation described above, when the penetration length "d" is equal to or smaller than 5 μm, the temperature of the wiring layer 63 is equal to or lower than 200° C.

In a sample of the hafnium oxide film 22Hf formed in the thickness of 2.5 nm, when a pulse laser beam having the wavelength λ of 527 nm was irradiated for irradiation time of 150 ns, crystallization of the hafnium oxide film 22Hf could be confirmed.

Alternatively, light having wavelength, penetration length "d" of which into the hafnium oxide film 22Hf is equal to or smaller than 60 nm, is used as light irradiated in order to keep the wiring layer 63 at the temperature equal to or lower than 400° C. and heat and crystallize the hafnium oxide film 22Hf. The penetration length "d" is defined as $d=\lambda/(4\pi k)$.

Since most of the irradiated light is absorbed by the hafnium oxide film 22Hf, light entering the semiconductor substrate 11 of monocrystal silicon can be reduced.

Even if there is some heat conduction from the hafnium oxide film 22Hf or the silicon oxide film 21Si to the semiconductor substrate 11 of monocrystal silicon, the temperature of the wiring layer 63 can be kept low.

As an example, when the irradiated light has the wavelength λ of 200 nm, if the refractive index "n" of the hafnium oxide film 22Hf is set to 2.3 (the extinction coefficient "k" is set to 0.3), the refractive index "n" of the silicon oxide film 21Si is set to 1.5, and the refractive index "n" of monocrystal silicon is set to 0.9, there is a loss of incident light in the hafnium oxide film 22Hf and the silicon oxide film 21Si and the penetration length of light d=λ/(4πk) is 53 nm. Therefore, it is possible to reduce light passing through the hafnium oxide film 22Hf if the thickness of the hafnium oxide film 22Hf is set to 60 nm.

It is efficient to optimize the thickness "t" of the silicon oxide film 21Si using the principle of interference such that more light is concentrated on the hafnium oxide film 22Hf. An example of desirable thickness "t" of the silicon oxide film 21Si at the refractive index described above is λ/2n=66 nm (n is the refractive index of silicon oxide).

A relation among the refractive indexes of the respective films that condense the light irradiated on the hafnium oxide film 22Hf is explained with reference to a sectional view of a schematic configuration in FIG. 40.

Figure 40:
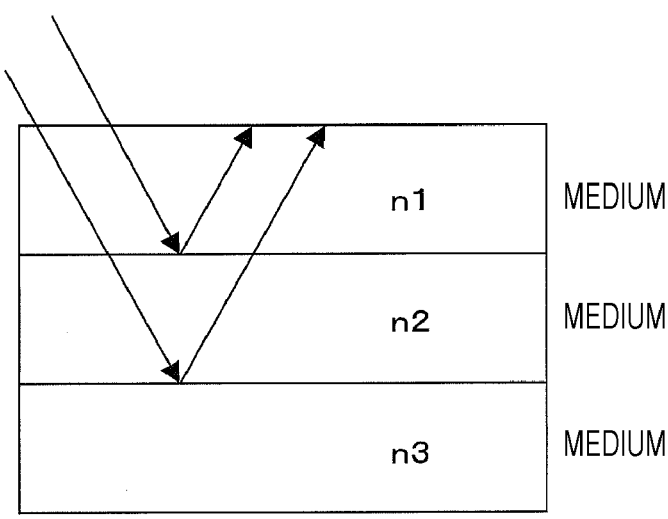
FIG. 40 is a schematic sectional view for explaining an interference condition relative to a refractive index.

As shown in FIG. 40, the refractive index of a medium 1 is represented as $n_1$, the refractive index of a medium 2 is represented as $n_2$, and the refractive index of a medium 3 is represented as $n_3$.

To cause lights irradiated on the medium 1 to intensity each other in the medium 1, in a relation of $n_1>n_2>n_3$ or $n_1n_2<n_3$, the thickness "t" of the medium 2 is $(\lambda/2n_2)m$ (m is a natural number) according to an interference condition.

In a relation of $n_1<n_2>n_3$ or $n_1>n_2<n_3$, the thickness "t" of the medium 2 is $\lambda/4n_2+(\lambda/2n_2)m$ (m is a natural number).

When light having the wavelength λ of 200 nm is used as irradiated light, if it is assumed that the medium 1 is the hafnium oxide film 22Hf, the medium 2 is a silicon oxide film, and the medium 3 is the semiconductor substrate 11 of monocrystal silicon, since $n_1>n_2>n_3$, desired thickness "t" of the silicon oxide film 21Si is $(\lambda/2n_2)_m$, (m=1), =66 nm.

In this way, it is preferable to select the thickness of the silicon oxide film 21Si such that light is condensed on the hafnium oxide film 22Hf.

As explained above, in order to change the hafnium oxide film 22Hf in the non-crystal state to a hafnium oxide film in the crystal state, it is preferable to perform light irradiation in extremely short time equal to or shorter than 1 ms. The irradiation time of light is set to be equal to or smaller than 1 ms because, if the irradiation time is long, the temperature of the wiring layer 63 is raised by the heat conduction of the semiconductor substrate 11 of monocrystal silicon and it is difficult to heat only the hafnium oxide film 22Hf.

Thereafter, formation of a rear side electrode, formation of a color filter layer, formation of a condensing lens (an on-chip lens), and the like are performed.

In the explanation of the ninth embodiment, the examples of the wavelength of the light used for light irradiation are 528 nm and 200 nm. However, the wavelength of light that can be used for light irradiation is not limited to these wavelengths. It is possible to use ultraviolet rays including a far ultraviolet ray to a near ultraviolet ray, visible rays, and infrared rays including a near infrared ray to an infrared ray. In the case of the infrared ray including the infrared ray to the far infrared ray, it is necessary to set the irradiation time to extremely short time of about several tens ns and increase power.

Figure 41:
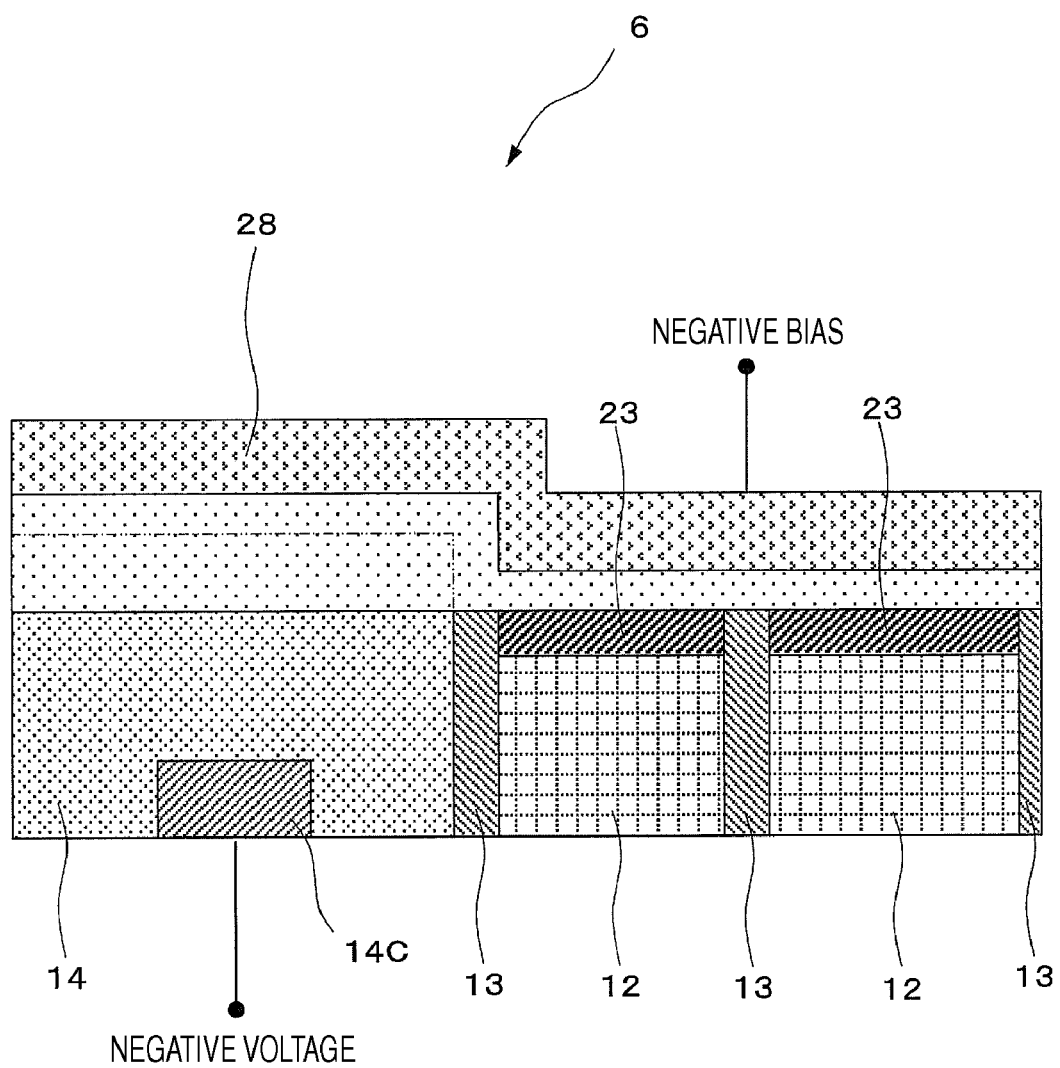
FIG. 41 is a sectional view of a main part configuration of a solid-state imaging device (a second solid-state imaging device) according to the first embodiment.

A solid-state imaging device (a second solid-state imaging device) according to the first embodiment is explained with reference to a sectional view of a main part configuration in FIG. 41. In FIG. 41, a light shielding film that shields a part of a light-receiving section and a peripheral circuit section, a color filter layer that splits light made incident on the light-receiving section, a condensing lens that condenses the incident light on the light-receiving section, and the like are not shown.

As shown in FIG. 41, a solid-state imaging device 6 has, in the semiconductor substrate (or the semiconductor layer) 11, the light-receiving sections 12 that photoelectrically convert incident light and has, on a side of the light-receiving sections 12, the peripheral circuit section 14 in which peripheral circuits (e.g., the circuit 14C) is formed via the pixel separation area 13. An insulating film 27 is formed on the light-receiving surfaces 12s of the light-receiving sections (including the hole accumulation layers 23 explained later) 12. The insulating film 27 is formed by, for example, a silicon oxide ($SiO_2$) film. A film 28 that suppress negative voltage is formed on the insulating film 27.

In the figure, the insulating film 27 is formed to be thicker on the peripheral circuit section 14 than on the light-receiving sections 12 such that a distance from the surface of the peripheral circuit section 14 to the film 28 is longer than a distance from the surfaces of the light-receiving sections 12 to the film 28.

When the insulating film 27 is formed by, for example, the silicon oxide film, on the light-receiving sections 12, the insulating film 27 has an effect same as that of the film 21 for reducing interface state density explained above. Therefore, the insulating film 27 on the light-receiving sections 12 is preferably formed in the thickness, for example, equal to or larger than one atom layer and equal to or smaller than 100 nm.

Consequently, when negative voltage is applied to the film 28 to which negative voltage is applied, the hole accumulation layers 23 are formed on the light-receiving surfaces side of the light-receiving sections 12.

In the peripheral circuits of the peripheral circuit section 14, for example, when the solid-state imaging device 6 is a CMOS image sensor, there is a pixel circuit including transistors such as a transfer transistor, a reset transistor, an amplification transistor, and a selection transistor.

The peripheral circuits include a driving circuit that performs an operation for reading out a signal in a readout row of a pixel array section including the plural light-receiving sections 12, a vertical scanning circuit that transfers the read-out signal, a shift register or an address decoder, and a horizontal scanning circuit as well.

In the peripheral circuits of the peripheral circuit section 14, for example, when the solid-state imaging device 6 is a CCD image sensor, there are a readout gate that reads out photoelectrically-converted signal charges from a light-receiving section to a vertical transfer gate, a vertical-charge transfer section that transfers the read-out signal charges in a vertical direction. The peripheral circuits include a horizontal-charge transfer section as well.

The film 28 to which negative voltage is applied is formed by, for example, a film having conductivity transparent to incident light, for example, a conductive film transparent to visible light. As such a film, an indium tin oxide film, an indium zinc oxide film, an indium oxide film, a tin oxide film, a gallium zinc oxide film, and the like can be used.

On the film 28 to which negative voltage is applied in the solid-state imaging device 6, a light shielding film that shields a part of the light-receiving sections 12 and the peripheral circuit section 14, a color filter layer that splits light made incident on at least the light-receiving sections 12, a condensing lens that condenses the incident light on the light-receiving sections 12, and the like are provided. As an example, as the configuration, the configuration of any one of the solid-state imaging devices 1, 2, and 3 can also be applied.

In the solid-state imaging device (the second solid-state imaging device) 6, since the film 28 to which negative voltage is applied is formed on the insulating film 27 formed on the light-receiving surfaces 12s of the light-receiving sections 12, hole accumulation layers are sufficiently formed in interfaces on the light-receiving surfaces 12s side of the light-receiving sections 12 by an electric field generated when negative voltage is applied to the film 28 to which negative voltage is applied.

Therefore, the generation of charges (electrons) from the interfaces is suppressed. Even if charges (electrons) are generated, since the charges flows in the hole accumulation layers 23 in which a large number of holes are present without flowing into charge accumulation portions forming wells of potential in the light-receiving sections, the charges (the electrons) can be eliminated.

Therefore, it is possible to prevent the charges due to the interfaces from changing to dark currents to be detected by the light-receiving sections 12 and suppress the dark currents due to the interface state density.

Moreover, since the insulating film 27 functioning as a film for reducing interface state density is formed on the light-receiving surfaces 12s of the light-receiving sections 12, the generation of electrons due to interface state density is further suppressed. Therefore, electrons due to interface state density are prevented from flowing into the light-receiving sections 12 as dark currents.

As shown in the figure, a distance from the surface of the peripheral circuit section 14 to the film 28 to which negative voltage is applied is formed larger than a distance from the surface of the light-receiving sections 12 to the film 28 by the insulating film 27. Therefore, an electric field generated when negative voltage is applied to the film 28 is prevented from affecting the peripheral circuit section 14. This makes it possible to eliminate a malfunction of the circuits in the peripheral circuit section 14.

Figure 42:
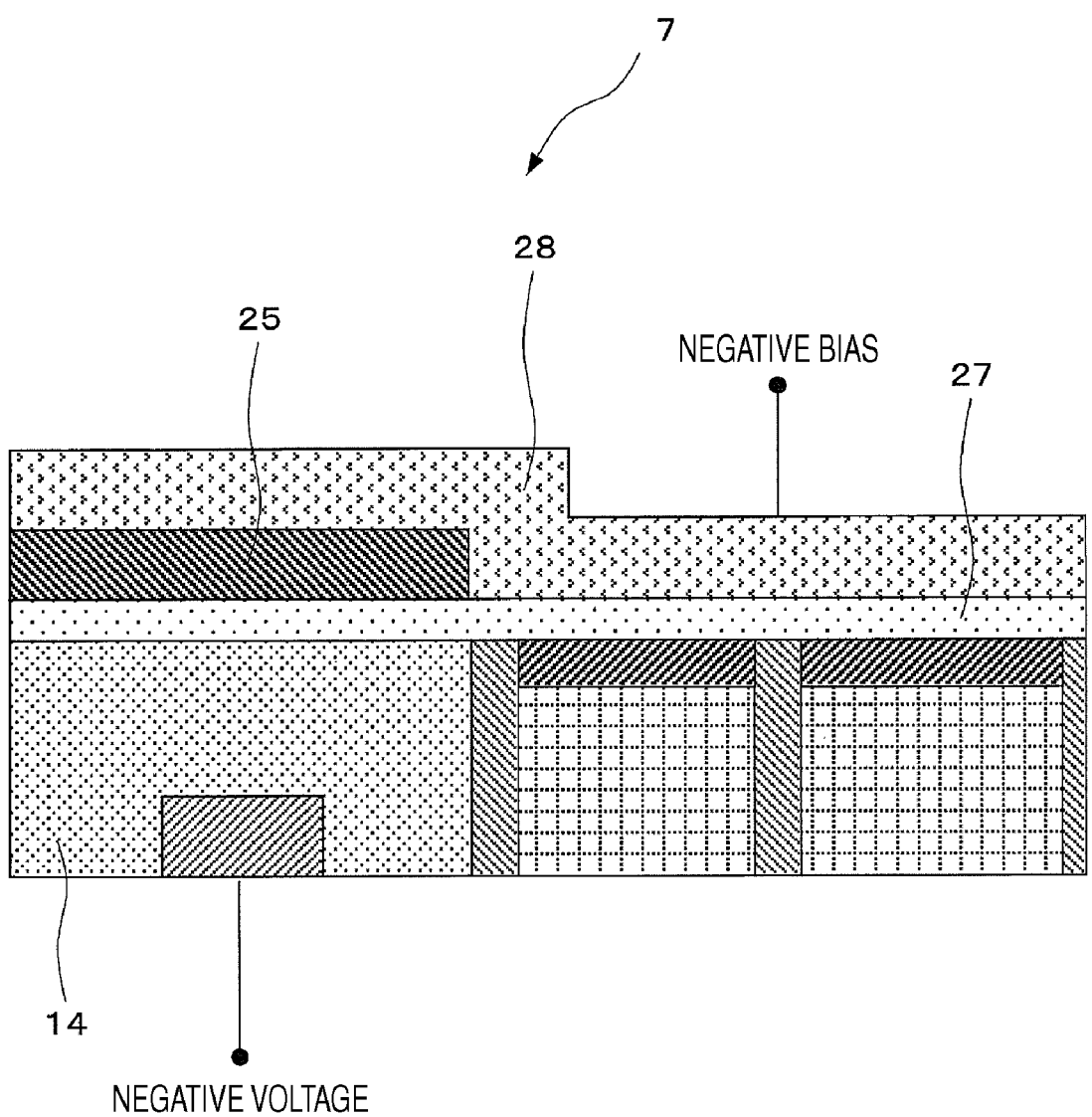
FIG. 42 is a sectional view of a main part configuration of a solid-state imaging device (a second solid-state imaging device) according to the second embodiment.

A solid-state imaging device (a second solid-state imaging device) according to the second embodiment is explained with reference to a sectional view of a main part configuration in FIG. 42. In FIG. 42, a light shielding film that shields a part of a light-receiving section and a peripheral circuit section, a color filter layer that splits light made incident on the light-receiving section, a condensing lens that condenses the incident light on the light-receiving section, and the like are not shown.

As shown in FIG. 42, in a solid-state imaging device 7, the film 25 for separating a film to which negative voltage is applied and a light-receiving surface is formed on the peripheral circuit section 14, substantially, between the insulating film 27 and the film 28 to which negative voltage is applied in the solid-state imaging device 6. The film 25 desirably has positive fixed charges to cancel the influence of the negative voltage. The film 25 is hereinafter referred to as film having positive fixed charges.

The film 25 having positive fixed charges only has to be formed between the peripheral circuit section 14 and the film 28 to which negative voltage is applied and may be formed on the insulating film 27 or under the insulating film 27.

In the figure, the insulating film 27 is formed by a film having uniform thickness. However, as in the solid-state imaging device 6, the insulating film 27 may be an insulating film having larger thickness on the peripheral circuit section 14 than on the light-receiving section 12.

As an example of the film 25 having positive fixed charges, there is a silicon nitride film.

Since the film 25 having positive fixed charges is formed between the peripheral circuit section 14 and the film 28 to which negative voltage is applied, a negative electric field generated when negative voltage is applied to the film 28 to which negative voltage is applied is reduced by the positive fixed charges in the film 25 having positive fixed charges. Therefore, the peripheral circuit 14 is not affected by the negative electric field.

Therefore, a malfunction of the peripheral circuit section 14 due to the negative electric field can be prevented. This improves reliability of the peripheral circuit section 14.

As described above, the configuration in which the film 25 having positive fixed charges is formed between the peripheral circuit section 14 and the film 28 to which negative voltage is applied can be applied to the solid-state imaging device 6 as well. Effects same as those of the solid-state imaging device 7 can be obtained.

Figure 45:
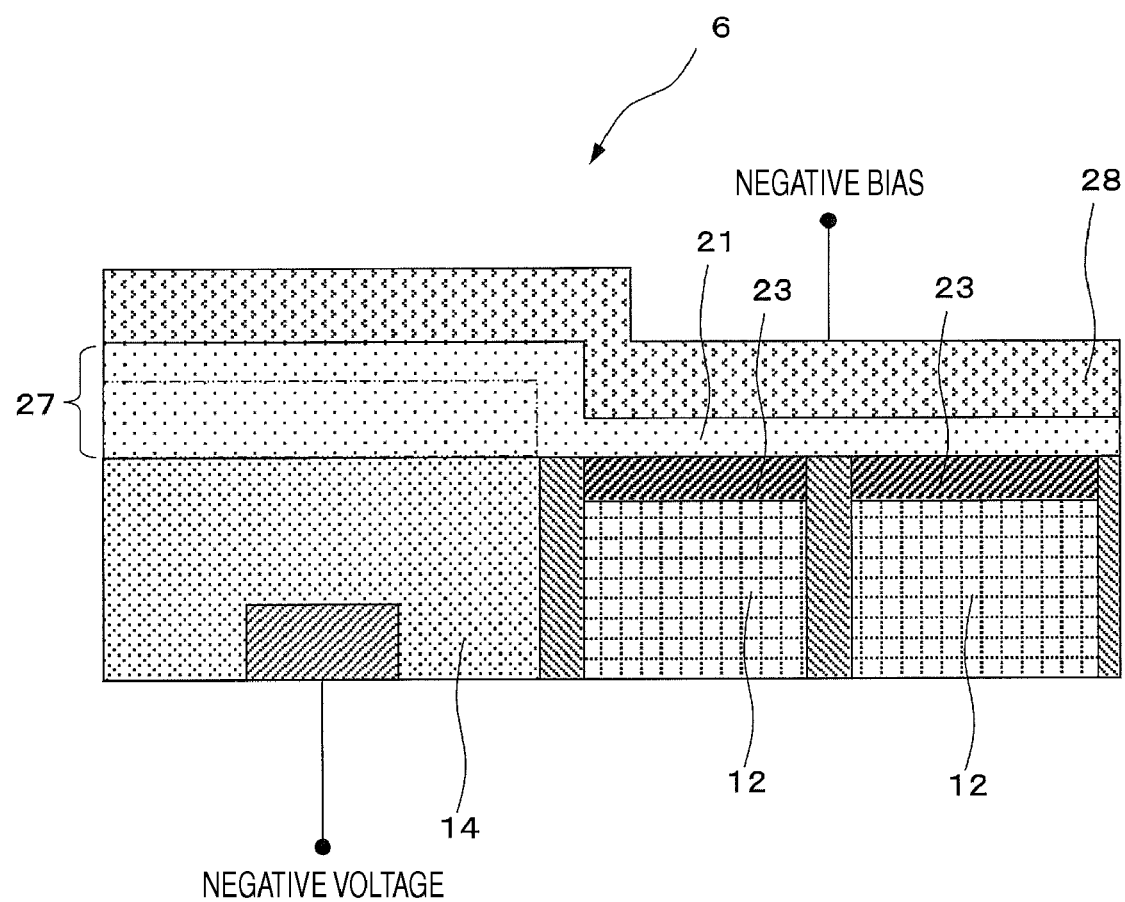
FIG. 45 is a sectional view of the manufacturing process of the manufacturing method (the second manufacturing method) for a solid-state imaging device according to the first embodiment.

A manufacturing method (a second manufacturing method) for a solid-state imaging device according to the first embodiment is explained with reference to sectional views of a manufacturing process showing a main part in FIG. 43 to FIG. 45. In FIG. 43 to FIG. 45, as an example, a manufacturing process for the solid-state imaging device 6 is shown.

As shown in (1) in FIG. 43, the light-receiving sections 12 that photoelectrically convert incident light, the pixel separation areas 13 that separate the light-receiving sections 12, the peripheral circuit section 14 in which peripheral circuits (e.g., a circuit 14C) are formed with respect to the light-receiving section 12 via the pixel separation area 13, and the like are formed in the semiconductor substrate (or the semiconductor layer) 11. An existing manufacturing method is used for the manufacturing method. An insulating film 29 having permeability to the incident light is formed. The insulating film 29 is formed by, for example, a silicon oxide film.

As shown in (2) in FIG. 43, a resist mask 53 is formed on the insulating film 29 above the peripheral circuit section 14 by the resist application and the lithography technique.

As shown in (3) in FIG. 44, the insulating film 29 is etched by using the resist mask 53 (see (2) in FIG. 43) to leave the insulating film 29 on the peripheral circuit section 14. Thereafter, the resist mask 53 is removed.

As shown in (4) in FIG. 44, the film 21 for reducing interface state density that covers the insulating film 26 is formed on the light-receiving surfaces 12s of the light-receiving sections 12, actually, on the semiconductor substrate 11. The film 21 for reducing interface state density is formed by, for example, a silicon oxide ($SiO_2$) film. Consequently, the insulating film 27 is formed by the insulating film 29 and the film 21 for reducing interface state density.

As shown in FIG. 45, the film 28 to which negative voltage is applied is formed on the film 21 for reducing interface state density. When negative voltage is applied to the film 28 to which negative voltage is applied, the hole accumulation layers 23 are formed on the light-receiving surfaces side of the light-receiving sections 12.

Therefore, at least on the light-receiving sections 12, the film 21 for reducing interface state density needs to be formed, by the negative voltage applied to the film 28 to which negative voltage is applied, in thickness enough for forming the hole accumulation layers 23 on the light-receiving surfaces 12s side of the light-receiving sections 12. The film thickness is, for example, equal to or larger than one atom layer and equal to or smaller than 100 nm.

The film 28 to which negative voltage is applied is formed by, for example, a film having conductivity transparent to incident light, for example, a conductive film transparent to visible light. As such a film, an indium tin oxide film, an indium zinc oxide film, an indium oxide film, a tin oxide film, a gallium zinc oxide film, and the like can be used.

On the film 28 to which negative voltage is applied in the solid-state imaging device 6, a light shielding film that shields a part of the light-receiving sections 12 and the peripheral circuit section 14, a color filter layer that splits light made incident on at least the light-receiving sections 12, a condensing lens that condenses the incident light on the light-receiving sections 12, and the like are formed.

As a manufacturing method therefor, as an example, any one of the methods (the first manufacturing methods) for a solid-state imaging device according to the embodiments described above can also be used.

In the manufacturing method (the second manufacturing method) for the solid-state imaging device 6, the film 28 to which negative voltage is applied is formed on the insulating film 27 formed on the light-receiving surfaces 12s of the light-receiving sections 12. Therefore, the hole accumulation layers 23 are sufficiently formed in the interfaces on the light-receiving surfaces 12s side of the light-receiving sections 12 by an electric field generated when negative voltage is applied to the film 28 to which negative voltage is applied.

Therefore, charges (electrons) generated from the interfaces can be suppressed. Even if charges (electrons) are generated from the interfaces, since the charges (electrons) flow in the hole accumulation layers 23 in which a large number of holes are present without flowing into charge accumulation portions forming wells of potential in the light-receiving sections 12, the charges (the electrons) can be eliminated.

Therefore, it is possible to prevent the charges due to interfaces from changing to dark currents to be detected by the light-receiving sections 12. Dark currents due to interface state density are suppressed.

Moreover, since the film 21 for reducing interface state density is formed on the light-receiving surfaces 12s of the light-receiving sections 12, the generation of electrons due to the interface state density is further suppressed. Therefore, the electrons due to the interface state density are prevented from flowing into the light-receiving sections 12 as dark currents.

As shown in the figure, a distance from the surface of the peripheral circuit section 14 to the film 28 to which negative voltage is applied is formed larger than a distance from the surfaces of the light-receiving sections 12 to the film 28 and the thickness of the insulating film 27 on the peripheral circuit section 14 is formed larger than the thickness of the insulating film 27 on the light-receiving sections 12 by the insulating film 27.

Therefore, an electric field generated when negative voltage is applied to the film 28 is prevented from affecting the peripheral circuit section 14. In other words, since field intensity is reduced and holes are prevented from being accumulated on the surface of the peripheral circuit section 14, it is possible to eliminate a malfunction of the circuits in the peripheral circuit section 14.

A manufacturing method (a second manufacturing method) for a solid-state imaging device according to the second embodiment is explained with reference to sectional views of a manufacturing process showing a main part in FIG. 46 to FIG. 47. In FIG. 46 to FIG. 47, as an example, a manufacturing process for the solid-state imaging device 7 is shown.

As shown in (1) in FIG. 46, the light-receiving sections 12 that photoelectrically convert incident light, the pixel separation areas 13 that separate the light-receiving sections 12, the peripheral circuit section 14 in which peripheral circuits (e.g., a circuit 14C) are formed with respect to the light-receiving section 12 via the pixel separation area 13, and the like are formed in the semiconductor substrate (or the semiconductor layer) 11. An existing manufacturing method is used for the manufacturing method. The insulating film 27 having permeability to the incident light is formed. The insulating film 27 is formed by, for example, a silicon oxide film. Moreover, the film 25 having positive fixed charges is formed on the insulating film 27. The film 25 having positive fixed charges is formed by, for example, a silicon nitride film.

As shown in (2) in FIG. 46, a resist mask 54 is formed on the film 25 having positive fixed charges above the peripheral circuit section 14 by the resist application and the lithography technique.

As shown in (3) in FIG. 47, the film 25 having positive fixed charges is etched by using the resist mask 54 (see (2) in FIG. 46) to leave the film 25 having positive fixed charges on the peripheral circuit section 14. Thereafter, the resist mask 54 is removed.

As shown in (4) in FIG. 47, the film 28 to which negative voltage is applied is formed on the insulating film 27 and the film 25 having positive fixed charges. When negative voltage is applied to the film 28 to which negative voltage is applied, the hole accumulation layers 23 are formed on the light-receiving surfaces side of the light-receiving sections 12. It is possible to cause the insulating film 27 to function as a film for reducing interface state density.

Therefore, at least on the light-receiving sections 12, the insulating film 27 needs to be formed, by the negative voltage applied to the film 28 to which negative voltage is applied, in thickness enough for forming the hole accumulation layers 23 on the light-receiving surfaces 12s side of the light-receiving sections 12. The film thickness is, for example, equal to or larger than one atom layer and equal to or smaller than 100 nm.

The film 28 to which negative voltage is applied is formed by, for example, a film having conductivity transparent to incident light, for example, a conductive film transparent to visible light. As such a film, an indium tin oxide film, an indium zinc oxide film, an indium oxide film, a tin oxide film, a gallium zinc oxide film, and the like can be used.

On the film 28 to which negative voltage is applied in the solid-state imaging device 7, a light shielding film that shields a part of the light-receiving sections 12 and the peripheral circuit section 14, a color filter layer that splits light made incident on at least the light-receiving sections 12, a condensing lens that condenses the incident light on the light-receiving sections 12, and the like are formed.

As a manufacturing method therefor, as an example, any one of the manufacturing methods (the first manufacturing methods) for a solid-state imaging device explained above can also be used.

In the manufacturing method (the second manufacturing method) for the solid-state imaging device 7, the film 28 to which negative voltage is applied is formed on the insulating film 27 formed on the light-receiving surfaces 12s of the light-receiving sections 12. Therefore, the hole accumulation layers 23 are sufficiently formed in the interfaces on the light-receiving surfaces 12s side of the light-receiving sections 12 by an electric field generated when negative voltage is applied to the film 28 to which negative voltage is applied.

Therefore, charges (electrons) generated from the interfaces can be suppressed. Even if charges (electrons) are generated from the interfaces, since the charges (electrons) flow in the hole accumulation layers 23 in which a large number of holes are present without flowing into charge accumulation portions forming wells of potential in the light-receiving sections 12, the charges (the electrons) can be eliminated.

Therefore, it is possible to prevent the charges due to interfaces from changing to dark currents to be detected by the light-receiving sections 12. Dark currents due to interface state density are suppressed.

Moreover, since the film 21 for reducing interface state density is formed on the light-receiving surfaces 12s of the light-receiving sections 12, the generation of electrons due to the interface state density is further suppressed. Therefore, the electrons due to the interface state density are prevented from flowing into the light-receiving sections 12 as dark currents.

Since the film 25 having positive fixed charges is formed between the peripheral circuit section 14 and the film 28 to which negative voltage is applied, a negative electric field generated when negative voltage is applied to the film 28 to which negative voltage is applied is reduced by the positive fixed charges in the film 25 having positive fixed charges. Therefore, the peripheral circuit 14 is not affected by the negative electric field.

Therefore, a malfunction of the peripheral circuit section 14 due to the negative electric field can be prevented. The configuration in which the film 25 having positive fixed charges is formed between the peripheral circuit section 14 and the film 28 to which negative voltage is applied as described above can be applied to the solid-state imaging device 6 as well. Effects same as those in the solid-state imaging device 7 can be obtained.

Figure 48:
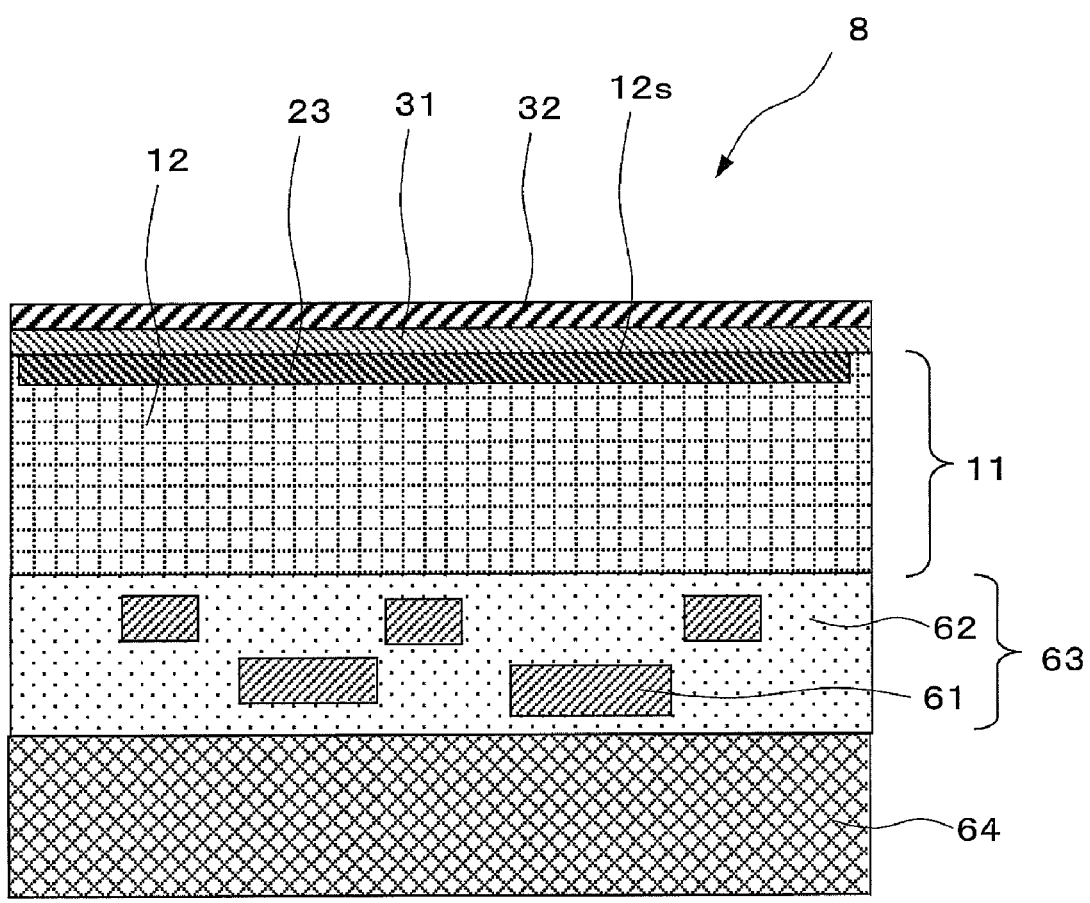
FIG. 48 is a sectional view of a main part configuration of a solid-state imaging device (a third solid-state imaging device) according to an embodiment of the present invention.

A solid-state imaging device (a third solid-state imaging device) according to an embodiment of the present invention is explained with reference to a sectional view of a main part configuration in FIG. 48. In FIG. 48, alight-receiving section is mainly shown. A peripheral circuit section, a wiring layer, a light shielding film that shields a part of the light-receiving section and a peripheral circuit section, a color filter layer that splits light made incident on the light-receiving section, a condensing lens that condenses the incident light on the light-receiving section, and the like are not shown.

As shown in FIG. 48, a solid-state imaging device 8 has, in the semiconductor substrate (or the semiconductor layer) 11, the light-receiving section 12 that photoelectrically converts incident light. An insulating film 31 is formed on the light-receiving surface 12s side of the light-receiving section 12. The insulating film 31 is formed by, for example, a silicon oxide ($SiO_2$) film.

A film 32 having a value of a work function larger than that of the interface on the light-receiving surface 12s side of the light-receiving section 12 that photoelectrically converts incident light (hereinafter referred to as hole accumulation auxiliary film) is formed on the insulating film 31. The hole accumulation layer 23 is formed according to a difference between work functions. The hole accumulation auxiliary film 32 does not need to be electrically connected to other elements and wiring. Therefore, the hole accumulation auxiliary film 32 may be an insulating film or a film having conductivity such as a metal film.

For example, a wiring layer 63 including the wiring 61 in plural layers and the insulating film 62 is formed on the opposite side of the light incidence side of the semiconductor substrate 11 in which the light-receiving section 12 is formed. The wiring layer 63 is supported by a supporting substrate 64.

For example, since the hole accumulation layer 23 is formed of silicon (Si), a value of a work function thereof is about 5.1 eV. Therefore, the hole accumulation auxiliary film 32 only has to be a film having a value of the work function larger than 5.1.

For example, when a metal film is used, according to chronological scientific tables, a value of a work function of an iridium (110) film is 5.42, a value of a work function of an iridium (111) film is 5.76, a value of a work function of a nickel film is 5.15, a value of a work function of a palladium film is 5.55, a value of a work function of an osmium film is 5.93, a value of a work function of a gold (100) film is 5.47, a value of a work function of a gold (110) film is 5.37, and a value of a work function of a platinum film is 5.64. These films can be used for the hole accumulation auxiliary film 32.

Besides these films, any metal film can be used for the hole accumulation auxiliary film 32 as long as the metal film has a value of a work function larger than that of the interface on the light-receiving surface 12s of the light-receiving section 12. A value of a work function of an ITO ($In_2O_3$) used as a transparent electrode is set to 4.8 eV. However, a work function of an oxide semiconductor can be controlled by a film forming method and the introduction of impurities.

The hole accumulation auxiliary film 32 is formed on the light-incidence side. Therefore, it is important to form the hole accumulation auxiliary film 32 in thickness for transmitting incident light. The transmittance of the incident light is preferably as high as possible. For example, the transmittance equal to or higher than 95% is preferably secured.

The hole accumulation auxiliary film 32 only has to be able to use a difference of work functions between the hole accumulation auxiliary film 32 and the surface of the light-receiving section 12. A low resistance value thereof is not limited. Therefore, for example, even when a conductive film is used, it is unnecessary to form the conductive film thick. For example, when incident light intensity is represented as $I_0$ and an absorbance index is represented as $\alpha$ ($\alpha=(4\pi k)/\lambda$, "k" is a Boltzmann's constant, and $\lambda$ is the wavelength of the incident light), light intensity in a depth "z" position is represented by $I(z)=I_0 \exp(-\alpha \cdot z)$. Therefore, when thickness $I(z)/I_0=0.8$ is calculated, for example, the thickness is 1.9 nm for an iridium film, 4.8 nm for a gold film, and 3.4 nm for a platinum film. It is seen that, although the thickness is different depending on a film type, the thickness preferably only has to be equal to or smaller than 2 nm.

The hole accumulation auxiliary film 32 may be an organic film. For example, polysthylenedioxytyiophene can also be used. As described above, the hole accumulation auxiliary film 32 may be a conductive film, an insulating film, or a semiconductor film as long as the film has a value of a work function larger than a value of a work function of the interface on the light-receiving surface 12s side of the light-receiving section 12.

The solid-state imaging device 8 has, on the insulating film 31 formed on the light-receiving section 12, the film (the hole accumulation auxiliary film) 32 having a value of a work function larger than that of the interface on the light-receiving surface 12s side of the light-receiving section 12. Therefore, hole accumulation efficiency of the hole accumulation layer 23 is improved. The hole accumulation layer 23 formed in the interface on the light-receiving side of the light-receiving section 12 can accumulate sufficient holes. Consequently, dark currents are reduced.

Figure 49:
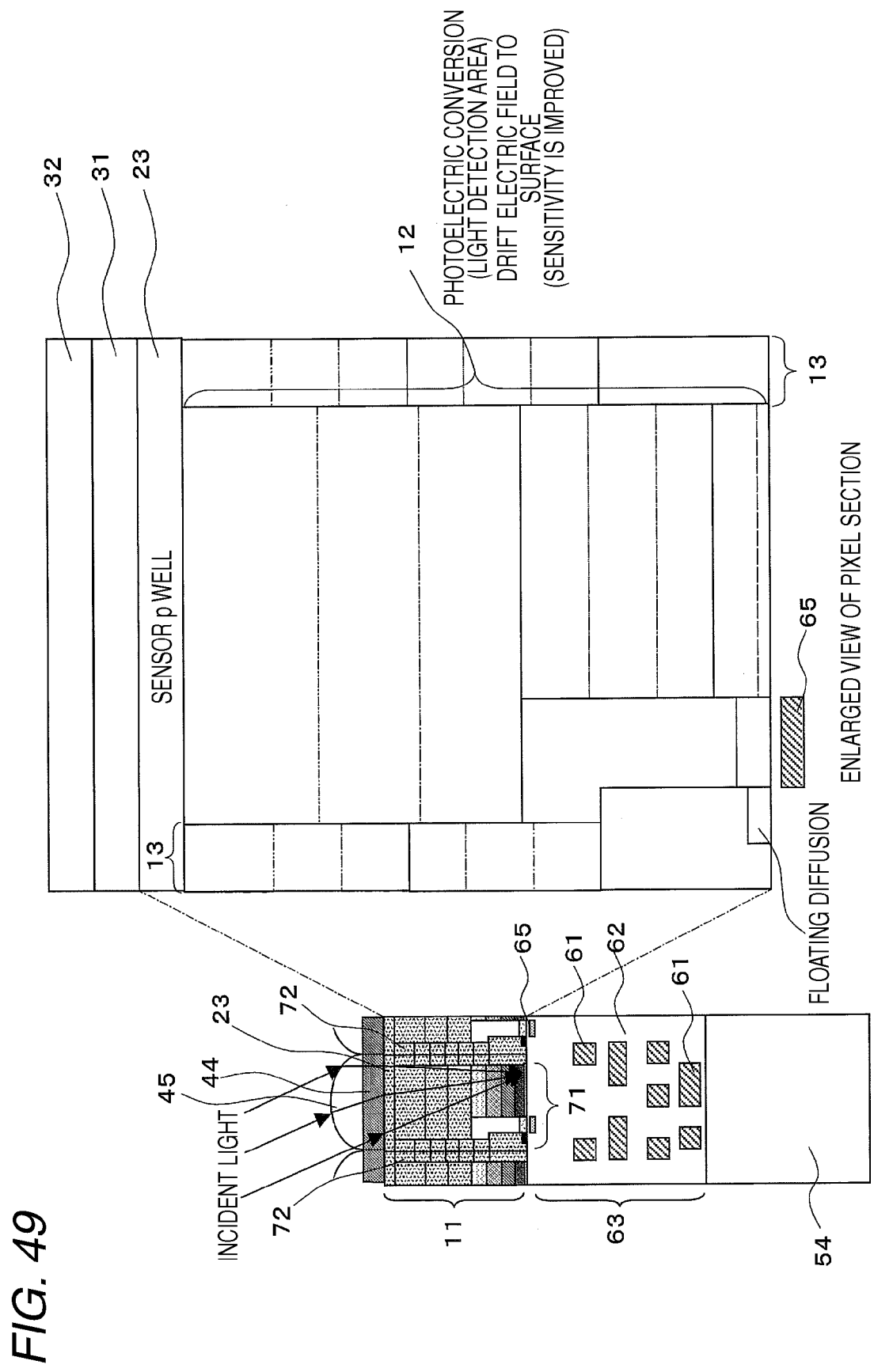
FIG. 49 is a sectional view of a main part configuration of an example of a configuration of a solid-state imaging device in which a hole accumulation auxiliary film is used.

An example of a configuration of a solid-state imaging device employing the hole accumulation auxiliary film 32 is explained with reference to FIG. 49. In FIG. 49, a CMOS image sensor is shown.

As shown in FIG. 49, plural pixel sections 71 having light-receiving sections (e.g., photodiodes) 12 that convert incident light into electric signals, a transistor group 65 (a part of which is shown in the figure) including a transfer transistor, an amplification transistor, and a reset transistor, and the like are formed in the semiconductor substrate 11. For example, a silicon substrate is used as the semiconductor substrate 11. Signal processing sections (not shown) that process signal charges read out from the respective light-receiving sections 12 are also formed.

The pixel separation areas 13 are formed in a part of the periphery of the pixel sections 71, for example, among the pixel sections 71 in a row direction or a column direction.

The wiring layer 63 is formed on a front side of the semiconductor substrate 11 in which the light-receiving sections 12 are formed (in the figure, a lower side of the semiconductor substrate 11). The wiring layer 63 includes the wiring 61 and the insulating films 62 that cover the wiring 61. The supporting substrates 64 are formed in the wiring layers 63. The supporting substrates 64 are formed by, for example, silicon substrates.

In the solid-state imaging device 1, the hole accumulation layers 23 are formed on the rear surface side of the semiconductor substrate 11. The hole accumulation auxiliary films 32 explained above are formed on the upper surfaces of the hole accumulation layers 23 via the insulating films 31. Moreover, the organic color filter layers 44 are formed via insulating films (not shown). The organic color filter layers 44 are formed in association with the light-receiving sections 12. For example, the organic filter layers 44 are formed by arranging organic color filters of blue, red, and green in, for example, a checkered pattern. The condensing lenses 45 that condense incident light on the respective light-receiving sections 12 are formed on the respective organic color filter layers 44.

Figure 50:
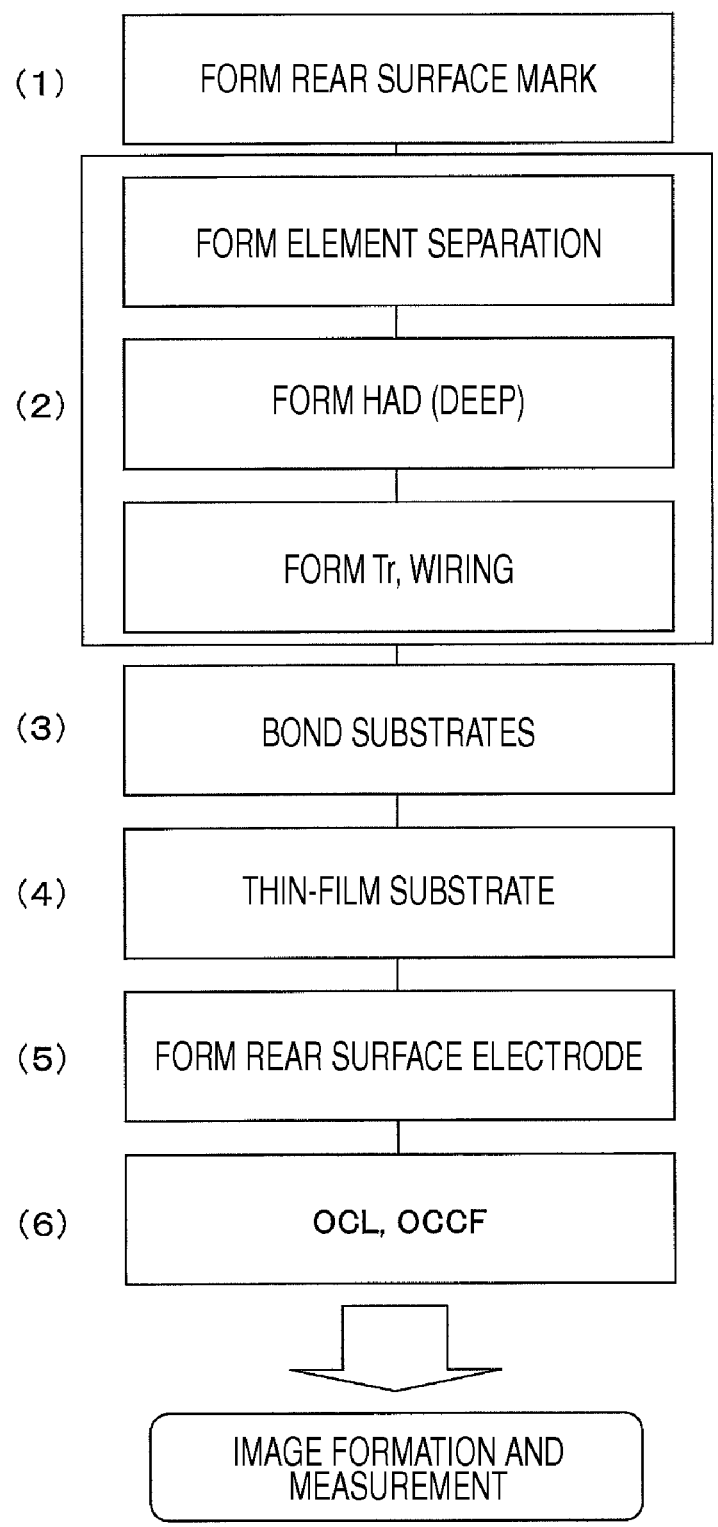
FIG. 50 is a flowchart of a manufacturing method (a third manufacturing method) for a solid-state imaging device according to an embodiment of the present invention.
Figure 51:
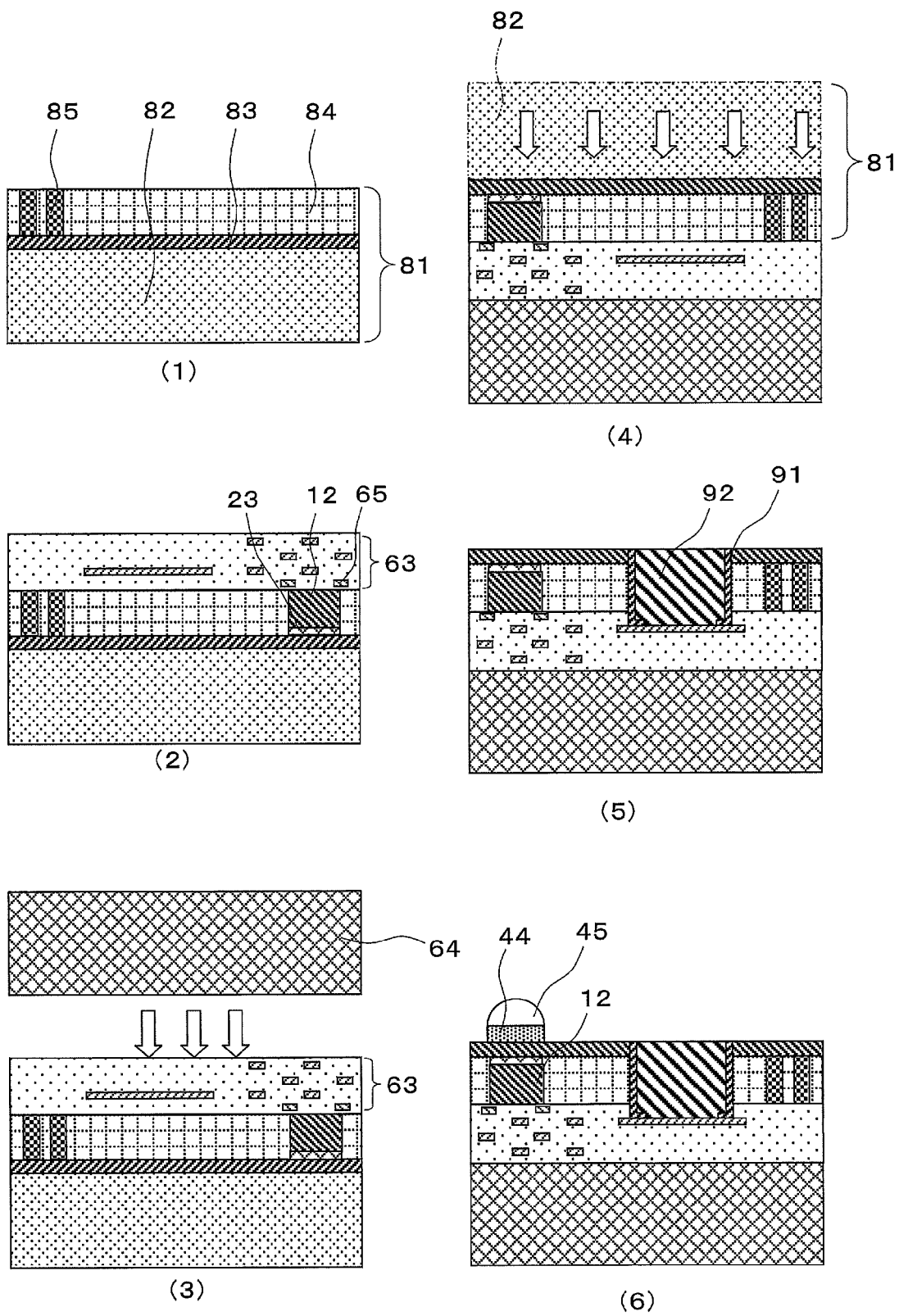
FIG. 51 shows sectional views of a manufacturing process of the manufacturing method (the third manufacturing method) according to the embodiment.

A manufacturing method (a third manufacturing method) for a solid-state imaging device according to the first embodiment is explained with reference to a flowchart in FIG. 50, sectional views of a manufacturing process in FIG. 51, and sectional views of a manufacturing process showing a main part in FIG. 52. In FIG. 50 to FIG. 52, as an example, a manufacturing process for the solid-state imaging device 8 is shown.

As shown in (1) in FIG. 50 and (1) in FIG. 51, first, an SOI substrate 81 in which a silicon layer 84 is formed on a silicon substrate 82 via an insulating layer (e.g., a silicon oxide layer) 83 is prepared. A rear surface mark 85 for alignment is formed in the silicon layer 84.

As shown in (2) in FIG. 50 and (2) in FIG. 51, a pixel separation area (not shown), the hole accumulation layer 23, the light-receiving section 12, the transistor group 65, and the wiring layer 63 are formed in the silicon layer 84 of the SOI substrate 81. The hole accumulation layer 23 may be formed in a process after thin-filming of a substrate.

As shown in (3) in FIG. 50 and (3) in FIG. 51, the wiring layer 63 and the supporting substrate 64 are bonded.

As shown in (4) in FIG. 50 and (4) in FIG. 51, thin-filming of the SOI substrate 81 is carried out. The silicon substrate 82 is removed by, for example, grinding or polishing.

Although not shown in the figure, the hole accumulation layer 23 may be formed by instruction of impurities and activation processing by forming a cap film (not shown) after removing the insulating film 82 of the SOI substrate 81. As an example, a plasma-TEOS silicon oxide film is formed as the cap film in the thickness of 30 nm and the introduction of impurities is performed by ion implantation of boron. As a condition for the ion implantation, for example, implantation energy is set to 20 keV and a dosage is set to $1 \times 10^{13}/\text{cm}^2$.

The activation is preferably performed by annealing at the temperature equal to or lower than 400° C. that does not destroy the bonding of the wiring layer 63 and the supporting substrate 54. The cap film is removed by, for example, fluoric acid treatment. The insulating layer 83 of the SOI substrate 81 may be removed.

In this way, as shown in (1) FIG. 52, the interface 23 on the light-receiving surface side of the light-receiving section is formed on the light-receiving section 12.

As shown in (2) in FIG. 52, the insulating film 31 is formed on the hole accumulation layer 23 (on the light incidence side). As an example, a plasma-TEOS silicon oxide film is formed in the thickness of 30 nm.

As shown in (3) in FIG. 52, a film having a value of a work function larger than that of the interface on the light-receiving surface 12s side of the light-receiving section 12 (a value of a work function is about 5.1 eV), i.e., the hole accumulation auxiliary film 32 is formed on the insulating film 31 (on the light incidence side). As an example, a platinum (Pt) film having a work function of 5.6 eV, which is a metal thin film, is formed in the thickness of 3 nm by sputtering. Candidates of other metal thin films include iridium (Ir), rhenium (Re), nickel (Ni), palladium (Pd), cobalt (Co), ruthenium (Ru), rhodium (Rh), osmium (Os), and gold (Au). Naturally, alloys can also be used.

A material of the hole accumulation auxiliary film 32 may be an ITO ($In_2O_3$) because a value of a work function of the interface on the light-receiving surface side of the light-receiving section is about 5.1 eV in this example. The ITO can have a value of a work function of 4.5 eV to 5.6 eV in a film formation process therefor. Other oxide semiconductors such as semiconductors in which $RuO_2$, $SnO_2$, $IrO_2$, $OSO_2$, ZnO, $ReO_2$, and $MoO_2$ and acceptor impurities are introduced and polysthylenedioxytyiophene (PEDOT) as an organic material can be a material of the hole accumulation auxiliary film 32 because the oxide semiconductors can have a value of a work function larger than 5.1 eV. Examples of a film forming method at the temperature equal to or lower than 400° C. include ALD, CVD, and vapor doping.

As shown in (5) in FIG. 50 and (5) in FIG. 51, a rear surface electrode 92 is formed via a barrier metal 91.

As shown in (6) in FIG. 50 and (6) in FIG. 51, above the light-receiving section 12, the color filter layer 44 is formed and, then, the condensing lens 45 is formed. In this way, the solid-state imaging device 8 is formed.

In the manufacturing method (the third manufacturing method) for a solid-state imaging device, the film having a value of a work function larger than that of the interface on the light-receiving surface 12s side of the light-receiving section 12, i.e., the hole accumulation auxiliary film 32 is formed on the insulating film 31 formed on the light-receiving section 12. Therefore, hole accumulation efficiency of the hole accumulation layer 23 is improved. The hole accumulation layer 23 formed in the interface on the light-receiving surface 12s side of the light-receiving section 12 can accumulate sufficient holes. Consequently, dark currents are reduced.

The hole accumulation auxiliary film 32 only has to be a film that has a value of a work function larger than a value of a work function of the hole accumulation layer 23. Since it is unnecessary to feed an electric current through the hole accumulation auxiliary film 32, the hole accumulation layer 23 may be a conductive film, an insulating film, or a semiconductor film. Therefore, a material having high resistance may be selected for the hole accumulation auxiliary film 32.

An external signal input terminal is also unnecessary for the hole accumulation auxiliary film 32.

The solid-state imaging devices 1 to 8 according to the embodiments can be applied to a back illuminated solid-state imaging device including plural pixel sections having light-receiving sections that convert incident light amounts into electric signals and a wiring layer on one surface side of a semiconductor substrate in which the respective pixel sections are formed, wherein light made incident from the opposite side of the surface on which the wiring layer is formed is received by the respective light-receiving sections. Naturally, the solid-state imaging devices 1 to 8 according to the embodiments can also be applied to a front illuminated solid-state imaging device in which a wiring layer is formed on a light-receiving surface side and an optical path of incident light made incident on light-receiving sections is formed as a non-formation area of the wiring layer not to block the incident light made incident on the light-receiving sections.

An imaging apparatus according to an embodiment of the present invention is explained with reference to a block diagram of FIG. 53. Examples of the imaging apparatus include a video camera, a digital still camera, and a camera of a cellular phone.

Figure 53:
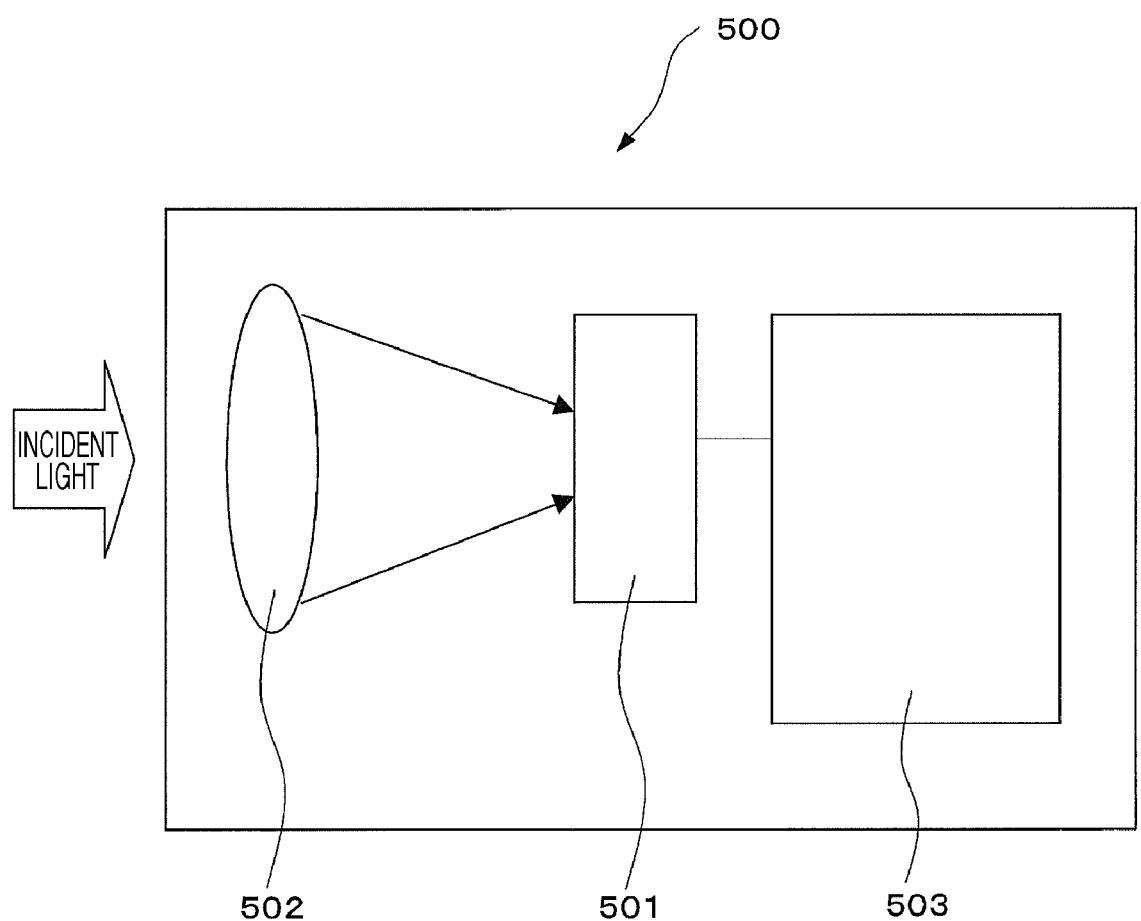
FIG. 53 is a block diagram of an imaging apparatus according to an embodiment of the present invention.

As shown in FIG. 53, an imaging apparatus 500 includes a solid-state imaging device (not shown) in an imaging unit 501. A focusing optical system 502 that focuses an image is provided on a light condensing side of the imaging unit 501. A signal processing unit 503 including a driving circuit that drives the imaging unit 501 and a signal processing circuit that processes a signal photoelectrically converted by the solid-state imaging device into an image is connected to the imaging unit 501. The image signal processed by the signal processing unit 503 can be stored by an image storing unit (not shown). In such an imaging device 500, the solid-state imaging devices 1 to 8 explained in the embodiments can be used as the solid-state imaging device.

In the imaging apparatus 500 according to this embodiment, the solid-state imaging device 1 or the solid-state imaging device 2 according to the embodiment of the present invention or the solid-state imaging device having the condensing lens, in which the reflective film is formed, shown in FIG. 4 is used. Therefore, as explained above, since the solid-state imaging device that can improve color reproducibility and resolution is used, there is an advantage that the imaging apparatus 500 can record a high-definition video.

The imaging apparatus 500 according to this embodiment is not limited to the configuration described above. The imaging apparatus 500 can be applied to an imaging apparatus of any configuration as long as the solid-state imaging device is used.

The solid-state imaging devices 1 to 8 may be formed as one chip or may be a module-like form having an imaging function in which an imaging unit, a signal processing unit, and an optical system are collectively packaged.

The present invention can be applied not only to a solid-state imaging device but also to an imaging apparatus. When the present invention is applied to the imaging apparatus, the imaging apparatus can obtain an effect of high image quality. The imaging apparatus indicates, for example, a camera and a portable apparatus having an imaging function. "Imaging" includes not only capturing of an image during normal camera photographing but also fingerprint detection and the like in a broader sense.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device having a light-receiving section that photoelectrically converts incident light, the solid-state imaging device comprising:
   a peripheral circuit section in which peripheral circuits are formed, the peripheral circuit section provided on a side of the light-receiving section;
   an insulating film formed on the light-receiving section and the peripheral circuit section;
   a film having negative fixed charges formed on the insulating film; and
   a hole accumulation layer formed on a light-receiving surface side of the light-receiving section below the insulating film, wherein
   the insulating film is formed between a surface of the peripheral circuit section and the film having negative fixed charges such that a distance from the surface of the peripheral circuit section to the film having negative fixed charges is larger than a distance from a surface of the light-receiving section to the film having negative fixed charges to reduce an influence of the film having negative fixed charges on the peripheral circuit section.

2. A solid-state imaging device according to claim 1, wherein the film having negative fixed charges is a hafnium oxide film, an aluminum oxide film, a zirconium oxide film, a tantalum oxide film, or a titanium oxide film.

3. A solid-state imaging device according to claim 1, wherein the insulating film includes a silicon oxide film.

4. A solid-state imaging device according to claim 1, wherein the insulating film formed between the peripheral circuit section and the film having negative fixed charges includes a laminated structure of one or plural kinds of films among a silicon oxide film, a silicon nitride film, and a silicon oxide nitride film.

5. A solid-state imaging device according to claim 1, the solid-state imaging device further including:
   plural pixel sections having respective light-receiving sections that convert incident light into electric signals; and
   a wiring layer on a surface side of a semiconductor substrate formed with the pixel sections,
   wherein,
   the solid-state imaging device is a back-illuminated device in which the respective light-receiving sections receive light that is incident from a side opposite to the surface of the semiconductor substrate on which the wiring layer is formed.

6. An imaging apparatus comprising:
   a condensing optical unit that condenses incident light;
   a solid-state imaging device configured to receive and photoelectrically convert the incident light condensed by the condensing optical unit; and
   a signal processing unit that processes photoelectrically-converted signal charges,
   wherein,
   (a) the solid-state imaging device includes:
      (a) a light-receiving section,
      (b) a peripheral circuit section in which peripheral circuits are formed, provided on a side of the light-receiving section,
      (c) an insulating film formed on the light-receiving section and the peripheral circuit section,
      (d) a film having negative fixed charges formed on the insulating film, and
      (e) a hole accumulation layer formed on a light-receiving surface side of the light-receiving section below the insulating film; and
   (b) the insulating film is formed between a surface of the peripheral circuit section and the film having negative fixed charges such that a distance from the surface of the peripheral circuit section to the film having negative fixed charges is larger than a distance from a surface of the light-receiving section to the film having negative fixed charges to reduce an influence of the film having negative fixed charges on the peripheral circuit section.

* * * * *